United States Patent
Whitford et al.

(10) Patent No.: US 8,935,646 B2
(45) Date of Patent: Jan. 13, 2015

(54) SYSTEM AND PROCESS FOR AUTOMATED CIRCUITING AND BRANCH CIRCUIT WIRING

(75) Inventors: Dean Whitford, Spruce Grove (CA); Gerry Stebnicki, Calgary (CA); Terry Smith, Edmonton (CA)

(73) Assignee: Draft Logic Inc., Spruce Grove, Alberta ( * ) Notice: Subject to any disclaimer, the term of this patent is extended or adjusted under 35 U.S.C. 154(b) by 0 days.

(21) Appl. No.: 13/419,322

(22) Filed: Mar. 13, 2012

(65) Prior Publication Data

US 2012/0221986 A1 Aug. 30, 2012

Related U.S. Application Data

(63) Continuation-in-part of application No. 12/626,612, filed on Nov. 25, 2009, now Pat. No. 8,738,332.

(51) Int. Cl.
*G06F 17/50* (2006.01)

(52) U.S. Cl.
CPC .......... *G06F 17/509* (2013.01); *G06F 17/5004* (2013.01)
USPC .......................................... 716/119

(58) Field of Classification Search
USPC .................................... 716/100, 119
See application file for complete search history.

(56) References Cited

U.S. PATENT DOCUMENTS

| | | | |
|---|---|---|---|
| 2001/0038612 A1* | 11/2001 | Vaughn et al. | 370/256 |
| 2004/0060014 A1* | 3/2004 | Khalil | 716/1 |
| 2006/0015814 A1* | 1/2006 | Rappaport et al. | 715/733 |
| 2007/0021964 A1* | 1/2007 | Maenishi et al. | 705/1 |
| 2008/0204034 A1* | 8/2008 | Blades | 324/522 |
| 2011/0307223 A1* | 12/2011 | Khalil | 703/1 |

* cited by examiner

*Primary Examiner* — Suresh Memula

(57) ABSTRACT

A system or process for providing complete electrical designs through: computer-automated circuiting; computer automated service device selection, placement, and interconnection; and computer-automated branch circuit wiring, wherein the complete electrical design complies with regulatory, industry standard practice, and client criteria.

24 Claims, 51 Drawing Sheets

BRANCH CIRCUIT PANEL SCHEDULE

DESIGNATION C  LOCATION Room 182 ELECTRICAL  JOB # 20110427A
Floor 1
OF CIRCUITS 42  PARENT DESIGNATION CDPa  PROJECT RiverFront School
120/208 VOLTS  NEC inches 277/120
INTERRUPTING CAPACITY 6 kAIC

| SERVICE DESCRIPTION | DEVICE COUNT | WATTS | A | P | CCT. # | A | B | C | CCT. # | P | A | WATTS | DEVICE COUNT | SERVICE DESCRIPTION |
|---|---|---|---|---|---|---|---|---|---|---|---|---|---|---|
| R 124 GIRLS WASHROOM | 1 | 720 | 20 | 1 | 1 | | | | 2 | 1 | 20 | 1000 | 1 | R 108 CLASSROOM |
| R 104 CLASSROOM | 1 | 1200 | 20 | 1 | 3 | | | | 4 | 1 | 20 | 1200 | 1 | R 108 CLASSROOM |
| R 106 CLASSROOM 122 STOR→ | 7 | 1300 | 20 | 1 | 5 | | | | 6 | 1 | 20 | 1300 | 1 | R 106 CLASSROOM |
| R 109 CLASSROOM | 1 | 1800 | 20 | 1 | 7 | | | | 8 | 1 | 20 | 300 | 3 | R 101 CORRIDOR |
| R 110 CLASSROOM | 8 | 1300 | 20 | 1 | 9 | | | | 10 | 1 | 20 | 490 | 3 | R 101 CORRIDOR 133 JANITOR |
| R 111 CLASSROOM 113 VEST→ | 8 | 1100 | 20 | 1 | 11 | | | | 12 | 1 | 20 | 1600 | 3 | R 102 CORRIDOR |
| R 182 ELECTRICAL, 181 STO→ | 5 | 1650 | 20 | 1 | 13 | | | | 14 | 1 | 20 | 720 | 1 | R 129 KITCHEN |
| R 128 KITCHEN | 1 | 1300 | 20 | 1 | 15 | | | | 16 | 1 | 20 | 1400 | 2 | R 128 KITCHEN |
| R 128 KITCHEN | 2 | 1700 | 20 | 1 | 17 | | | | 18 | 1 | 20 | 1200 | 1 | R 129 KITCHEN |
| R 129 KITCHEN | 1 | 8050 | 40 | 2 | 19 | | | | 20 | 1 | 20 | 1800 | 3 | R 126 STAFF WORK ROOM 18→ |
| | | | | | 21 | | | | 22 | 1 | 20 | 1800 | 1 | R 126 STAFF WORK ROOM |
| R 126 STAFF WORK ROOM | 8 | 1800 | 20 | 1 | 23 | | | | 24 | 1 | 20 | 1000 | 1 | R 180 VESTIBULE |
| R 118 WOMENS | 1 | 200 | 20 | 1 | 25 | | | | 26 | 1 | 20 | 1300 | 1 | R 118 CLASSROOM |
| R 118 MENS | 1 | 200 | 20 | 1 | 27 | | | | 28 | | | | | Space Breaker |
| R 127 CORRIDOR | 1 | 300 | 20 | 1 | 29 | | | | 30 | | | | | Space Breaker |
| Space Breaker | | | | | 31 | | | | 32 | | | | | Space |
| Space | | | | | 33 | | | | 34 | | | | | Space |
| Space | | | | | 35 | | | | 36 | | | | | Space |
| Space | | | | | 37 | | | | 38 | | | | | Space |
| Space | | | | | 39 | | | | 40 | | | | | Space |
| Space | | | | | 41 | | | | 42 | | | | | Space |

PHASE LOADS — A: 11140 w  B: 11130 w  C: 11140 w

WATTAGE LOADS BY SYSTEM:
LIGHTING — 0 w × — = 0 w
RECEPTACLES — 19360 w × 220.44 Rec = 14680 w
HEATING — 1000 w × 100% = 1000 w
KITCHEN — 13050 w × 220.56 Kitch = 8483 w
OTHER — 0 w × — = 0 w
PANEL/XFMR — 0 w × — = 0 w
EXIST / FUTURE — — = 0 w MOTORS — 0 w × 100% = 0 w
[(Largest FLA  0 × 0.00 = 0 ) + Other FLA  0 ] × Demand 100 % = Total Conductor FLA  0
(Largest Protection  0 + Other FLA  0 ) × Demand 100 % = Total Protection FLA  0

WATTAGE BEFORE DERATED SUITES AND MOTORS
— 24162 w × 100 % = 24162 w
Calculated  Load  Load Before
Demand  Adjust  Suites/Motors DERATED SUITE LOAD
0 w WATTAGE WITH DERATED SUITES & BEFORE MOTORS
24162 w TOTAL AMPERES FOR CONDUCTOR — 67 A
TOTAL AMPERES FOR PROTECTION — 67 A
TOTAL WATTAGE LOAD ON PANEL — 24162 w
BUS SIZE — 225 A
BREAKER/FUSE — 3P — 100A / 100A MC CB

BONDING OR GROUND —

FEEDER/SERVICE — 1 1/4"C—4#3

FEEDER/SERVICE EST. LENGTH — 8.35 Meters

| Surface Mount Panel | |
|---|---|
| Unique Name | P |
| Panel Type | Regular |
| Panel Segregation | Segregated - Other |
| Number of Circuits | 42 |
| Phase | 3 |
| Voltage | 120/208V |
| Number of Feeder Wires | 4 |
| Circuit Number | CDPa1/3/5 |
| Feeder Spec | 1 1/4"C-4#3 XL |
| Bonding Size | |
| Bus Amperage (Amps) | 225 |
| Parent ID | CDPa |
| Parent Protection Specification | 3P - 100A / 100A MC CB |
| Interrupting Capacity (kA) | 5 |
| Existing/Future Wattage | |
| Feeder Route | Overhead |
| TVSS | No |
| TVSS Breaker Size (Amps) | |
| Minimum Protection Size (Amps) | None |
| Protection Override (Amps) | None |
| Protection Type Override | No Override |
| Feeder Override | |

[Previous] [Next]   [OK] [Cancel]

Bill Of Materials

Date: 2011-10-31 / 13:00
Client: Black Gold School Division
Project: 20110427A

CONDUIT & WIRING (LENGTHS ESTIMATED)

| Item | Units | Qty |
|---|---|---|
| 0.5" Conduit EMT | Meters | 3.79 |
| 0.5" Conduit PVC | Meters | 1.63 |
| 0.75" Conduit EMT | Meters | 4102.92 |
| 0.75" Conduit PVC | Meters | 5.82 |
| 1" Conduit EMT | Meters | 131.87 |
| 1.25" Conduit EMT | Meters | 256.00 |
| 1.5" Conduit EMT | Meters | 38.69 |
| 2.50" Conduit EMT | Meters | 60.96 |
| 3" Conduit EMT | Meters | 6.51 |
| #1/0 AL Wire | Meters | 18.92 |
| #10 CU Wire | Meters | 2709.83 |
| #12 CU Wire | Meters | 2345.15 |
| #2 AL Wire | Meters | 6.31 |
| #3 CU Wire | Meters | 815.60 |
| #4/0 AL Wire | Meters | 30.46 |
| #6 CU Wire | Meters | 543.01 |
| #8 CU Wire | Meters | 7108.23 |
| 250MCM AL Wire | Meters | 243.84 |
| 400MCM AL Wire | Meters | 26.06 |
| 2 Wire AC #10 | Meters | 229.94 |
| 2 Wire AC #8 | Meters | 220.24 |
| 3 Wire AC #8 | Meters | 19.03 |
| 4 Wire AC #10 | Meters | 9.50 |
| 4 Wire AC #8 | Meters | 12.56 |

SYSTEM MATERIALS

| Item | Units | Qty |
|---|---|---|
| 1 Gang Switch | each | 72 |
| 3 Gang Switch | each | 2 |
| 4 Gang Switch | each | 2 |
| Duplex Receptacle | each | 175 |
| Floor Double Receptacle | each | 5 |
| GFI Receptacle - Above Counter | each | 21 |
| Kitchen Duplex Receptacle | each | 5 |
| Kitchen Special Receptacle | each | 2 |
| Split Receptacle - Above Counter | each | 3 |
| WP Receptacle | each | 6 |
| Heater | each | 4 |
| Motor c/w Disconnect | each | 6 |
| Motor c/w Manual Starter | each | 6 |
| Generator | each | 1 |
| Junction Box (No Load) | each | 80 |
| Kitchen Junction Box (Direct Load) | each | 5 |
| Wall Combination Data/ Tel | each | 46 |
| Fire Alarm Control Panel | each | 1 |
| Fire Alarm Duct Detector | each | 2 |
| Fire Alarm Pullstation | each | 6 |
| Fire Alarm Speaker c/w Strobe | each | 13 |
| Sprinkler Flow Switch | each | 2 |
| Sprinkler Tamper Switch | each | 1 |

PANELS AND TRANSFORMERS

PANELS

| Name /Breakers+Fuses | Type | Size | Voltage | Wires | Phase | IC | Configuration |
|---|---|---|---|---|---|---|---|
| MDP | MDP | 42 | 277/480V | 4 | 3 | 33 | Main Distribution Panel |
| 1x3P-400A/400A 200 kaic FD,1x3P-225A/125A 65 kaic MC CB | | | | | | | |
| 2x3P-100A/100A 65 kaic MC CB,2x3P-50A/50A 65 kaic MC CB | | | | | | | |
| 1x3P-30A/30A 65 kaic MC CB,2x3P-15A/15A 65 kaic MC CB | | | | | | | |

*Fig. 25A*

PANELS

| Name /Breakers+Fuses | Type | Size | Voltage | Wires | Phase | IC | Configuration |
|---|---|---|---|---|---|---|---|
| CDPa | CDP | 42 | 120/208V | 4 | 3 | 5 | Central Distribution Panel |
| 5x3P-100A/100A 10 kaic MC CB | | | | | | | |
| B | Regular | 42 | 277/480V | 4 | 3 | 18 | Surface/Single Tub |
| 21x1P-20A/20A 25 kaic MC CB | | | | | | | |
| C | Regular | 42 | 120/208V | 4 | 3 | 4 | Surface/Single Tub |
| 31x1P-20A/20A 10 kaic MC CB,1x1P-15A/15A 10 kaic MC CB | | | | | | | |
| D | Regular | 24 | 120/208V | 4 | 3 | 2 | Surface/Single Tub |
| 5x1P-20A/20A 10 kaic MC CB | | | | | | | |
| E | Regular | 42 | 120/208V | 4 | 3 | 4 | Surface/Single Tub |
| 2x2P-50A/50A 10 kaic MC CB,11x1P-20A/20A 10 kaic MC CB | | | | | | | |
| 2x2P-20A/20A 10 kaic MC CB,1x1P-15A/15A 10 kaic MC CB | | | | | | | |
| EM | Emergency | 30 | 277/480V | 4 | 3 | 19 | Surface/Single Tub |
| 9x1P-20A/20A 25 kaic MC CB | | | | | | | |
| G | Regular | 42 | 120/208V | 4 | 3 | 2 | Surface/Single Tub |
| 18x1P-20A/20A 10 kaic MC CB | | | | | | | |
| H | Regular | 42 | 120/208V | 4 | 3 | 2 | Surface/Single Tub |
| 20x1P-20A/20A 10 kaic MC CB,1x1P-15A/15A 10 kaic MC CB | | | | | | | |

TRANSFORMERS

| Name | KVA Total | Pri. Phase | Pri. Wires | Pri. Volt. | Sec. Phase | Sec. Wires | Sec. Volt. |
|---|---|---|---|---|---|---|---|
| Ta | 75.0 | 3 | 3 | 277/480V | 3 | 4 | 120/208V |

TOTAL PANELS AND TRANSFORMERS

| Type | Size | Configuration | Qty |
|---|---|---|---|
| MDP | 42 | Main Distribution Panel | 1 |
| CDP | 42 | Central Distribution Panel | 1 |

*Fig. 25B*

| TOTAL PANELS AND TRANSFORMERS | | | |
|---|---|---|---|
| Type | Size | Configuration | Qty |
| Regular | 42 | Surface/Single Tub | 3 |
| Emergency | 30 | Surface/Single Tub | 1 |
| Regular | 42 | Surface/Single Tub | 1 |
| Regular | 24 | Surface/Single Tub | 1 |
| Regular | 42 | Surface/Single Tub | 1 |
| Transformer | 75.0 | 3P 277/480V 3W : 3P 120/208V 4W | 1 |

Total Breakers and Fuses

1x3P-400A/400A 200 kaic FD,1x3P-225A/125A 65 kaic MC CB
5x3P-100A/100A 10 kaic MC CB,2x3P-100A/100A 65 kaic MC CB
2x2P-50A/50A 10 kaic MC CB,2x3P-50A/50A 65 kaic MC CB
1x3P-30A/30A 65 kaic MC CB,85x1P-20A/20A 10 kaic MC CB
30x1P-20A/20A 25 kaic MC CB,2x2P-20A/20A 10 kaic MC CB
3x1P-15A/15A 10 kaic MC CB,2x3P-15A/15A 65 kaic MC CB

*Fig. 25C*

*Note: all extraneous information has been removed for space considerations, this is not a complete single line diagram*

SYSTEM AND PROCESS FOR AUTOMATED CIRCUITING AND BRANCH CIRCUIT WIRING

CROSS REFERENCE TO RELATED APPLICATIONS

This is a continuation-in-part of application Ser. No. 12/626,612, filed Nov. 25, 2009.

FIELD OF THE INVENTION

The present system relates to a system in the context of building design for receiving an electrical components design, such as, for example a computer aided design (CAD) or building model comprising electrical systems, and creating a "complete electrical design" through computer-automated circuiting, computer automated service device selection-placement-interconnection, and computer-automated branch circuit wiring, wherein the complete electrical design complies with regulatory and client criteria.

BACKGROUND OF THE INVENTION

In the context of building design, architectural designs (building floor plans, CAD drawings and/or building model) comprise a multitude of elements or assets, such as corridors and rooms, all of which have different requirements for electrical and mechanical services. As such, architectural designs are provided to an engineer or design professional to apply electrical system designs. The engineer applies the electrical systems information using appropriate codes, standards and rules, thereby adding electrical components and service devices to the architectural design to comply with regulatory standards and the client's requirements. During this process, the design professional generates sufficient detail to produce a complete electrical design drawing and/or model (referred to herein as a "complete electrical design"), which includes specifications suitable for construction such as, for example, the location and type of electrical components and service devices and how all such devices are electrically connected. The complete electrical designs are subject to regulatory and/or higher design criteria, and are usually done by a team of skilled drafts people, who may also be design professionals. These professionals also inject individuality and further detail into the final design.

In Applicant's previous U.S. Pat. No. 6,999,907, a process is provided for automating the determination of detailed engineering specifications and the production of electrical components designs from a client's architectural design. In that process, the architectural design is parsed to locate the structure's determinative assets and standards applicable to at least the functional characteristics of the assets are applied, thereby placing the electrical components to result in an electrical components design. Further, the client's known professional preferences can be imparted, while still resulting in an electrical components design that conforms to the client's personal and professional expectations.

An example of Applicant's prior process is the generation of an electrical components design that includes: number and capacity of electrical components which are substantially compatible with the raw architectural layout specifying boundaries of spaces or other such spaces with unique electrical system servicing requirements and location of electrical components to fulfill those electrical system servicing requirements. The electrical components design does not, however, include circuiting and branch circuit wiring and is thus insufficient to either estimate construction costs or to actually construct the design.

To date, the production of a building drawing and/or model including electrical circuiting, service device locations and interrelationships, and branch circuit wiring (i.e. a "complete electrical design") has still required the application of professional skill, application of various rules of thumb, and estimating.

Some automation has been attempted in the production of complete electrical designs (i.e. circuited designs and branch circuit wired designs). For example, in some CAD programs or building information modeling programs, automation has been attempted through manual user interaction, specifically through the manual selection of similar and adjacent electrical components from the electrical components design, which are to be circuited together, the optimal arrangements being performed by the human user. The user selects a circuit and then selects the components to put on that circuit. The selected components are tagged with the chosen circuit number and a panel schedule may be populated with the total load for each particular circuit. Similarly in branch circuit wiring, some automation has been attempted wherein users manually choose two components to connect and the application draws a simple arc to connect them. In both cases, the decisions are completely those of the user. Further, individual clients or drafts people are expected to distinguish a space/room from a corridor, and then decide and execute for themselves which of the various types of spaces/rooms receive which level of services (e.g. dedicated electrical outlets) and how the service will be supplied (e.g. through the floor or from the ceiling).

Such known manual processes of producing complete electrical designs are laborious and inflexible. It is inevitable that there will be changes in the overall designs which arise during the usually protracted duration between obtaining an architectural design and final issuance of a complete electrical design, which includes circuit assignments, service device locations and interrelationships, and branch circuit wiring. Changes require the human user to repeat the selection steps. For example, any change in the circuiting of a project will also result in required changes in the branch circuit wiring for all affected circuits and multi-circuit homeruns, all of which has to be manually identified and rectified. Further, the resulting level and quality of the details in the complete electrical design is variable due to many levels of design input, from the design professional to the draftspersons. There is a need to repeatedly and dynamically revise the electrical design, in a domino effect, for changes that, for example, affect selection and sizing of conductors and protection at the serving branch circuit panel and upward through the service devices to the main distribution panel. Revisions can result in a fragmentation of an originally well-ordered circuit structure, with deletions and merely appending of newly revised circuits. The impact of such revisions can result in further problems where a particular project is divided into a number of drawings that each must be updated manually.

In the typical large project that requires branch circuit wiring to be in the electrical design, the time between obtaining an architectural design and completion/issuance of a complete electrical design is consumed in the foregoing detailed drafting portion. The immense person hours expended creates two main disadvantages: a significant time delay from project start to completion, and a related increase in cost.

Further, while an architect, design professional or client is constrained by many known and standardized codes, there are also instances where the known codes are inapplicable and personal judgment must be applied. Similarly, there may be instances where the architect, design professional or client's personal standards exceed those of the codes. As a result, each time a design process is commissioned, the personal and professional judgments or standards of all involved in the particular project must be communicated to and be known by the draftsperson/designer. This generally occurs through a working relationship developed over time, so that that appropriate standards and codes are utilized. Often the draftsperson/designer simply utilizes personal and professional judgments or standards that are known, or which are assumed to be preferred by the design professional and those become the rules that are applied to the complete electrical design.

Further, due to the difficulty involved in establishing the actual routing and specifications of conduit, wire, and cable (such routing and materials collectively referred to hereinafter as 'wiring'), considering possible circuit grouping or routing options, it is a common practice in the industry to simply avoid illustrating wiring on the complete electrical design and to leave the actual routing of wiring to the field installers. Simply, there are a large number of man-hours expended in the mere drawing of branch circuit wiring especially when following the more stringent routing rules for conduit and wire compared to the more relaxed rules for drawing cable. Regardless of this, many projects require that the as-built wiring routing still be added to the drawing after construction. Further, in projects where the design must be completed in building information modeling software, all branch circuit and/or system device related wiring might be required to be included as the 3D actual routing and size thereof.

Accordingly, there is a need for an automated system that is capable of receiving an electrical components design, and providing a complete electrical design therefrom. Such a system would aid designers/draftspersons in achieving, for example, the following: reduced turnaround time, reduced labor costs, repeatedly and reliably applied personalized standards, reduced design errors, and further reduced time requirements from the design professional where professional and standard codes are known and where individual professional standards can be learned and applied.

SUMMARY OF THE INVENTION

A design/drafting system or process for use by design professionals (also known as end users or client/engineers), is provided. The present system is capable of accepting or receiving end user or client input, including one or more electrical component designs (e.g. architectural drawing or building model having at least electrical components thereon) in digital format and, coupled with a rule-based process for applying standards and client preferences, generating a complete electrical design which may include: circuited electrical components, service device locations, service device interconnections, service device protection/conductor selection, branch circuit wiring, and various schedules related to each of these deliverables.

A design/drafting system or process is provided, the system or process being capable of receiving an electrical components design and: providing the necessary panels; assigning circuits on added and existing panels to electrically service the components; producing panel schedules and other schedules; determining service device requirements; locating service devices; interconnecting service devices and determining the connecting medium, route traveled, and distance of those interconnections; determining home run groupings; determining home run locations and determining the connecting medium, the route traveled, and distance to the serving panel for each home run; and further determining the connecting medium, the route traveled, and distance of the branch circuit wiring interconnections between the electrical components.

In one embodiment, the present system comprises an automated process for the production of a circuited design, wherein the process comprises providing an electrical components design having a plurality of electrical components therein to a computer capable of receiving and processing same, performing automated circuiting of the plurality of electrical components within the electrical components design, and producing a circuited design. More specifically, the present system may further comprise identifying and determining the location of the plurality of electrical components within the electrical components design, grouping the electrical components, selecting the electrical components to be circuited and the order in which the selected electrical components are to be circuited, and adding all of the electrical components to at least one circuit.

BRIEF DESCRIPTION OF THE DRAWINGS

FIG. 9 is an example of a branch circuit panel schedule for panel C according to the auto-circuiting applied in FIGS. 8 A-D;

FIG. 10 is an example of a branch circuit panel schedule for panel E according to the auto-circuiting applied in FIGS. 8 A-D;

Figures 22C, 22D:
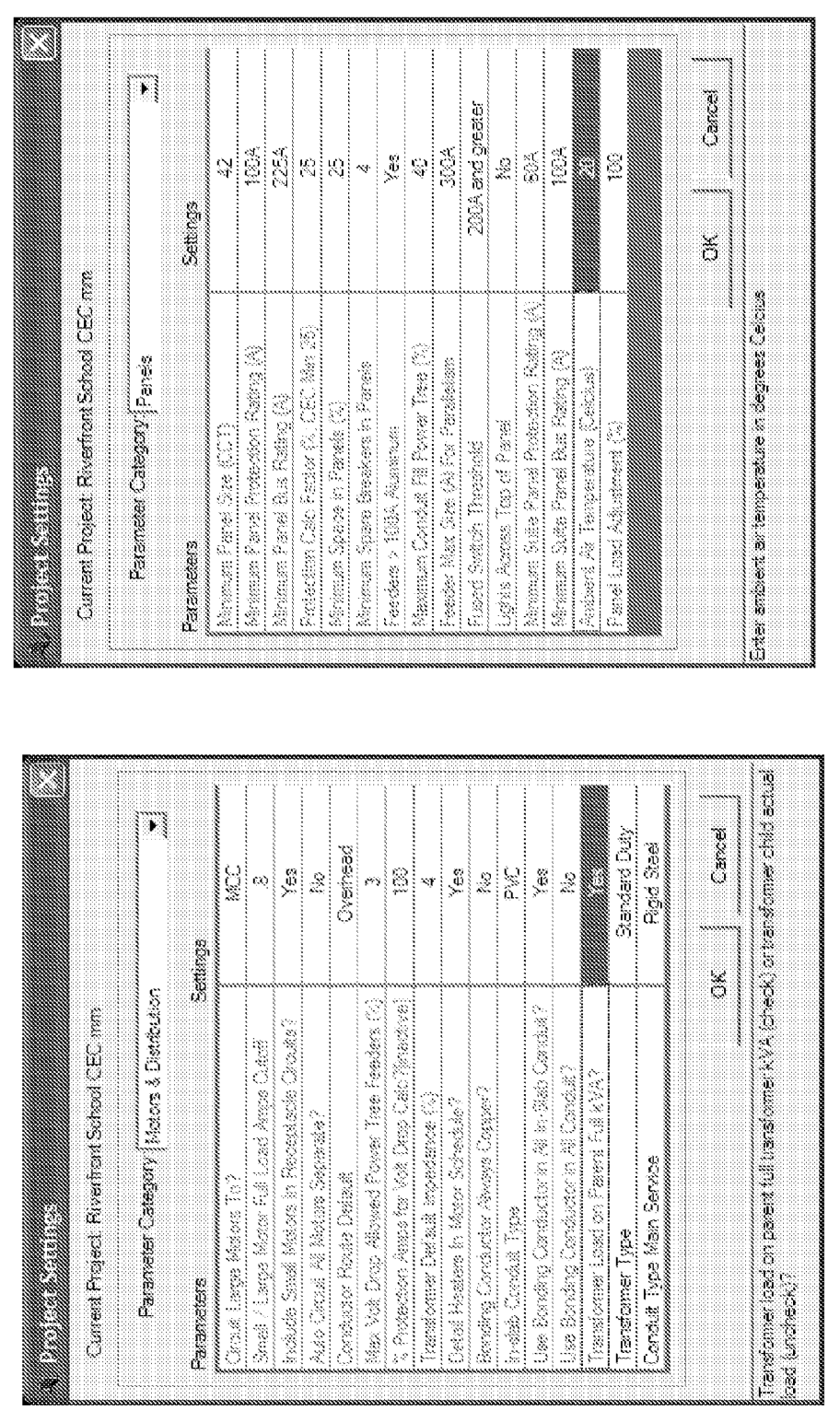

FIG. 22C is example of a computer application dialog for illustrating sample parameters for motor and distribution components;

FIG. 22D is an example of a computer application dialog for illustrating sample parameters for panels;

Figure 23B:
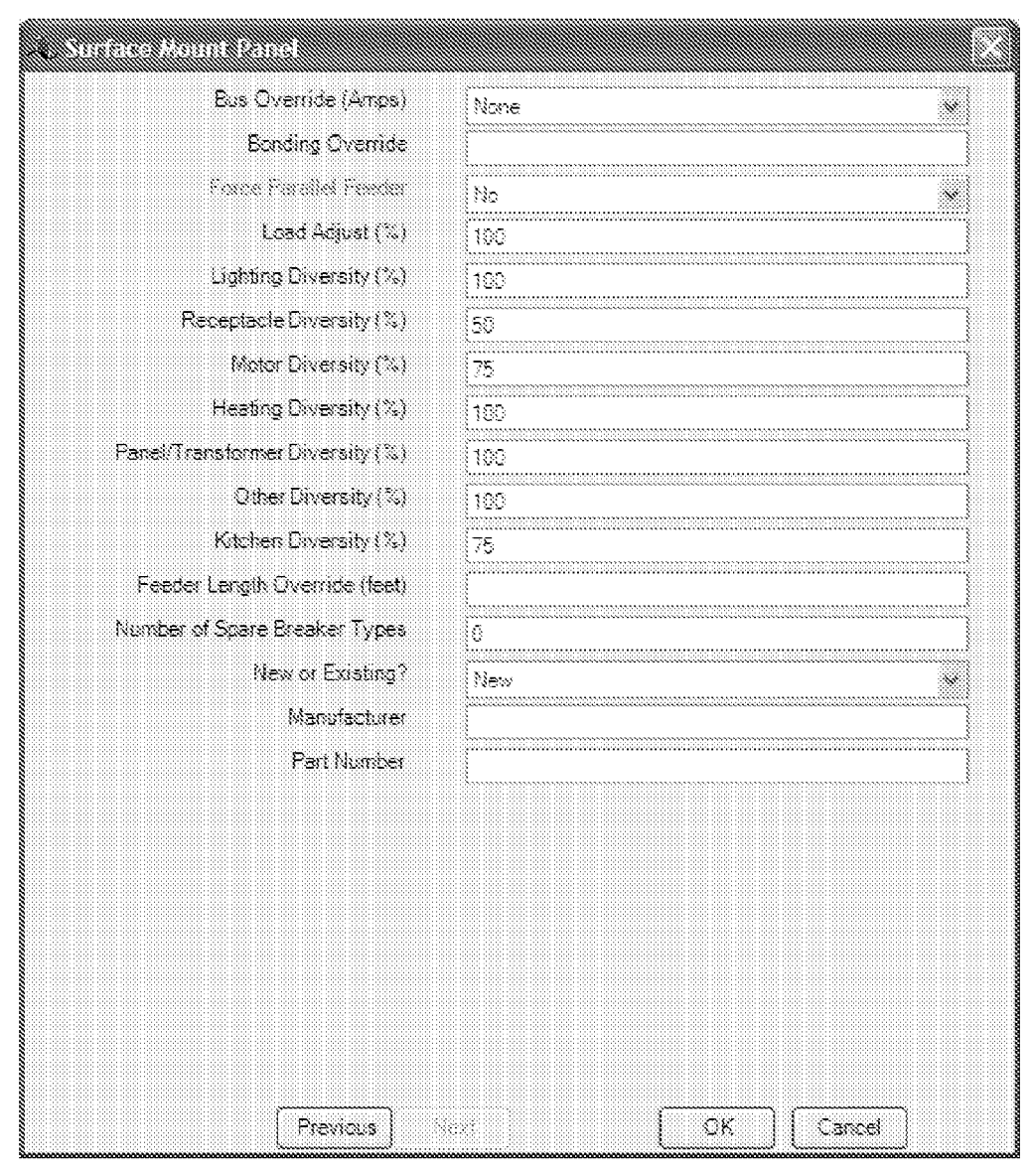

FIG. 23A is an example of a computer application dialog displaying and allowing the user to modify the attributes of a particular instance of a particular symbol. In this case, the first 22 attributes of the 'Surface Mount Panel' symbol named 'P' are shown;

FIG. 23B is an example of a computer application dialog displaying the attributes of a particular instance of a particular symbol. In this case, the remaining 16 attributes of the 'Surface Mount Panel' symbol named 'P' are shown;

Figure 24:
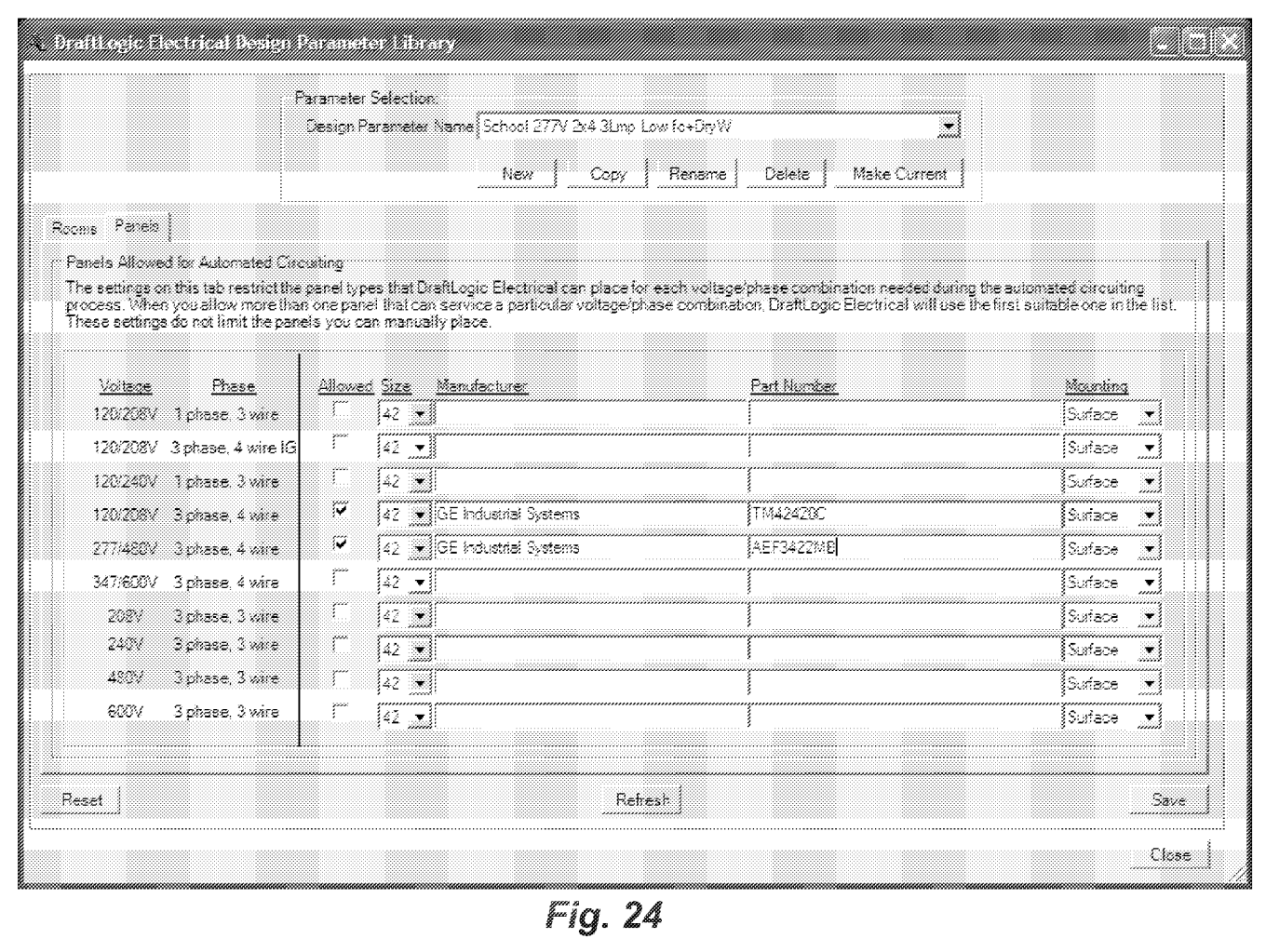

FIG. 24 is an example of a computer application dialog illustrating user selection of allowed panels for automated circuiting. Such selections do not limit user manual selection and placement of panels in a project;

FIGS. 25A thru 25C illustrate a bill of materials schedule which can be generated as a benefit of an implementation of one embodiment of all three of: automated circuiting application (as protection for each circuit is part of the bill of materials), the branch circuit wiring application, and the service device determine/locate/select protection/select conductor application.

FIG. 26A is the entire single line diagram for the project in question, FIGS. 26B and 26C are portions thereof enlarged.

DETAILED DESCRIPTION OF THE INVENTION

A design/drafting system or process for use by design professionals (also known as end users or client/engineers), is provided. The present system is capable of accepting or receiving end user or client input, including one or more electrical component designs (e.g. architectural drawing or building model having at least electrical components thereon) in digital format and, coupled with a rule-based process for applying standards and client preferences: generating circuited designs; meeting service device requirements in the design; generating branch circuit wired designs 900 (see FIG. 16); and generating reports, diagrams, and schedules thereof.

Figure 4:
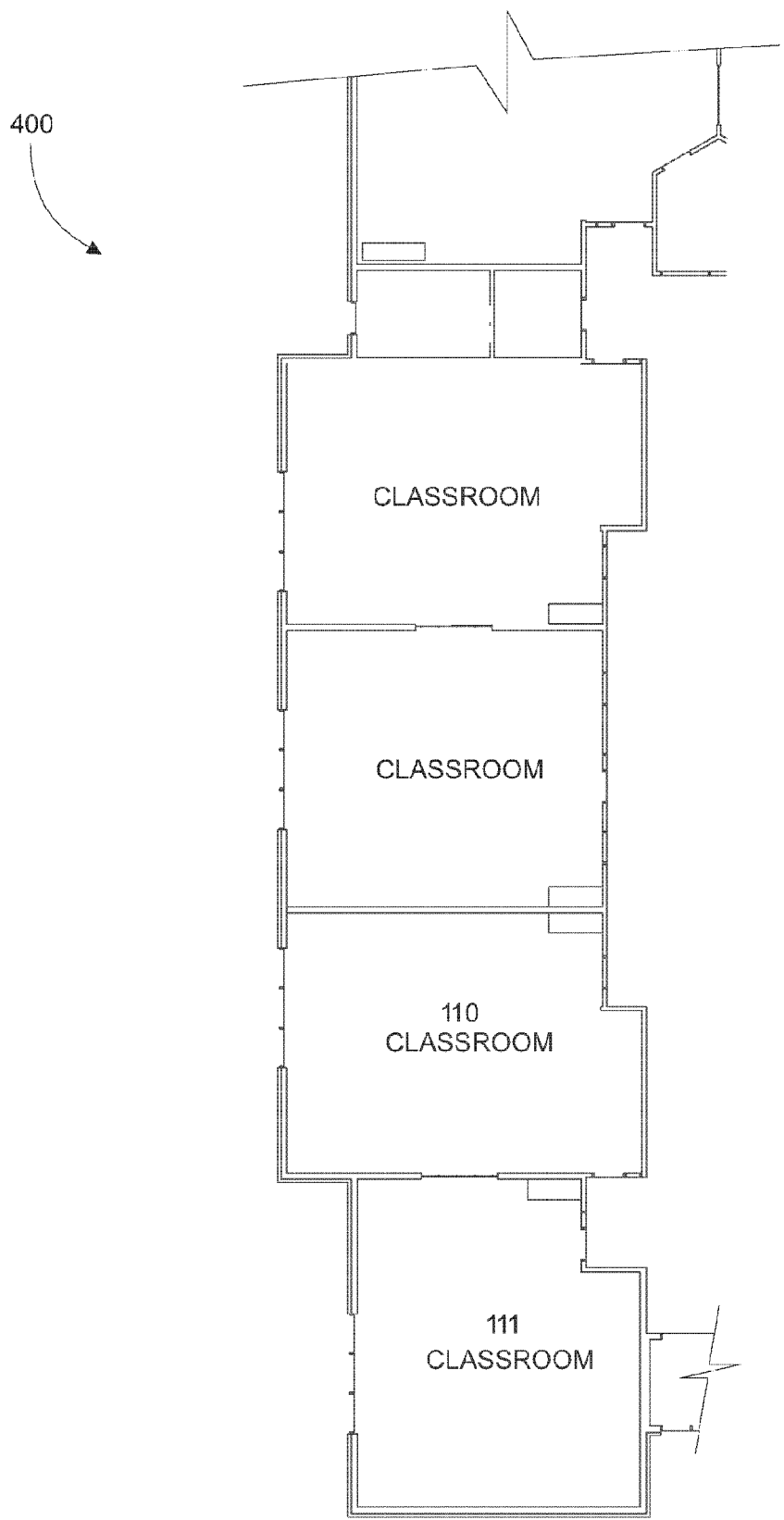
FIG. 4 is a partial view of a an architectural design illustrating a variety of boundaries or spaces which represent rooms, corridors and service rooms.

By way of background and terminology, an architectural design (e.g. CAD drawing or building model; FIG. 4) is provided which comprises "architectural assets", such as spaces or rooms having geometrical boundaries and functional characteristics (e.g. school classroom or gymnasium). The architectural design is converted to an "electrical component design" via the addition of electrical components for each asset/space.

Service Types: Electrical components of the electrical component design may be grouped by category into "service types" including:

Electrical component types such as, for example, receptacles, lighting, and electrically-driven or actuated mechanical equipment (motors), or Meta-categories such as, for example, "emergency-powered components", which may contain one or more individual components of one or more electrical component types.

It is understood that the electrical components may be provided to the electrical component design based upon user discretion, known building code requirements, or a combination thereof. For example, the electrical component design may comprise an architectural design 400 that has: undergone automatic placement of electrical components, as taught in U.S. Pat. No. 6,999,907, manual placement by a designer using traditional methods, or a combination thereof. While receptacles, lighting and mechanical equipment may have a variety of designations under different regulatory codes, e.g. "utilization equipment", they are collectively referred to herein as "electrical components" or simply components unless expressly stated in their particular form. Electrical components are devices that use electricity to perform work (motors or lights, for example) or directly provide electricity to a device doing work (receptacles, for example). In reference to branch circuit wiring, electrical components may also include devices like junction boxes which are used only for a wire splicing location and do not provide electricity to do work. Electrical components differ from what we refer to as service devices that function in the distribution of power, e.g. electrical panels, transformers, and the main distribution panel (MDP). In commonly used industry terminology, service devices would be the distribution devices plus branch circuit panels.

Service Areas: The assets/spaces of the designated electrical components design may be grouped into "service areas", comprising a collection of one or more: assets/spaces, partial assets/spaces, other arbitrarily selected areas, or a combination thereof. Service areas for meta-category service types may be assigned specific areas or may affect the entire project by virtue of their meta-category application. Service areas may each be serviced by a particular panel room or panel, either of which can be called a 'place of service' or 'destination panel/panel room'. Service areas and destination panels/panel rooms may be selected: by the user manually, by the system automatically, or by a combination thereof. The system can use the service areas and service type information to determine where to circuit each particular electrical component.

Subareas: where a service area is comprised of more than one asset/space, partial asset/space, and/or other arbitrarily selected areas, each such area is a subarea of the service area in question.

Figure 1:
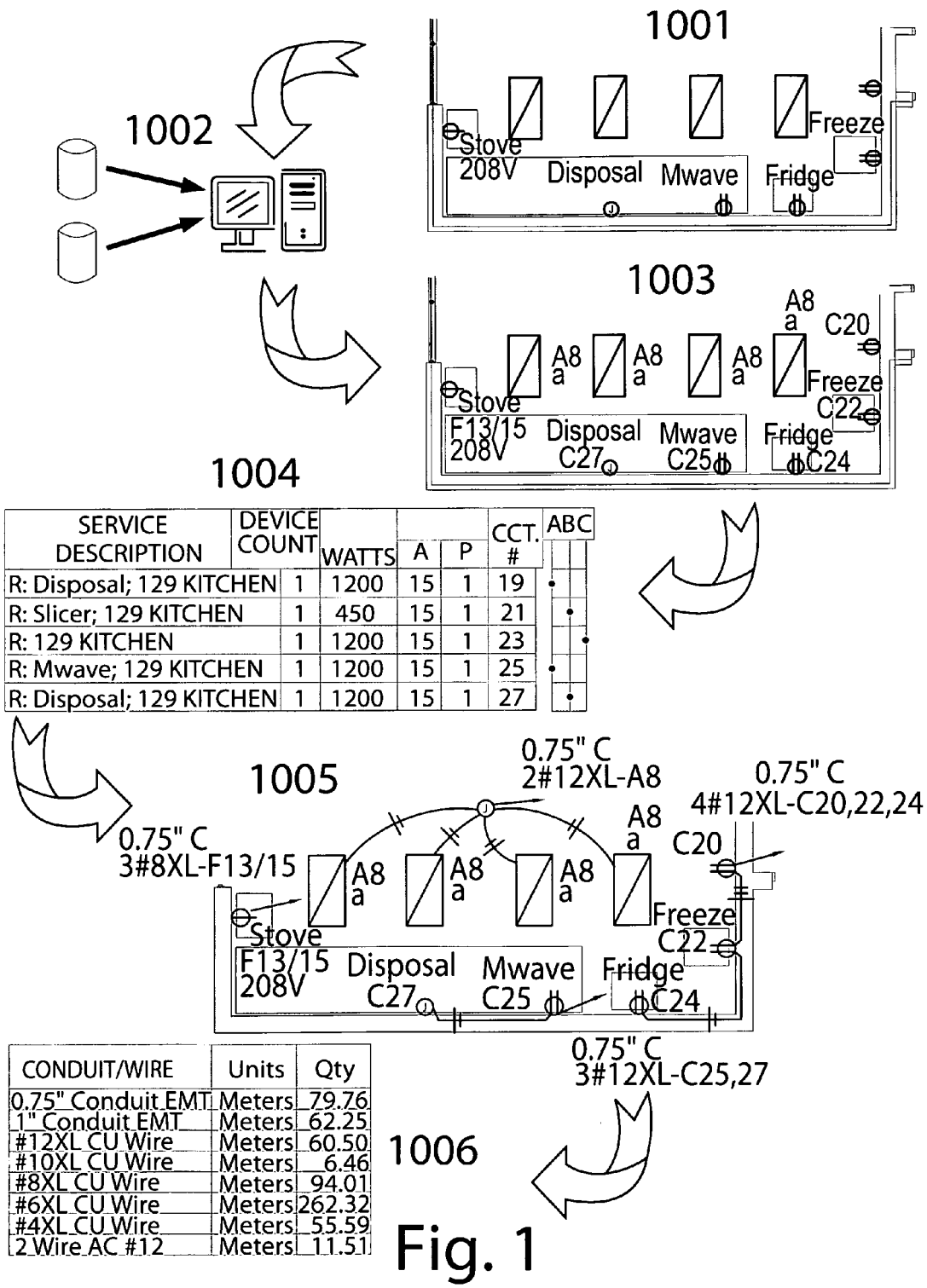
FIG. 1 is an overall schematic representation of the present system including, for example, embodiments of the automated circuiting, automatic branch circuit wiring and automatic creation of schedules.
Figure 2:
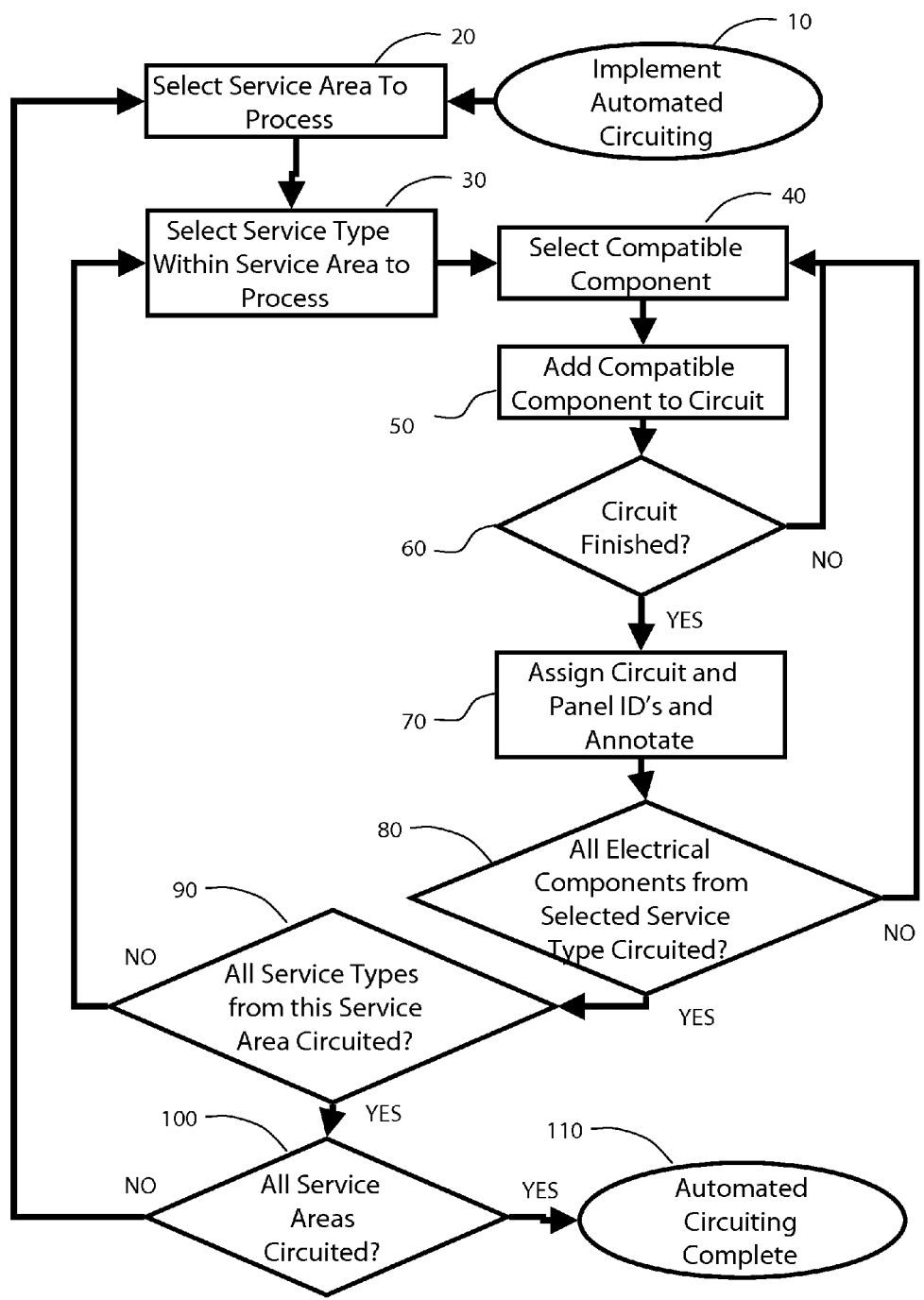
FIG. 2 is a schematic flow chart illustrating an embodiment of the automatic circuiting of the present system.

In a general overview of the present system, and with reference to FIG. 1, at least one initial electrical components design (1001), having at least one "architectural asset" (e.g. space, room, corridor) with at least one electrical component located therein is received by the present system. For example, the asset may comprise a kitchen having receptacles of various voltages, lighting and junction boxes.

The present system then performs automated panel assignment and circuit numbering of similar and/or adjacent electrical components (referred to as "circuiting"; 1002), wherein the circuiting complies with industry standard practice, regulatory standards, and client needs, and generates a circuited design (1003) and schedules thereof (sample clip of one type of such schedules 1004). For example, the circuited design may depict a 120V microwave located on circuit 25, panel C and a 120V refrigerator located on circuit 24, also on panel C, whereas an electric range, being a 208V appliance, may be on a different panel F, circuits 13 and 15 as it could not be serviced by the 120/240V panel C. The lighting may be on a common circuit 8, panel A. The present system completely automatically generates various reports and schedules, including panel schedules which detail the circuits wired to each panel.

Given a circuited design resulting from the system or by other means such as the user manually circuiting a design, the system can determine the locations of the service devices, determine the connections between such devices, determine the route of travel and distance of those connections, and using this information determine the electrical protection and conductors specifications for each service device's connection to other service devices. Further, the system can determine the fault level at each service device. All such information determined by the system or optionally selected by the user may be represented by the system in reports, schedules, and diagrams that the system generates.

Upon completion of the circuiting, the present system may then perform automated branch circuit wiring of the circuited design, thereby determining each interconnection medium, providing interconnection lines or other such representations of conduit/wire/cable routing and wiring annotation to produce a complete electrical design (1005) and schedules thereof (1006). It is understood that the present system may automatically perform the branch circuit wiring and service device related automation of a circuited design resulting from the system itself, or may receive a circuited design that has been manually circuited by the user or by other means, thereby performing only the branch circuit wiring and/or service device related automation.

When all aspects of the present system are utilized, a complete electrical design results: circuited electrical components; all service devices with their relationships and protection/conductors selected; whatever branch circuit wiring elements are required for the project; and connection mediums and routes of travel for each of service device interconnections, branch circuit wiring interconnections, and home runs to serving panels.

As such, the present system is capable of generating various schedules, diagrams, and reports, such as a Bill of Materials (1006 and FIGS. 25A, B,C), which provide, for example, all conduit, wire, cable, service devices, and electrical components used on a particular building project.

Automated Circuiting

Having reference to FIGS. 2 and 5-8(A-D), in one embodiment of the present system, a circuited design project may be initiated by way of the following steps:

a) Providing a computer for receiving an electrical components design (10), wherein the design has at least one electrical component (e.g. light, receptacle, motor). The at least one electrical components may be provided in at least one service area, wherein the user may determine whether to submit one, many, or all electrical components or, where used, service areas for a particular execution of automated circuiting.

Figure 5:
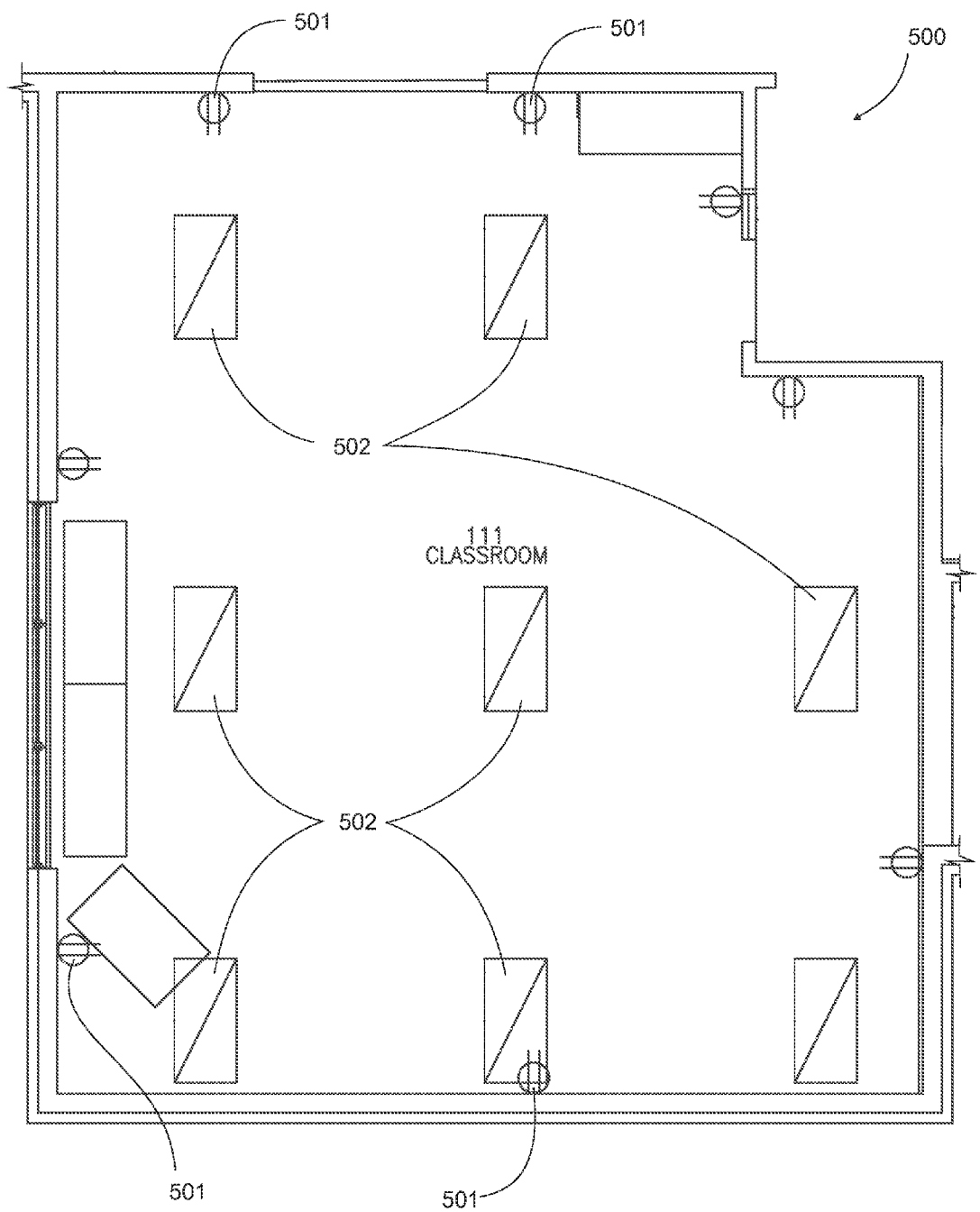
FIG. 5 is a larger scale representation of one space (111 of FIG. 4) representing an electrical components design showing a classroom of a school, having exemplary electrical light and receptacle components therein.
Figure 6:
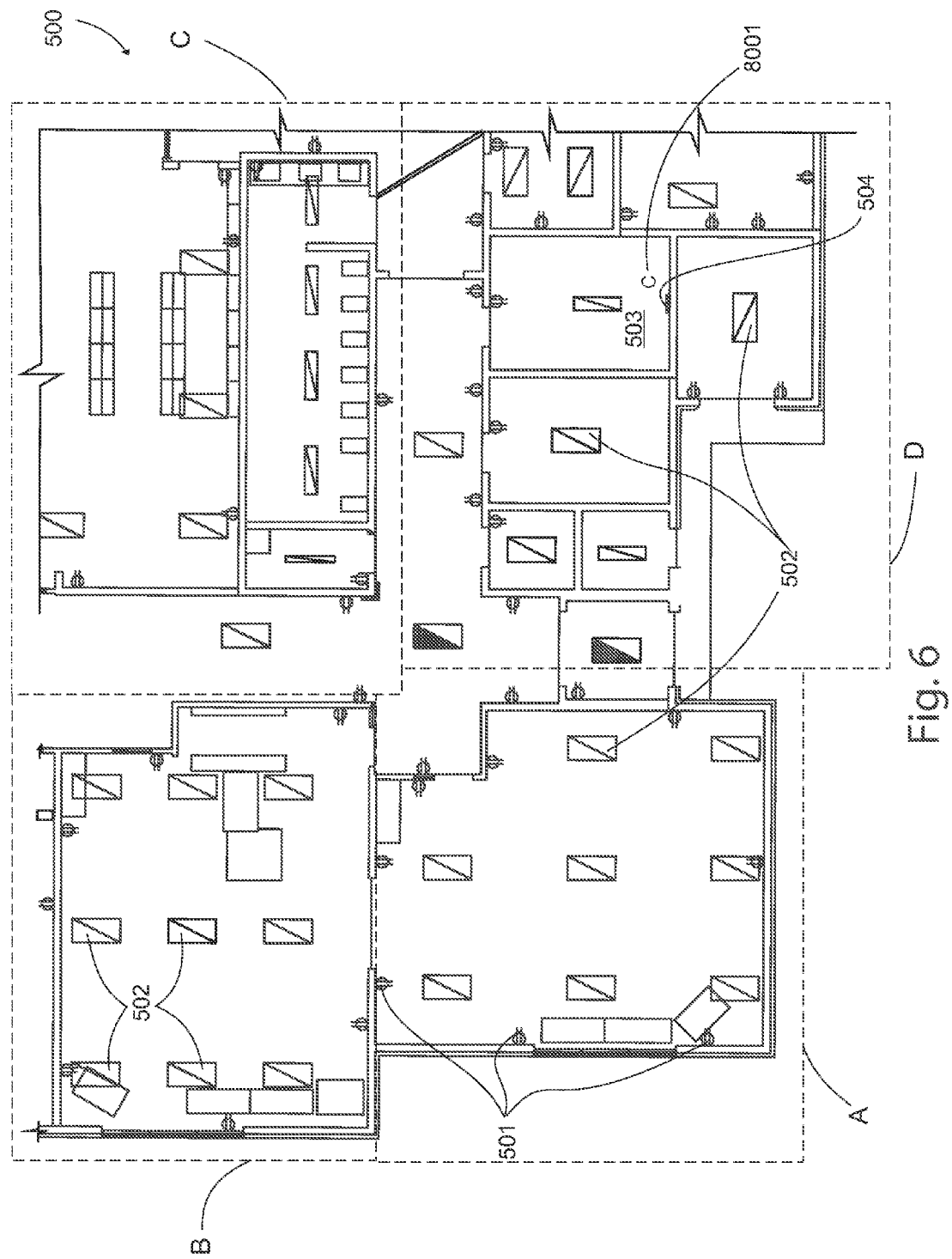
FIG. 6 is a representation of electrical components design, further divided into four quadrants (A, B, C and D), pictured in FIGS. 6 A-D for illustrative purposes.
Figure 6A:
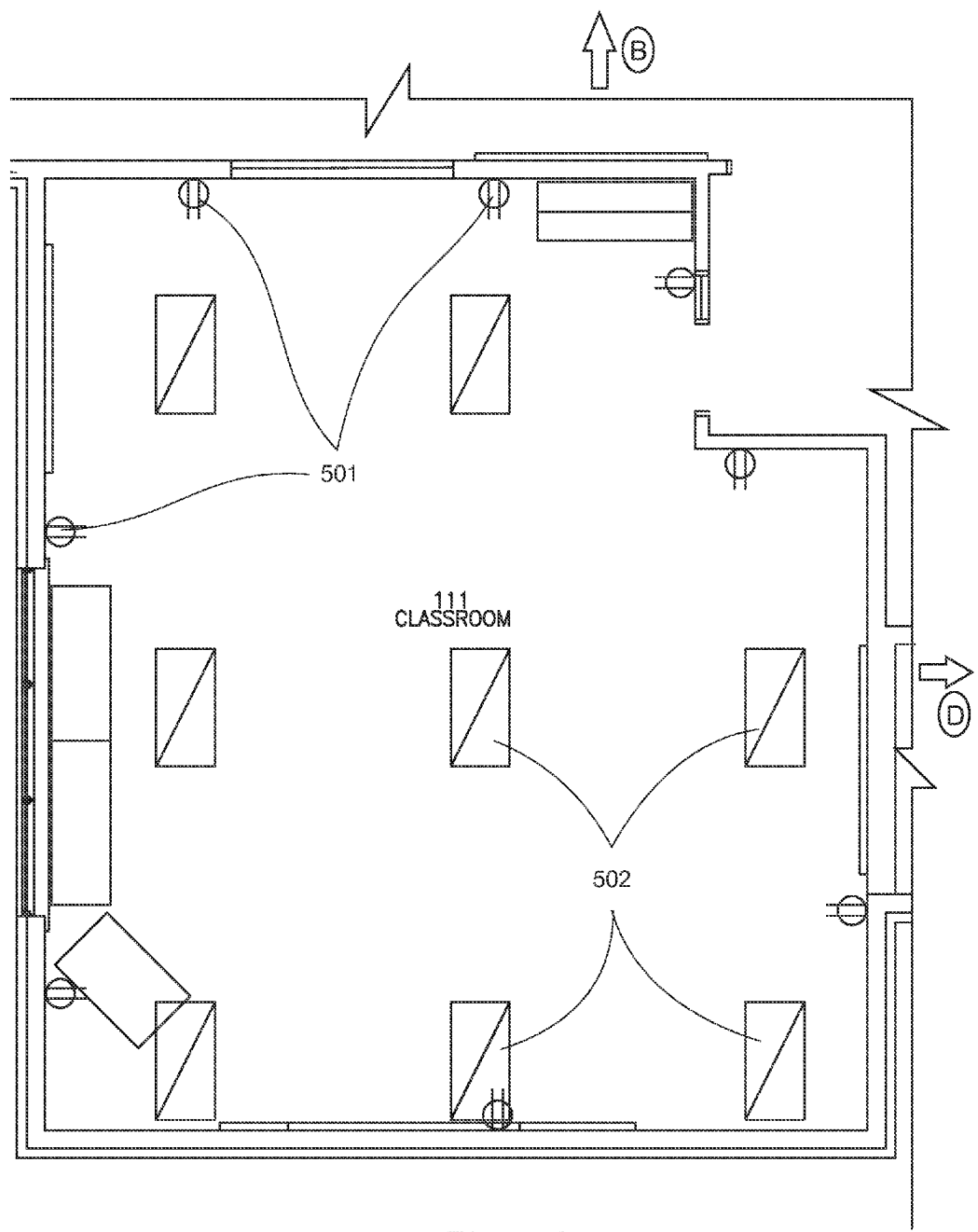
FIG. 6A is quadrant A of FIG. 6.
Figure 6B:
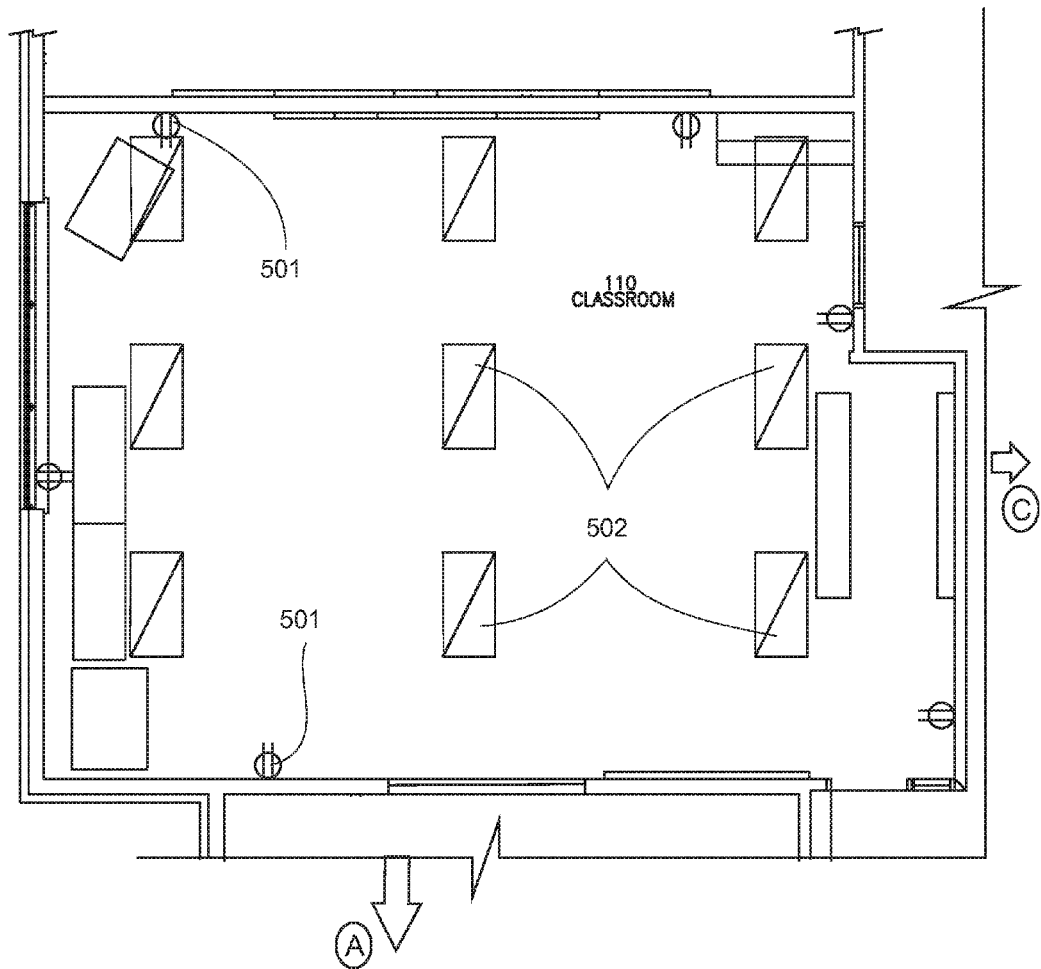
FIG. 6B is quadrant B of FIG. 6.
Figure 6C:
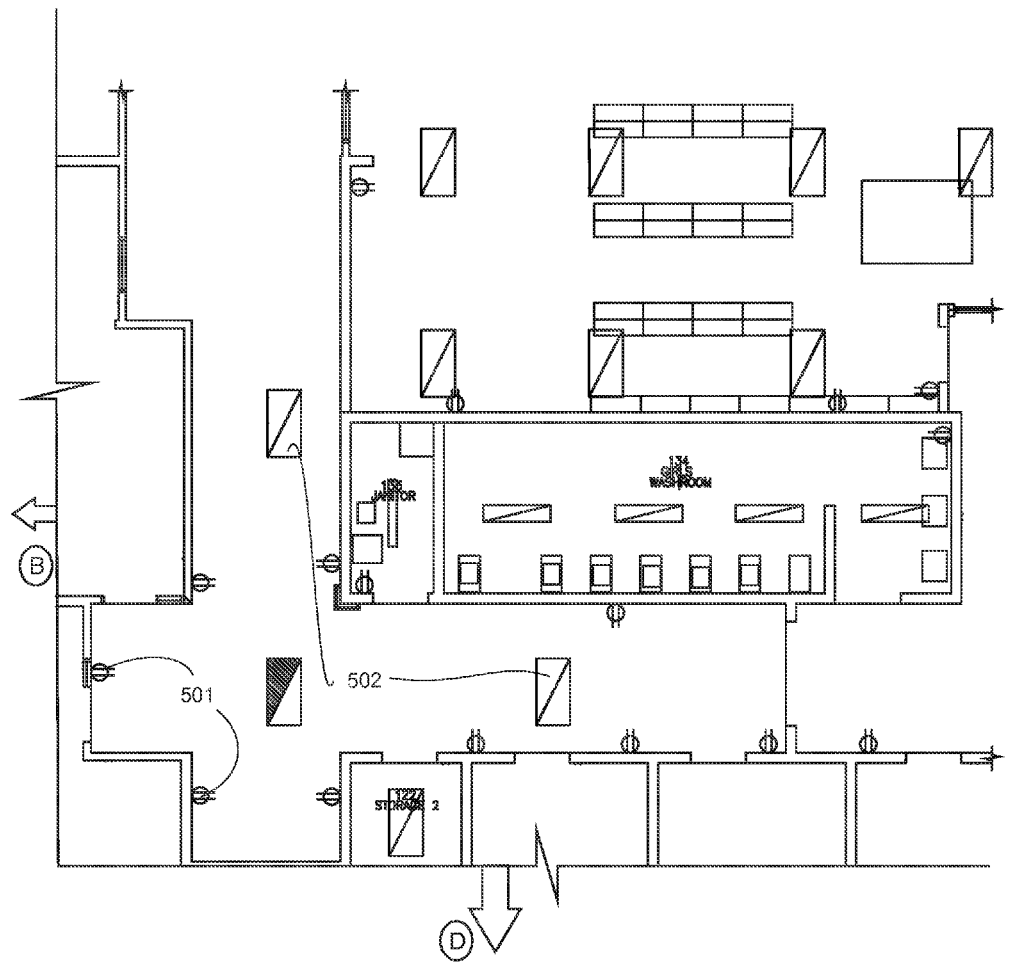
FIG. 6C is quadrant C of FIG. 6.

For example, having regard to FIGS. 5 and 6 A-D, an electrical component design 500 may comprise electrical components such as wall-mounted receptacles 501 or ceiling-mounted lighting components 502 in each of the various rooms/spaces of the architectural design (for example, classroom 111; FIG. 5).

The present system identifies and classifies all relevant electrical components 501, 502 and the location of each component. Such classification may be done using a database of standards such as the Canadian Electrical Code (CEC), the National Electrical Code (NEC), or any other applicable electrical standard (e.g. specific standards and/or client specific parameters).

The system further identifies one or more parameters, such as electrical component load and voltage requirements, and service type for each component 501,502, including the maximum circuit amperage limit to be applied.

b) Selecting the order of electrical components to be processed (20). In one embodiment, the electrical components may be grouped into one or more service areas to be processed. The selection may be based on such factors as the service types of each of the service areas. For example, meta-category type service areas need to be processed first in order to take the electrical components they affect out of the processing of lower priority service types.

For example, having regard to FIGS. 6 A-D, the present automated system and/or the end user may define a service area comprising all or some of the one or more spaces within the detailed building design (e.g. a service area comprised of all the spaces and partial spaces shown in quadrant D).

In one embodiment, the present system may also support meta-category service areas such as emergency service areas that direct emergency powered components to their own panel room or specified panel, thereby overriding other service areas. Further, large motors can be directed by a project setting to ignore the service area guidance and instead be automatically circuited to a motor control center or the main distribution panel.

c) Selecting the service type(s) to be processed (30).

Service areas can be assigned one or more service types that pertain only to certain electrical components. For example, a service area may comprise a service type that mixes lighting and power circuits on the same panel (if compatible voltage) or regardless to the same panel room, a service type that segregates lighting and power circuits on different panels in same panel room (e.g. 505, 506) whether or not they are compatible voltage, or a service type that selects only lights or power from the service area and can thus overlap all or in part other service areas that direct other component types to different panel/panel room destinations.

The system may process the service types separately because even though the service types may have been selected to populate circuits on the same panel, for example lights and receptacles, in most cases there are different electrical standards and user parameters to be applied to the circuiting of different service types. Also, in most cases where a panel is to provide service to more than one service type, the circuits for each will still be grouped such that same service type neighbors same service type (e.g. lights left side of panel, receptacle-like components right side until one type runs out and then the other may spread across both sides of the panel for load balancing).

Once the service type being processed is identified, the electrical standards and user parameters to be applied to the circuiting of each type of service (electrical component) can then be applied (FIGS. 22A, 22B, 22C, 22D, 22F are example user parameters pertaining to automated circuiting in amongst parameters for the system as a whole).

d) Selecting (e.g. sorting and ordering) compatible electrical components (e.g. service types) within the service areas to be processed to be added to a circuit (40);

The system may perform sorting and ordering to ensure that electrical components are added to circuits in an order that promotes: good grouping of compatible service types, balanced loading of electrical phases, good opportunities for neutral wire sharing during later branch circuit wiring, and minimization of construction time/materials costs. The foregoing selecting of compatible electrical components may be done in the following manner:

d.1) By processing the order within each service area to be processed. In other words, where a service area is composed of subareas, the system can plan a route to proceed through the subareas using a modified traveling salesperson algorithm (with, for example, 'spilled paint' and no crossings travel path optimizations or any known equivalent optimization technique) to determine the shortest path for circuiting to travel through each service area while keeping electrical components from each circuit and group of neighboring circuits together and preventing electrical components from different circuits from cutting through the general area of another circuit, and/or d.2) By processing the order of electrical component selection. In other words, in addition to the above-mentioned ordering and sorting, the present system selects a compatible electrical component as a starting point for the circuit, perhaps the furthest from the serving panel/panel room, and for each subsequent compatible electrical component selection travels through the subarea (if exists) or service area (if no subareas) in an orderly fashion. For example, for wall mounted electrical components, travel would follow the perimeter of the space or for ceiling mounted devices in a row and column fashion.

e) Adding compatible components to at least one circuit (50). In other words, the present system may add compatible electrical components of the selected service type(s) from the selected service area to at least one circuit on their destination panel. The addition of compatible components may be done in the following manner:

e.1) Selection of Panel

Panel selection may be determined based upon a number of factors, including, that the panel:

i. Must comprise compatible voltage and service type; and ii. Is a pre-existing panel having available circuits and the panel is specified as the destination for circuiting from the particular service area; or iii. Is a pre-existing panel having available circuits and the panel is positioned in a panel room previously designated as the circuiting destination for the particular service area; or iv. Is a new panel, positioned as needed by the system in a panel room designated as the circuiting destination for the particular service area.

Panels can have both an electrical component service type assignment and a meta-category type assignment. For example, components selected to be powered by emergency power sources are only circuited to a panel designated for circuiting emergency powered devices, whether such panels pre-exist or are placed as needed as per the processes above. Further, a panel designated either as regular server or emergency service can also be limited to servicing a particular electrical component type, like lighting, or it can left open to all electrical component types.

It is contemplated that the panels may be placed in a specific room automatically and/or manually by an end user, whereby the end user defines various parameters of the panel such as size, type, voltage, phase, and unique designation of the panel. Users can affect all manually and automatically placed panels in many ways including but not limited to specifying: the protection and feeder, diversity of the various service types to be assigned to the panel, the voltage that the panel can handle, the phase type of the panel, spare and unavailable panel slots. Users can also use circuiting tools in the computer application to make any additions, changes, or deletions to the circuiting assigned to all panels, whether manually or automatically placed and whether automatically circuited or not.

e.1.1) Selection of Panel where Service Area has Designated Panel as Destination Where the user has designated a particular pre-existing panel as the destination for circuiting from the service area, the system may first check that the panel is of a compatible voltage and service type and may then locate an available circuit on that panel to circuit to. Circuit selection and electrical component assignment to circuits is covered in e.2. and subsequent sections to follow and is the same for service areas with designated panels as it is for those assigned instead to a panel room.

e.1.2) Selection of Panel where Service Area has Panel Room Destination

Where the user has designated a panel room as the destination for circuiting from the service area, the present system automatically determines if there is an existing panel, locates an existing panel, and determines if the existing panel fits the voltage, phase, and service type requirements. If an existing panel with available space is found in the associated panel room, this panel is used for circuiting until it runs out of available panel slots. The present system may then look for another panel in the room with the same voltage and service type with unallocated slots. If more than one panel is found within the selected panel room having the same criteria (voltage and service type), the first panel found will be used. For example, if a panel room 503 is selected as the service area destination, the present system may search the panel room 503 for existing panels that meet the needs of the components being circuited. If there are no such existing panels, the present system will create a new panel to meet automated circuiting needs by determining the voltage requirement of the electrical component being circuited and the service type of each electrical component being circuited, and then placing a panel to meet such requirements in the designated panel room.

Figure 10:
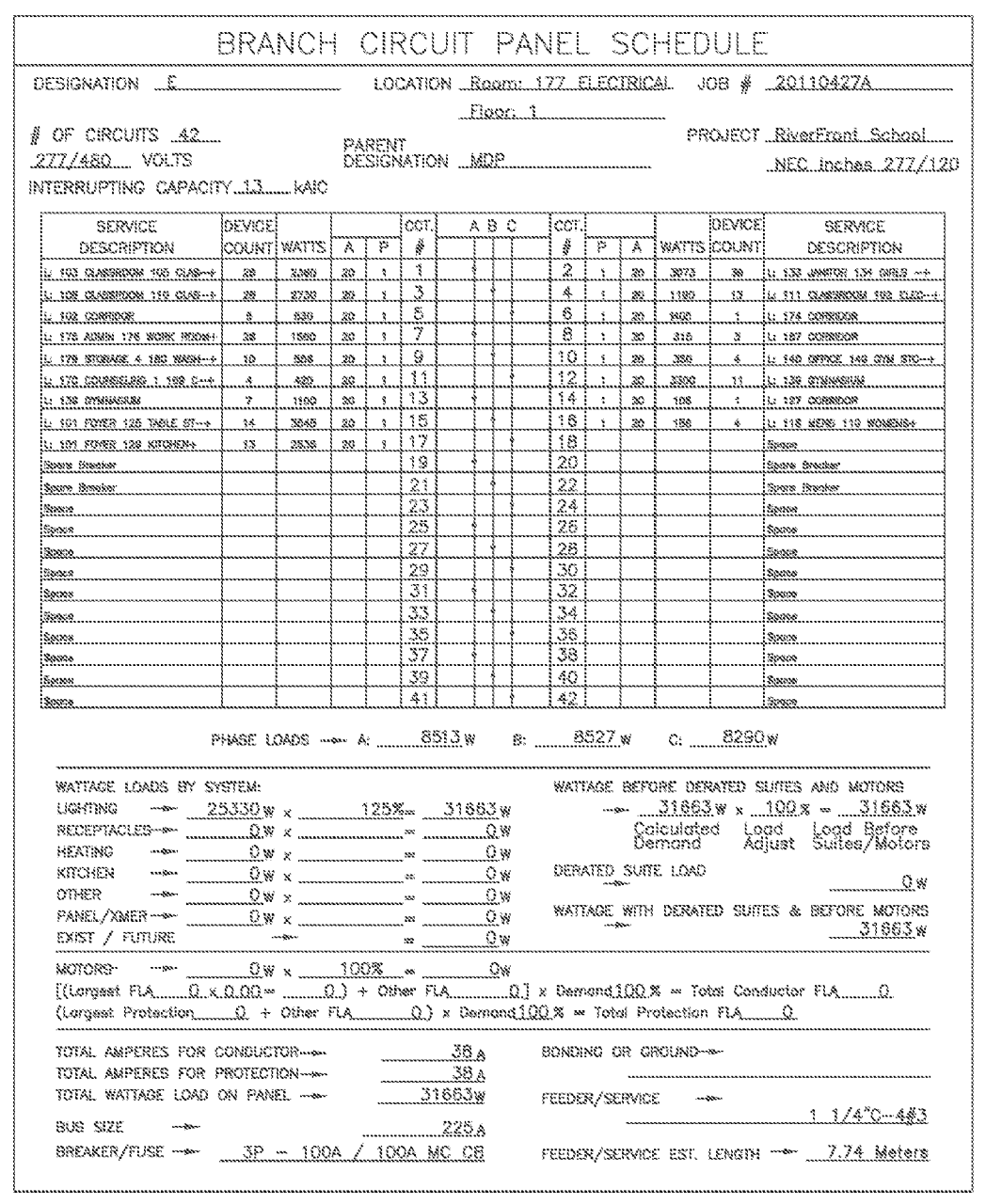

For example, having regard to FIGS. 9 and 10, the system encountered a service area of 'segregated receptacles and lighting' type, meaning that automated circuiting was to circuit both receptacles and lights for the service area to the same panel room but to circuit each service type on separate panels specifically allocated the individual service types. FIG. 9 is the panel schedule that resulted for receptacles circuiting and FIG. 10 is the panel schedule that resulted for lighting circuiting. In actuality, this same split would have resulted if the service area had been selected as 'mixed receptacles and lighting' since in this case the lighting was 277V and the receptacles were 120/208V.

e.2) Selection of Circuit

The gathering of circuits to a common panel further comprises phase grouping gathered circuits from the same side of the panel (i.e. assigning circuits in A and B phase groups for single phase panels, and in A, B and C phase groups for three phase panels). The benefits of grouping sequential or near sequential circuits from the same side of the panel that are different phases are to allow for neutral wire sharing where allowed during branch circuit wiring and also to minimize construction time and materials.

Where required, the present system will select circuits for electrical components to balance the load on each phase for the service device being circuited to and for the project as a whole.

Based on relevant parameter settings selected by the user that determine whether a panel is shared by different component types and if shared will split by left/right or top/bottom, circuit phase group assignment may travel from side to side on the panel and then downward or may proceed downward a single side of the panel. After all electrical components for a service type have been circuited to a destination panel, other service types being routed to the same panel will spread across both sides of the panel (but still assigned in same-side phase groups) to promote balanced phase loading.

e.3) Determine Circuit Capacity and Allow Addition of Electrical Components to Circuit Until Circuit Deemed Complete A running total of the at least one parameter (e.g. load) is calculated and compared to the determined maximum circuit limit (e.g. maximum circuit load). As such, the present system is capable of determining if the circuit has sufficient capacity to populate another compatible component. In other words, if the addition or population of another compatible component to the circuit does not cause the running total load to reach the maximum circuit load, the compatible component is added. If the addition of the lowest wattage compatible and available component causes the running total load to exceed the maximum circuit load, the present system will not add the component to the circuit and will create another circuit.

Where the system encounters an electrical component that exceeds the electrical standard or user parameter defined limit of load for a circuit of that type, the electrical component will be circuited to its own circuit(s) and no other electrical components will be added to those circuits.

e.3.1) Circuit Capacity where Limited by Electrical Standards or User Parameters Circuits of certain service types may be populated according to a default capacity size (i.e. maximum circuit amperage), which can be dictated by electrical standards, standard practice, or user parameters. For example, standard practice in the United States at this time is to circuit most lighting to a 20A circuit (i.e. a circuit with 20 amperes rated circuit breaker for protection).

For each circuit type where electrical standards or user parameters have specified a particular amperage limit to be applied, the present system determines or calculates a total circuit wattage load possible using the following formula:

$$(\text{total watts}) = \text{volts} \times \text{amps for single phase (i.e. single or two hot wires) loads or (total watts)} = (\text{volts} \times 1.732) \times \text{amps for three phase (i.e. three hot wires) loads} \quad \text{(Formula 1)}$$

e.3.2) Circuit Capacity where not Limited by Electrical Standards or User Parameters For those electrical components that are to be circuited alone due to exceeding the default load allowance for a shared circuit, the present system calculates the required amperage of protection for most electrical components using the following formula, although certain service types have, like motors, have different specific methods for calculating required amperage of protection:

(required watts)/(volts)=amps for single phase (i.e. single or two hot wires) loads or (required watts)/(volts.times.1.732)=amps for three phase (i.e. three hot wires) loads    (Formula 2).

Motors provide an example of a service type requiring a different specific method for calculating required amperage of protection. For motors, a full load amperes rating of the motor must be derived. Whatever is available of the horsepower, wattage, voltage, and phase attribute values of the motor are cross-referenced with standards and motor specific calculation methods set out by whichever set of electrical standards the user has specified for use on the current project to arrive at a full load amperes rating for the motor.

Alternatively, the end user may utilize override values to direct the present system to use a specific amperage load for the electrical component. Such overrides can be named specifically for an electrical component type, MOCP or 'maximum overcurrent protection' for a motor for example, or named to apply to any electrical component type such as 'protection override'.

e.3.3) Circuit Capacity Modifiers

Circuit capacity or assigned protection can be modified by electrical standards requirements or by user parameters.

An example of an electrical standards modifier is the building code maximum load versus circuit protection. This limit is accounted by the present system for each electrical standard, for example it is set at 80% of the total circuit load possible for each of the CEC and NEC.

Building Code Circuit Limit=Total circuit load.times.0.8  (Formula 3, using CEC/NEC 80% value for example)

The user can also modify the circuit capacity or protection assigned to circuits by setting parameters. For example, the user may establish a maximum circuit load for some service types, such as lighting and power circuits, during automated circuiting. By default, the maximum circuit load percent may be set at 90%. That is, the maximum project load may be set at 90% of the building code circuit limit. As shown at the top of the list in each of FIGS. 22B and 22F, the maximum circuit load percent can be altered by the end user, and set up as part of a client specific module or parameters.

For example, for a lighting circuit for a project using the Canadian Electrical Code from among the various electrical codes supported herein, servicing 120 V electrical components with a user selected parameter of 15 amperes for lighting service type circuits, the total watts for the circuit, using the single phase version of Formula 2, is calculated to be 1800 W (120 V.times.15 amps). The building code circuit limit is 80% of the total watts, and thus calculated, using Formula 3, to be 1440 W.

The maximum project circuit load is set at 90% of the building code circuit limit, and thus, calculated to be 1296 W. That is, the present system will circuit compatible components such that the running total of the load placed on that particular circuit will not exceed a total of 1296 W. The present system will allow the addition of compatible components onto this particular circuit so long as the running total load placed on the circuit does not exceed the 1296 W. If the addition of a subsequent compatible component causes the running total to exceed 1296 W, the present system will not add the subsequent compatible component and would instead create a subsequent circuit.

f) Determining whether the at least one circuit is complete (60); If the at least one circuit having electrical components assigned to it has usable capacity left and uncircuited, compatible electrical components remain, the present system will cycle back to step d) above (40) and add another electrical component (50) of the service type being processed (30) from the service area being processed (20).

Additions to a circuit continue for as long as additional electrical components can be added to the circuit. In addition to the availability constraint (i.e. additional compatible electrical components in the service area) and the capacity constraint (circuit sufficient remaining wattage capacity), there are other constraints on whether additional electrical components are added to a circuit. For example, compatible electrical components being within electrical standard or user parameters for distance tolerances.

f.1) Availability Constraint

A circuit may be finished by virtue that although there is capacity available to service additional compatible electrical components, no such electrical components are available that pass all of the constraints that need to be cleared prior to their addition to the circuit.

f.2) Circuit Capacity

Circuits can be finished due to being completely full to allowable capacity, due to being created initially over the base capacity allowed (i.e. large load single electrical component), or due to being full to a point where each of the available compatible electrical components would cause the circuit to exceed the allowable capacity and thus none of them can be added to the circuit.

f.3) Check Neighboring Subarea for Compatible Electrical Components

The circuiting is finished when either the running total of the circuit approaches but does not exceed the maximum circuit limit or when the circuit is populated with and has exhausted all the compatible components within the subarea (which may commonly be a room/space). In the latter case, the circuit may continue to have remaining capacity for more compatible components.

If the circuit is deemed to be finished only because it has populated and exhausted all of the compatible components in the subarea, the present system can then locate a neighboring subarea and determine if the neighboring subarea qualifies to share the circuit. The circuiting is finished if the present system determines that the circuit cannot be shared with neighboring assets.

There are many potential criteria the system can use in determining whether a circuit should share into a neighboring subarea or not. Such criteria can be rooted in electrical standards, standard practice, or user parameters:

i. Distance between the subareas;
 ii. Distance between the closest electrical component already belonging to the circuit from the original subarea and the nearest proposed electrical component from the subarea;
 iii. User indication if subareas of these types should be allowed to share circuits or not, for example in the user parameter data that the system refers to for such decisions, the user may have indicated that 'corridor' type spaces should not share circuits with any neighboring spaces due to their already spread out area;
 iv. Depending on the service type, it may be important for all compatible electrical components of a particular service type in a particular subarea to be on the same circuit, or at least an appreciable portion thereof.

In the case of a lighting circuit for example, a neighboring subarea qualifies to share the circuit if the lighting component 502 on a common switch 509 in the neighboring subarea has a total wattage that does not cause the circuit to exceed the maximum circuit load. That is, if the total wattage of the lighting components 502 on a common switch 509 in the neighboring subarea would not cause the running total load to exceed the maximum circuit load, then all of the lighting components on that common switch 509 are connected to the circuit and the circuit is shared between the subarea and the neighboring subarea.

Similarly, for a circuit servicing receptacles and all other non-lighting circuits, a neighboring subarea can qualify if the addition or population of the receptacles 501 and same service type electrical components will not cause the circuit to exceed the maximum wattage per circuit. If it does, then a new circuit is created, and if not, then the receptacles 501 and same service type electrical components will be populated to the circuit. The present system will determine if there is sufficient capacity to service at least half of the receptacles 501 and same service type electrical components in the neighboring subarea to prevent a small portion of the receptacles being added while the remaining portion is added to a new subsequent circuit.

For each shared circuit, the order of travel is based on a shortest subarea to subarea path. When going into a neighboring subarea, the present system will continue populating the circuit beginning with the compatible electrical component nearest the subarea that the circuit just left. I.e. when sharing a receptacle circuit into a neighboring subarea, the receptacles in the new subarea that are closest to the receptacles of the circuit in the original subarea are added to the circuit first, rather than any receptacles from across the subarea. The order of travel for each circuit is thus modified to optimize circuit assignment order on a panel, such that circuits that neighbor on the panel also neighbor in the circuited design. Such optimizations as performed by the present system serve to minimize construction time and construction materials.

g) Assigning each circuit and panel with identification information and annotation (70);

The present system populates the project data for the electrical components with their assigned circuit and the project data for the serving panel with the information about the electrical components assigned to the circuit, the protection assigned to the circuit, and any other circuiting data deemed desirable. The present system further populates the circuited design in progress with annotation indicating circuit numbers and parent panel designations. The project data can be contained in the design itself, i.e. as data on the electrical components and serving panels, in a database associated to the design, or both. In some design environments, the present system will not annotate the design as such annotation is not held within the design environment.

Figure 7:
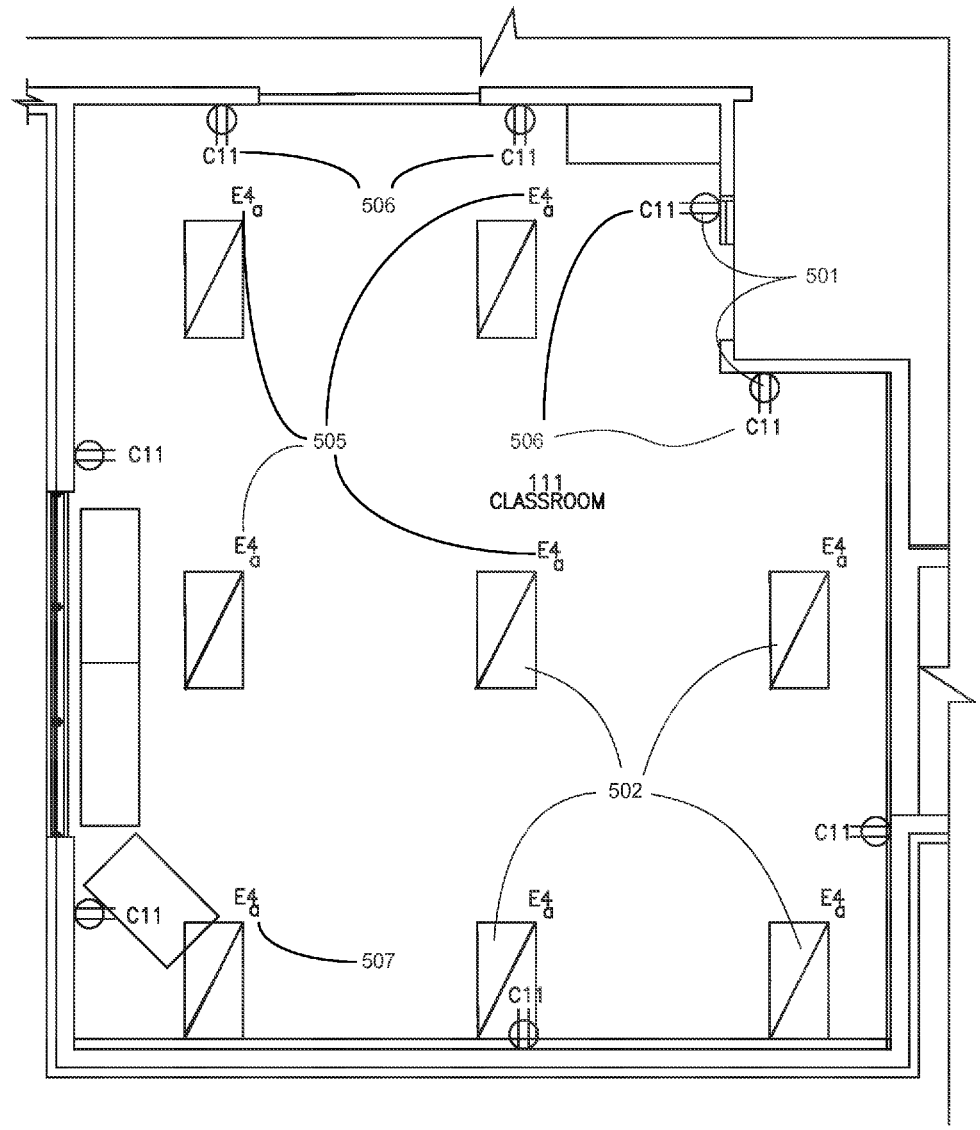
FIG. 7 is a further schematic of the quadrant "A" shown in FIGS. 6 and 6A having being auto-circuited for assigning circuits and panels to each type of components located therein.
Figure 8A:
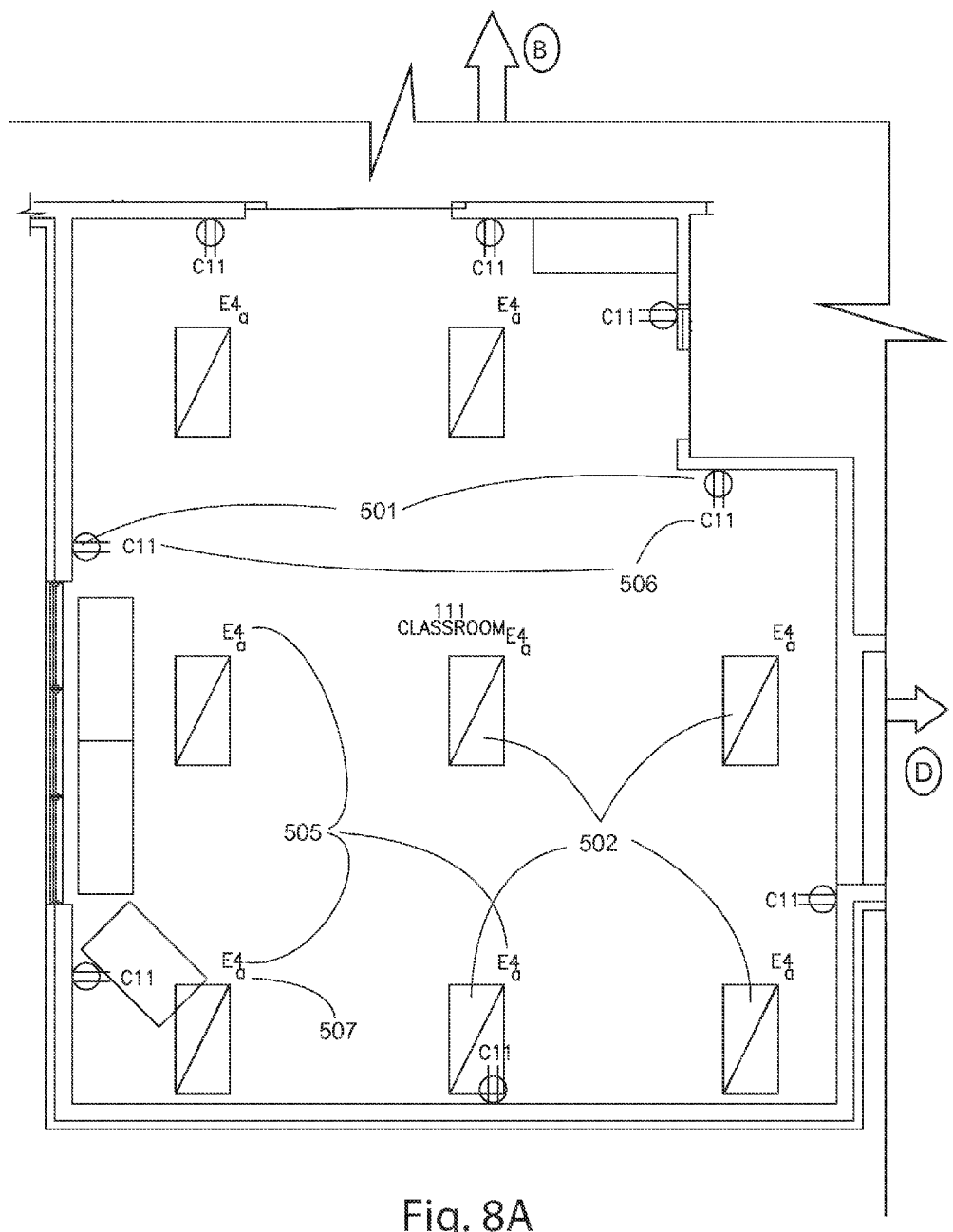
FIGS. 8A to 8D represent the quadrants shown in FIG. 6A (FIG. 8A), FIG. 6B (FIG. 8B), FIG. 6C (FIG. 8C) and FIG. 6D (FIG. 8D), wherein FIGS. 8 A-D further demonstrate auto-circuiting, assigning circuits and panels to each type of components located therein.
Figure 8B:
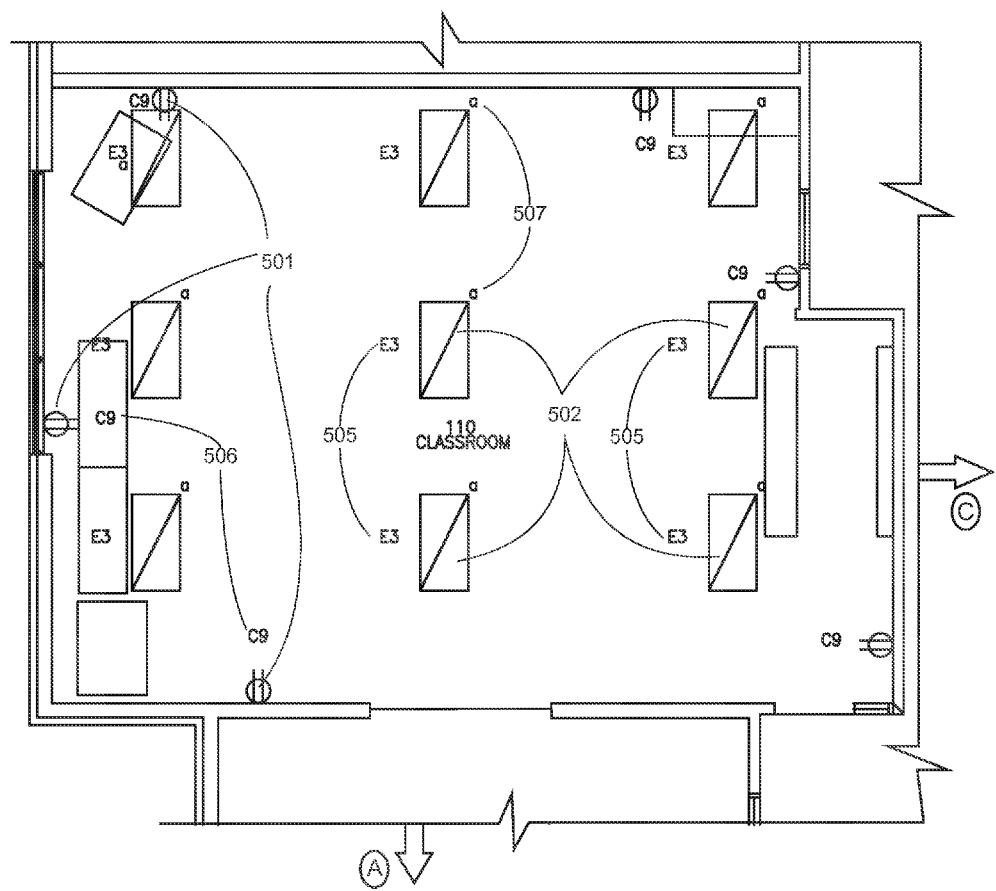
Figure 8C:
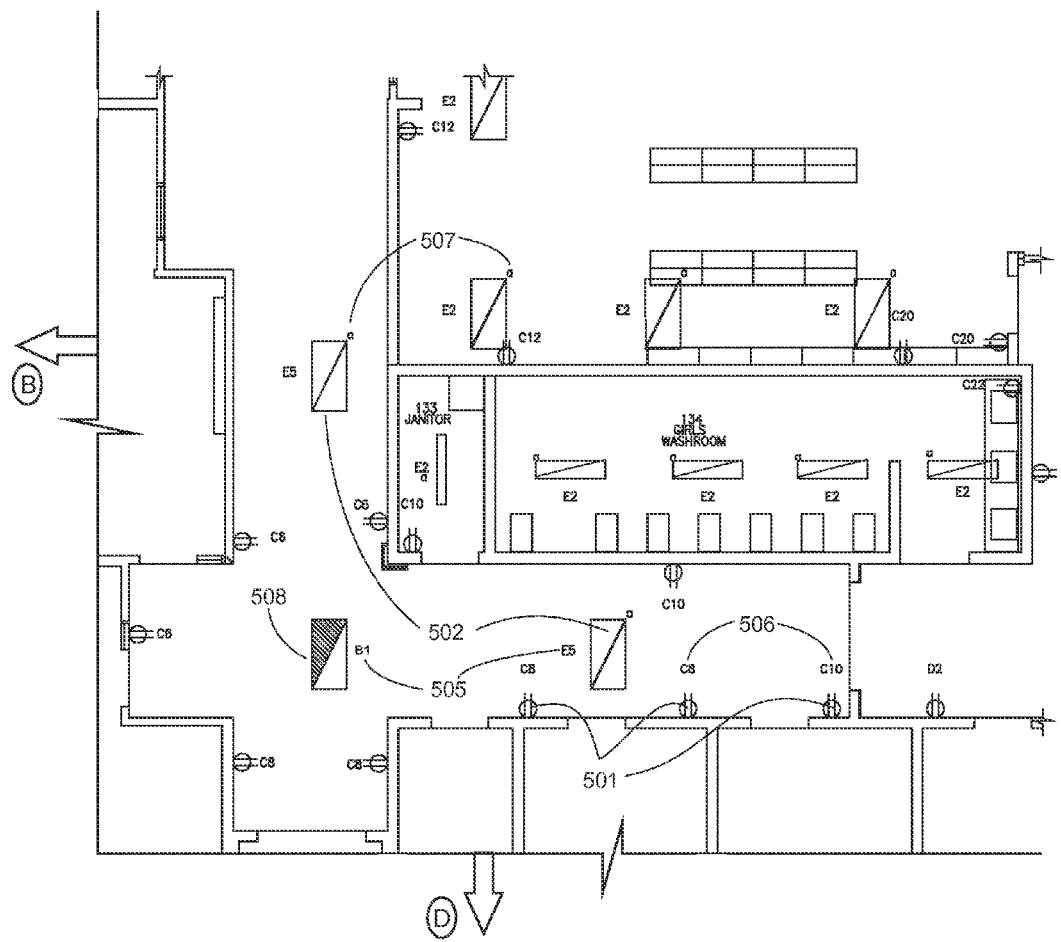
Figure 8D:
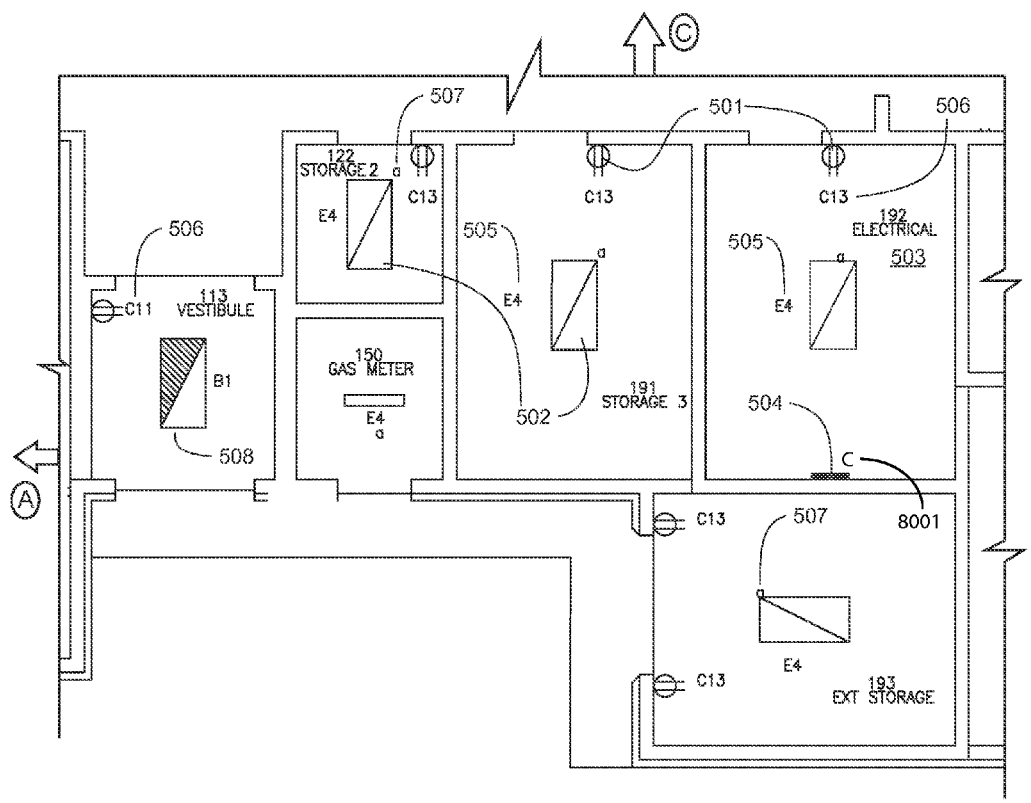
Figure 11A:
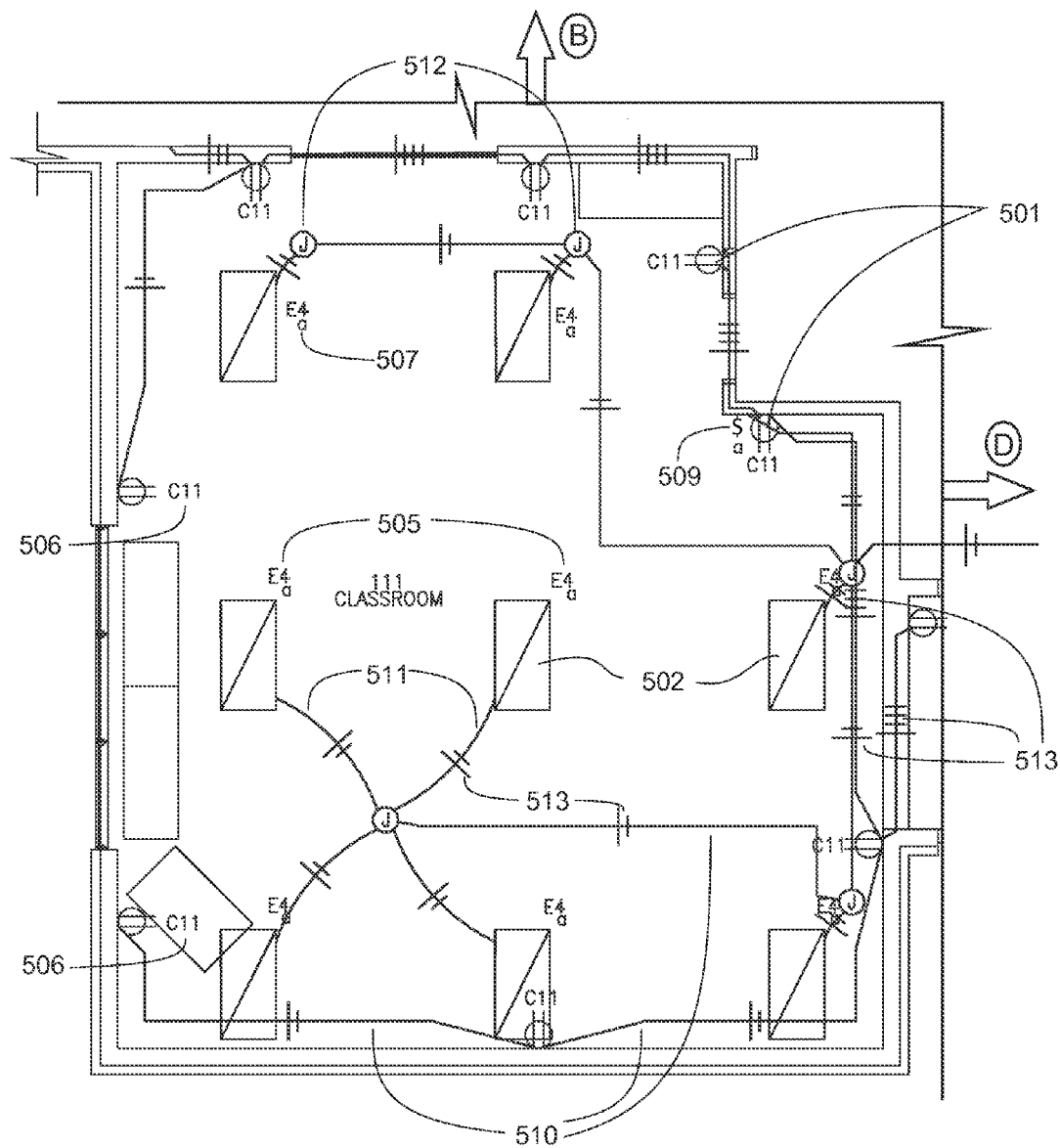
FIGS. 11A to D represent the quadrants shown in FIG. 8A (FIG. 11A), FIG. 8B (FIG. 11B), FIG. 8C (FIG. 11C) and FIG. 8D (FIG. 11D) including the application of lettered markings to indicate how quadrants A-D are positioned in relation to each other, wherein FIGS. 11A-D further partially demonstrate branch circuit wiring interconnections between members of the home run group and wire count symbols on most interconnections.
Figure 11B:
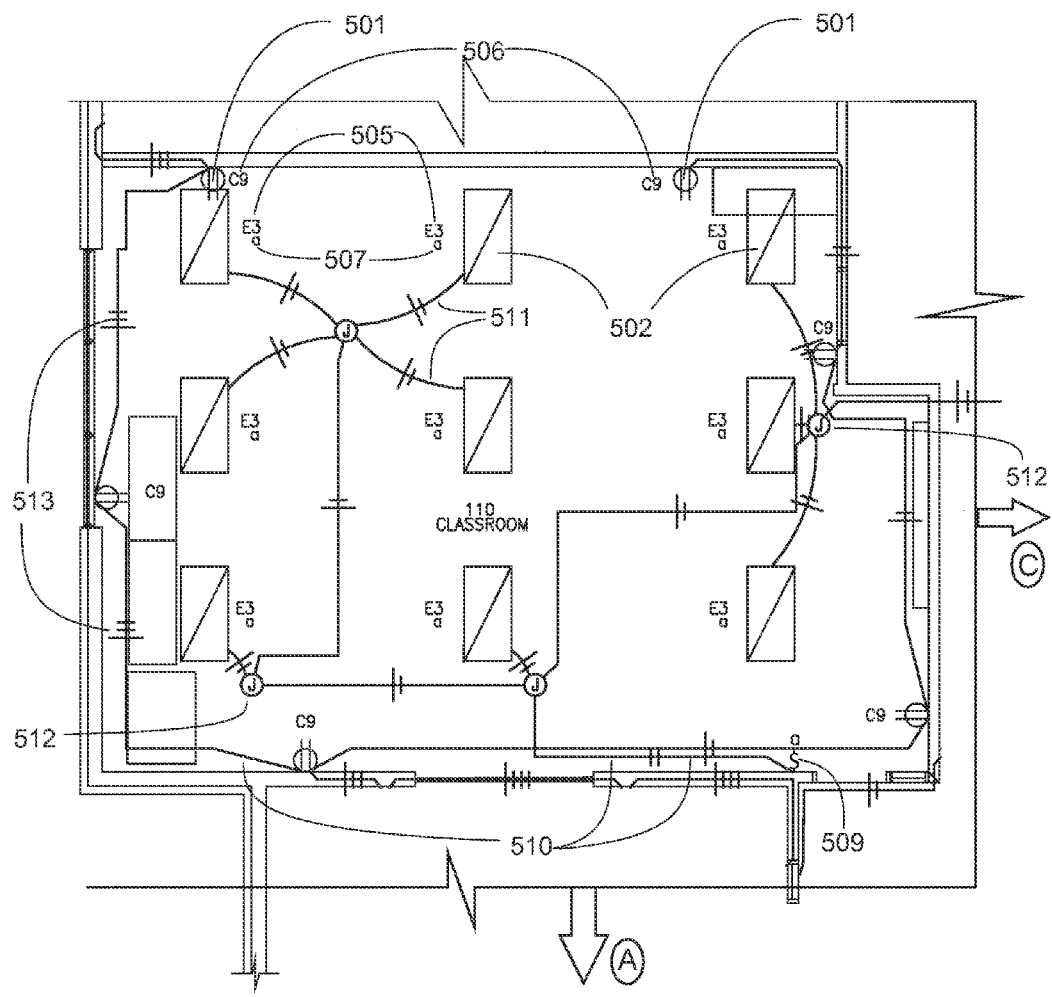
Figure 11C:
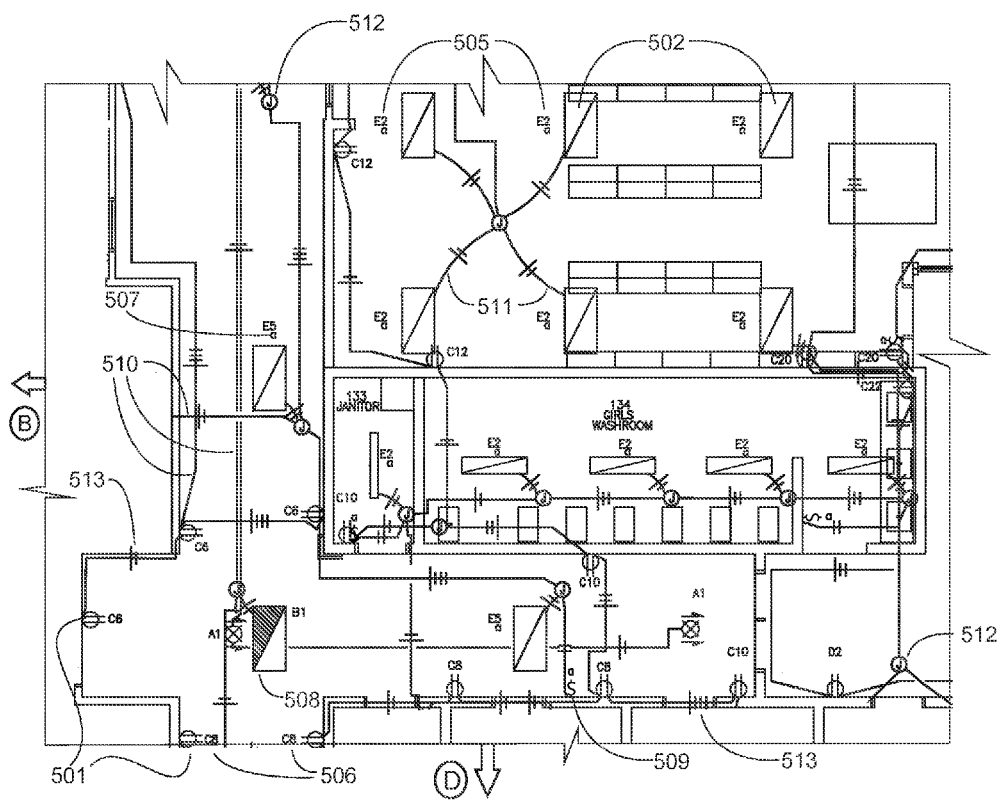
Figure 11D:
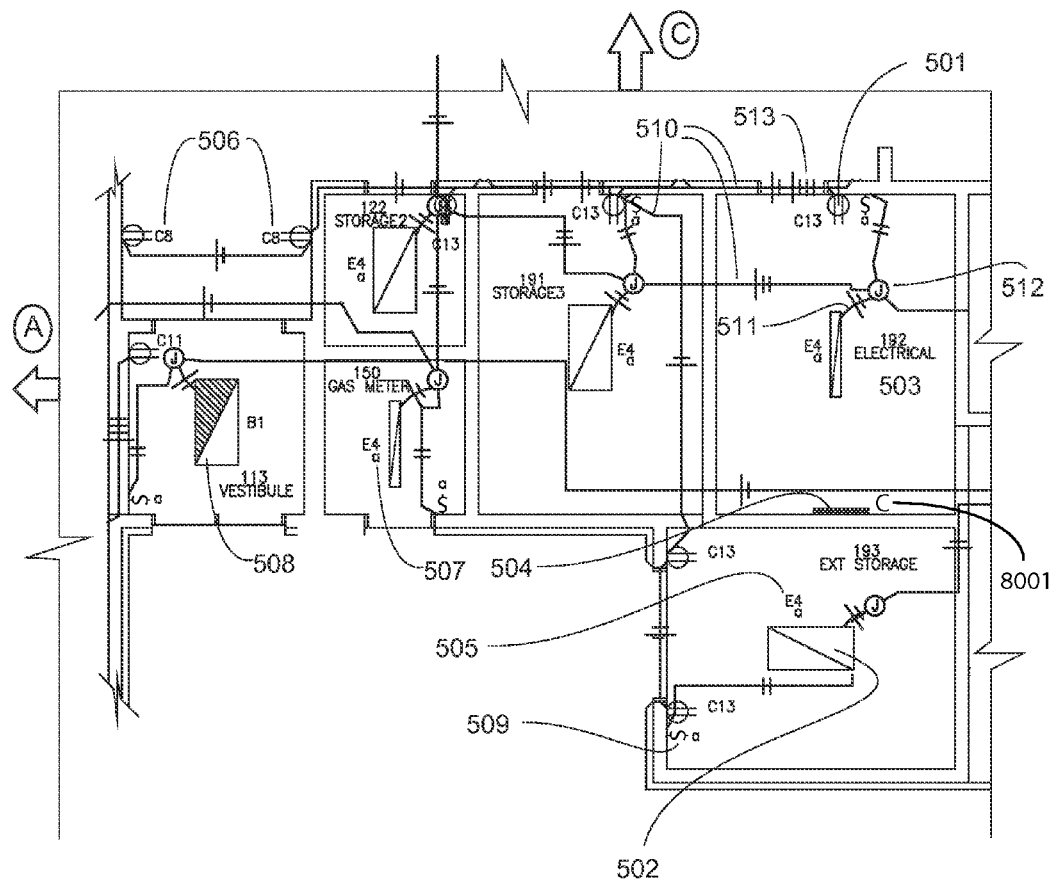
Figure 12A:
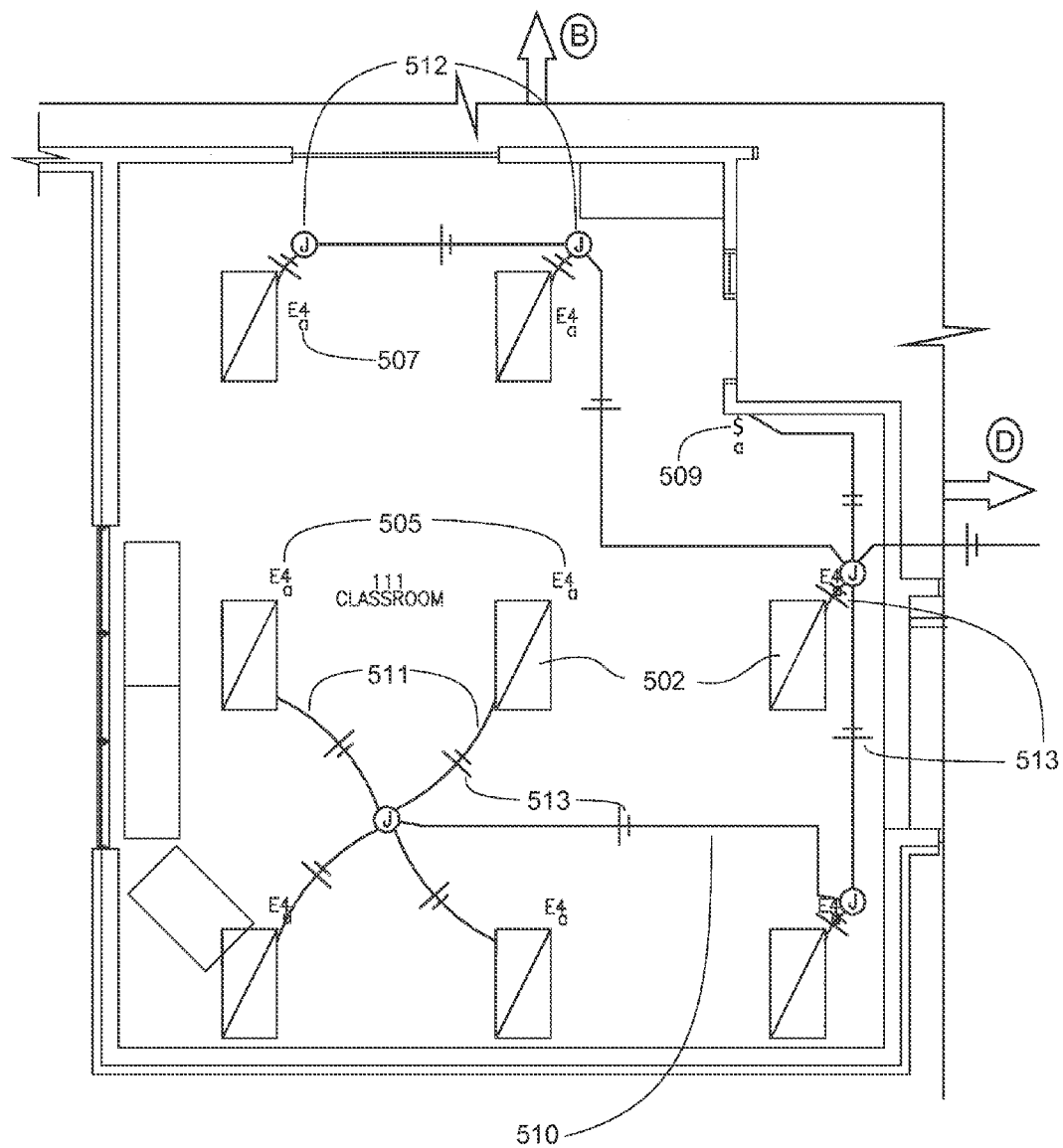
FIGS. 12 A to D represent the quadrants shown in FIG. 11A (FIG. 12A), FIG. 11B (FIG. 12B), FIG. 11C (FIG. 12C) and FIG. 11D (FIG. 12D), wherein FIGS. 12 A-D further partially demonstrate the branch circuit wiring interconnections for the lighting components.
Figure 12B:
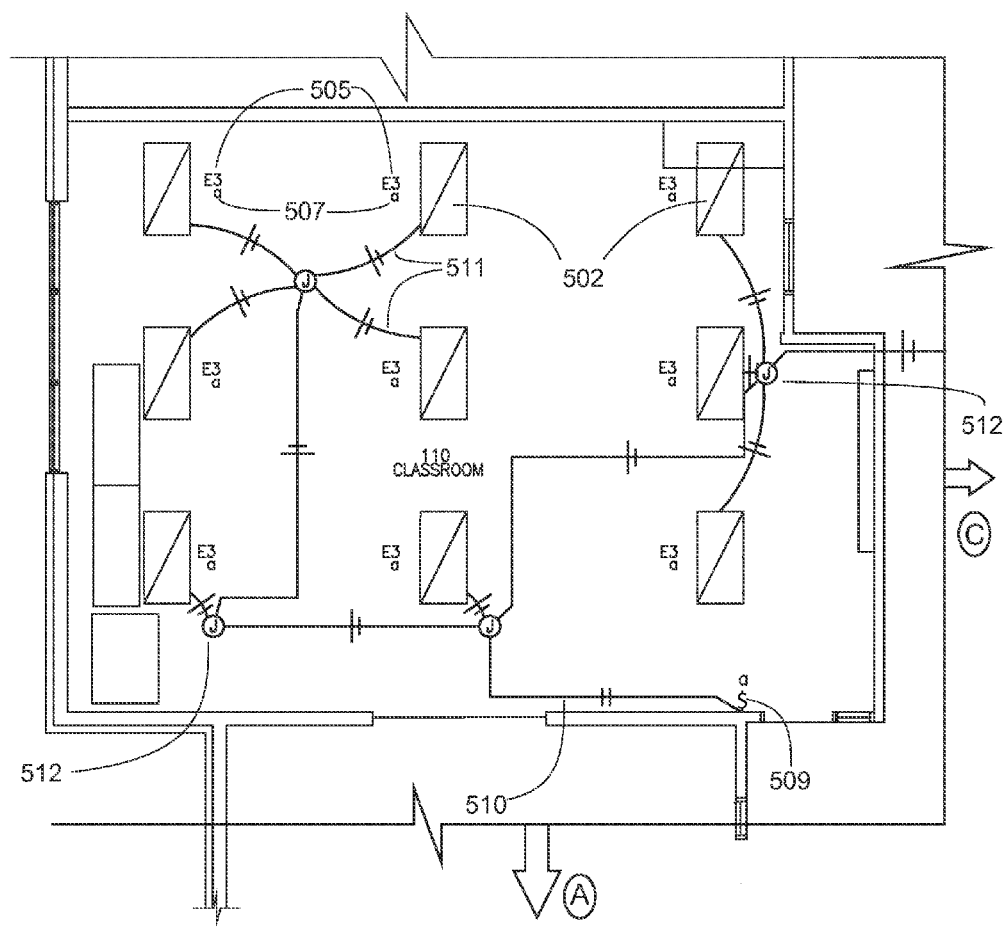
Figure 12C:
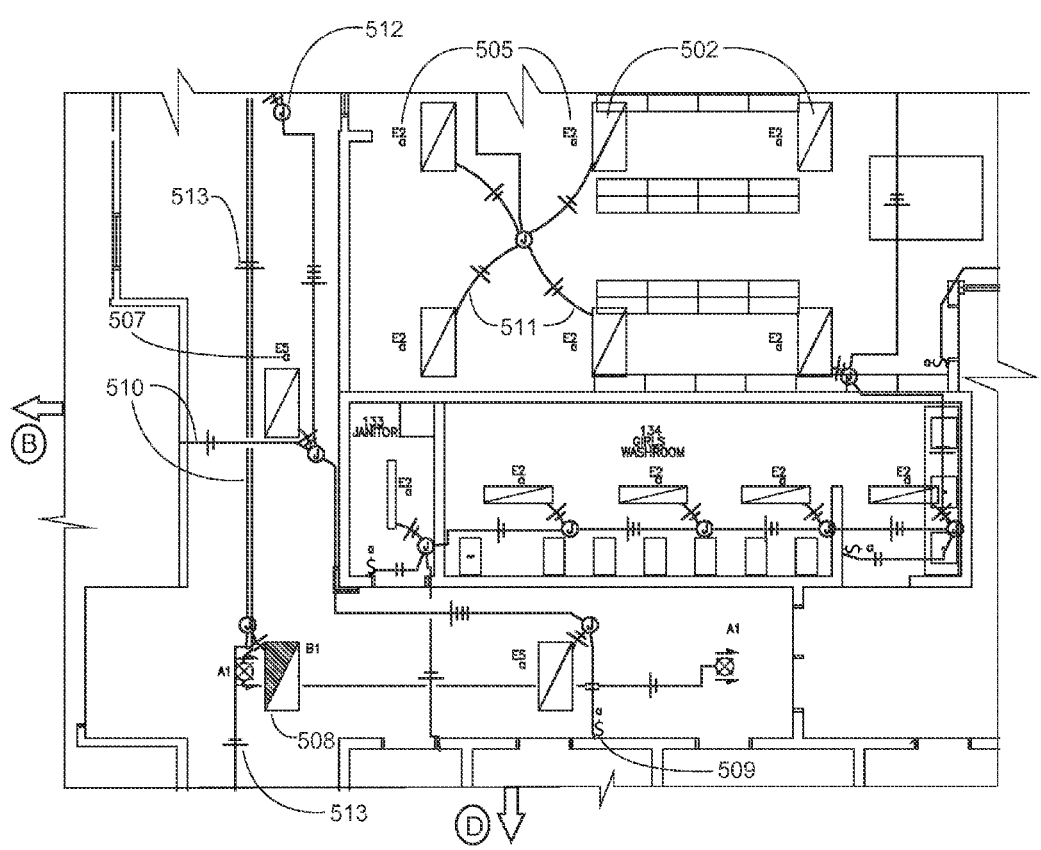
Figure 12D:
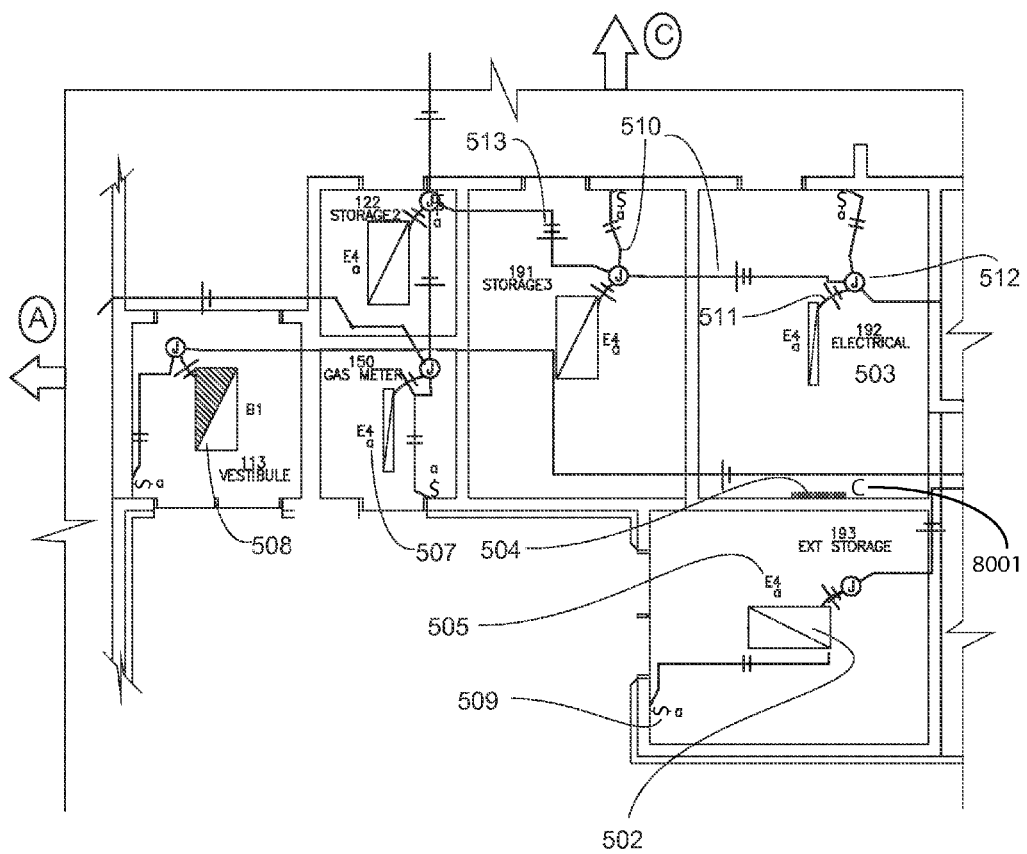
Figure 13A:
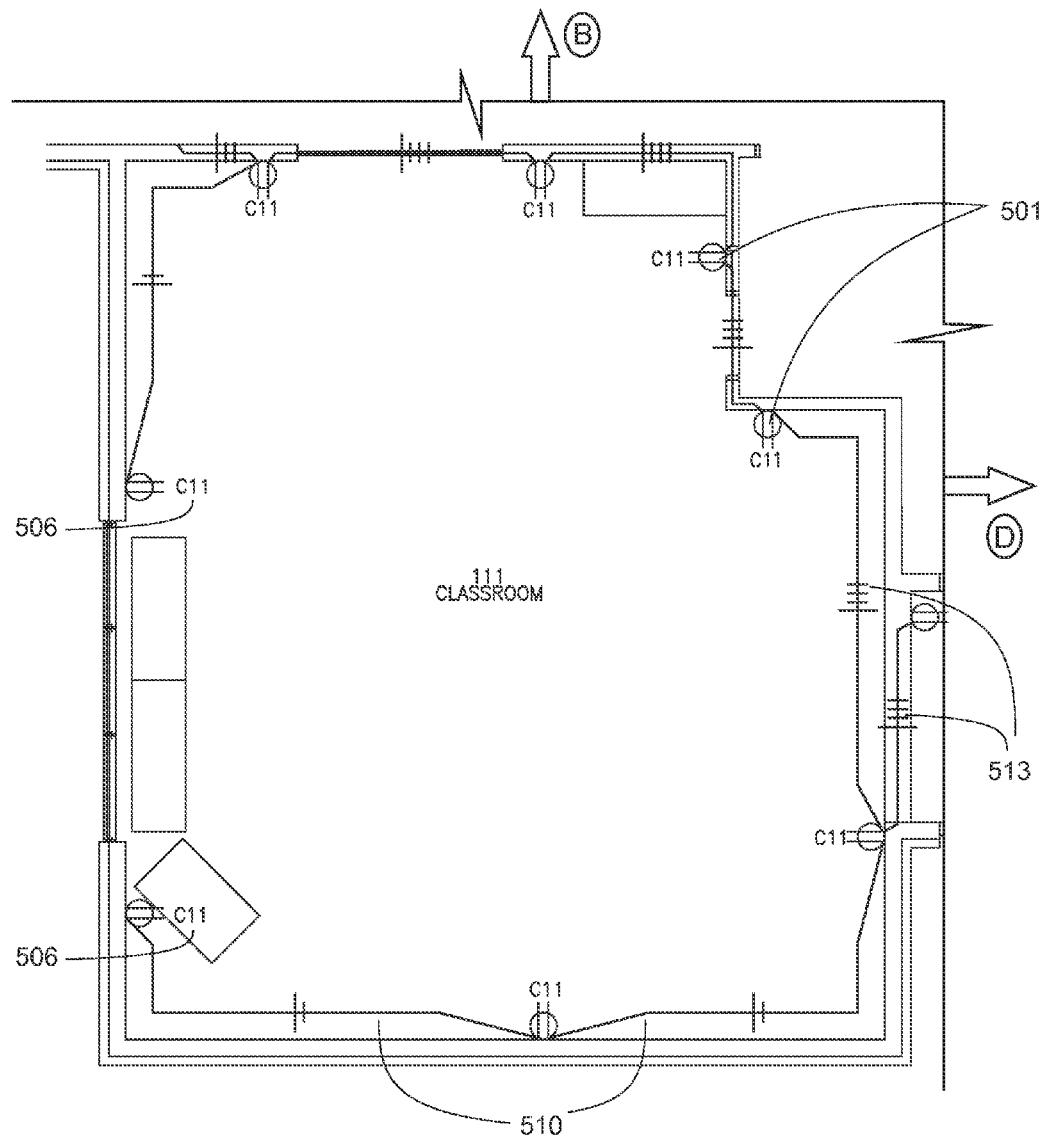
FIGS. 13 A to D represent the quadrants shown in FIG. 11A (FIG. 13A), FIG. 11B (FIG. 13B), FIG. 11C (FIG. 13C) and FIG. 11D (FIG. 13D), wherein FIGS. 13 A-D further partially demonstrate the branch circuit wiring interconnections for the receptacle components.
Figure 13B:
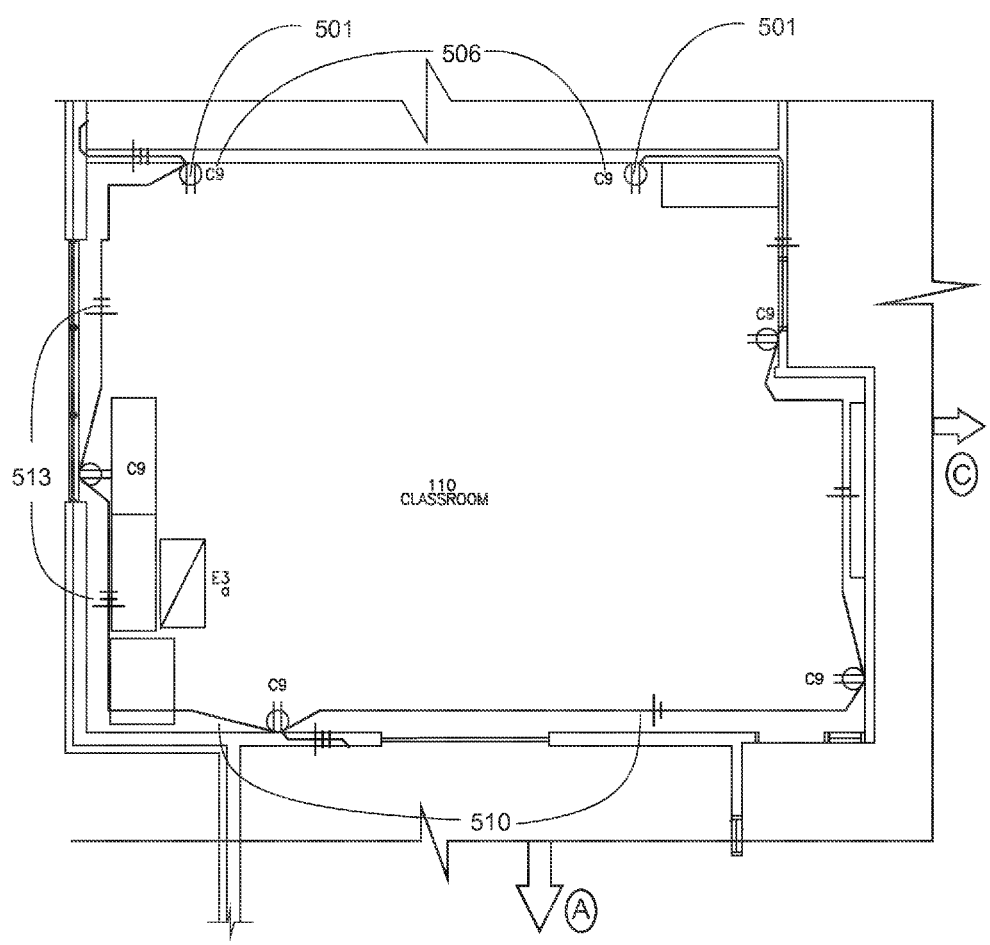
Figure 13C:
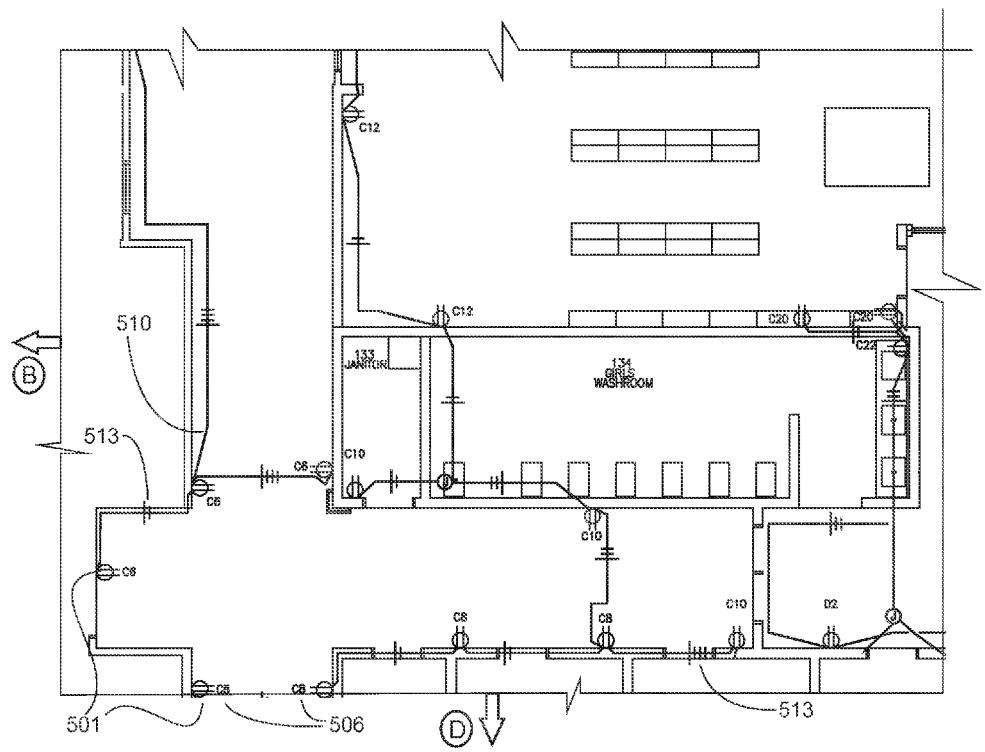
Figure 13D:
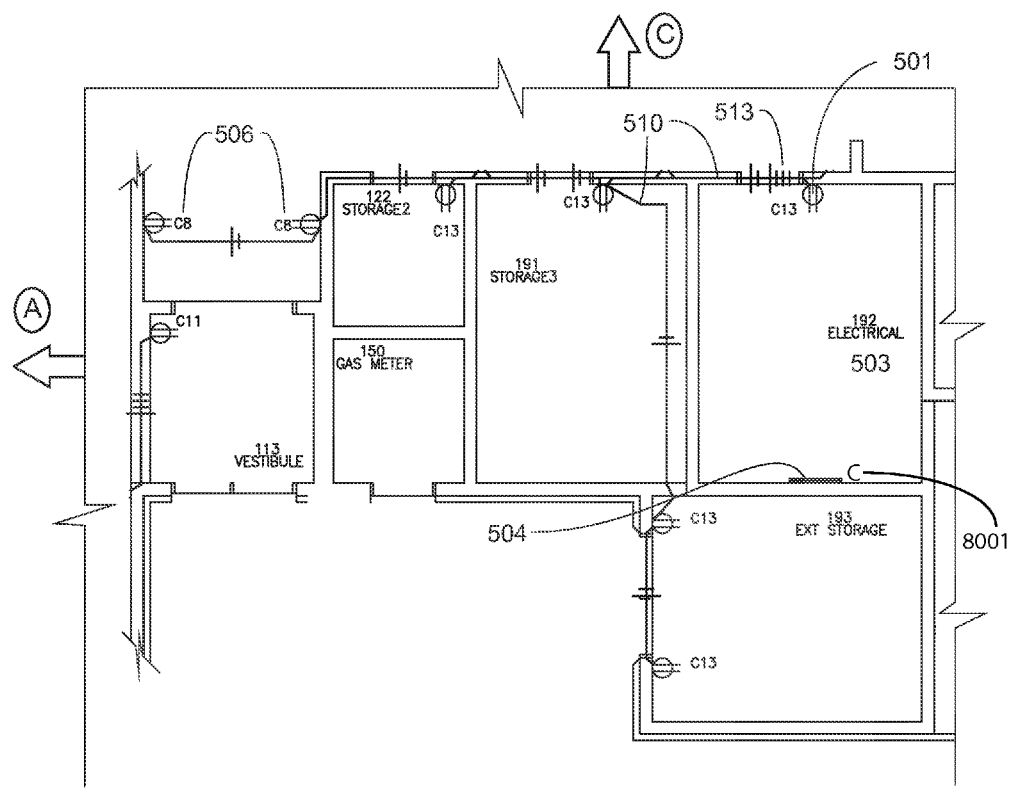

For example, as shown in FIGS. 7 and 8, each electrical component (e.g. receptacles 501, or lighting 502) is assigned to a circuit (e.g. C11 506 and E4 505 respectively), which is assigned to a specific panel and panel slot. Circuit C11 refers to the circuit assigned to a panel having the unique designation 'C', and the 11$^{th}$ circuit (also known as 'slot') on that panel (8001). In the case of some electrical systems, lighting for example, additional annotation like the switch ID is also included (see 507 FIGS. 11A-D, 12A-D).

h) Determining whether all electrical components from the selected service type(s) have been circuited (80);

In order to determine whether all of the electrical components have been circuited, the present system will cycle back to select additional compatible electrical components in step d) (40) for new circuits until either all compatible electrical components of the selected service type (30) from the selected service area (20) have been circuited or until the designation panel has no more available circuits of compatible voltage. The latter case only occurs when a service area has been directed to circuit to a particular pre-existing panel since service areas directed to circuit to panel rooms will have as many panels placed as are needed to service their electrical components.

i) Determining if all service types from the service area being processed have been circuited (90); In order to determine whether all of the service types have been circuited, the present system will cycle back to process additional service types (30) from the selected service area (20) until all service types have been processed or until the designation panel has no more available circuits of compatible voltage. The latter case only occurs when a service area has been directed to circuit to a particular pre-existing panel since service areas directed to circuit to panel rooms will have as many panels placed as are needed to service their electrical components.

j) Determining whether all service areas have been circuited (100) In order to determine whether all of the service areas have been circuited, the present system will cycle back to process additional service areas (20) until all service areas selected for this automated circuiting batch are processed.

k) Determining whether the automated circuiting is complete (110). The automated circuiting batch is complete once all service areas selected for the batch are processed.

As a result, the present system is capable of providing a "circuited design" (1003 in FIG. 1), having circuited electrical components that are annotated with circuit and panel identifiers.

Users can affect all manually and automatically placed panels in many ways including but not limited to specifying: the protection and feeder, diversity of the various service types to be assigned to the panel, the voltage that the panel can handle, the phase type of the panel, spare and unavailable panel slots. Users can also use circuiting tools in the computer application to make any additions, changes, or deletions to the circuiting assigned to all panels, whether manually or automatically placed and whether the circuit in question was automatically circuited or not.

It is understood that the present system is further capable of providing detailed schedules, diagrams, and reports representing the circuiting from throughout the circuited design such as a panel schedule (1004 and FIGS. 9 and 10).

For example, having further regard to FIGS. 9 and 10, the panel schedule produced by the present system is a complete disclosure of all the information about a panel. A panel schedule can be produced purely using the information available from a circuited design, in which case data relying on all service devices having been added to the design and interrelated is incomplete or inaccurate. Regardless, a panel schedule produced at this stage of the design still completely reports on the circuits of the panel. The panel schedule identifies the unique name of the panel, where the panel is located, the fault level for the panel, the parent device of the panel, the panel's voltage rating, each circuit's protection rating, the number of electrical components on each circuit, the phase of each circuit, description of each circuit type, the location and/or named components of each circuit, and in the bottom section details load summaries, values used in protection and conductor selection, and finally the bus/protection/conductors/and bond or ground between the panel and its parent device. For example, and referring to FIG. 9, Circuit C11 is a C phase circuit (refer to A B C columns in middle of panel schedule), having a total of 9 electrical components (refer to Device Count column) for a total wattage of 1100 W (refer to Watts column). Circuit C11 services receptacles "R:" in "classroom 111" and "vestibule 113" (refer to Service Description column).

Automated Branch Circuit Wiring

Figure 3:
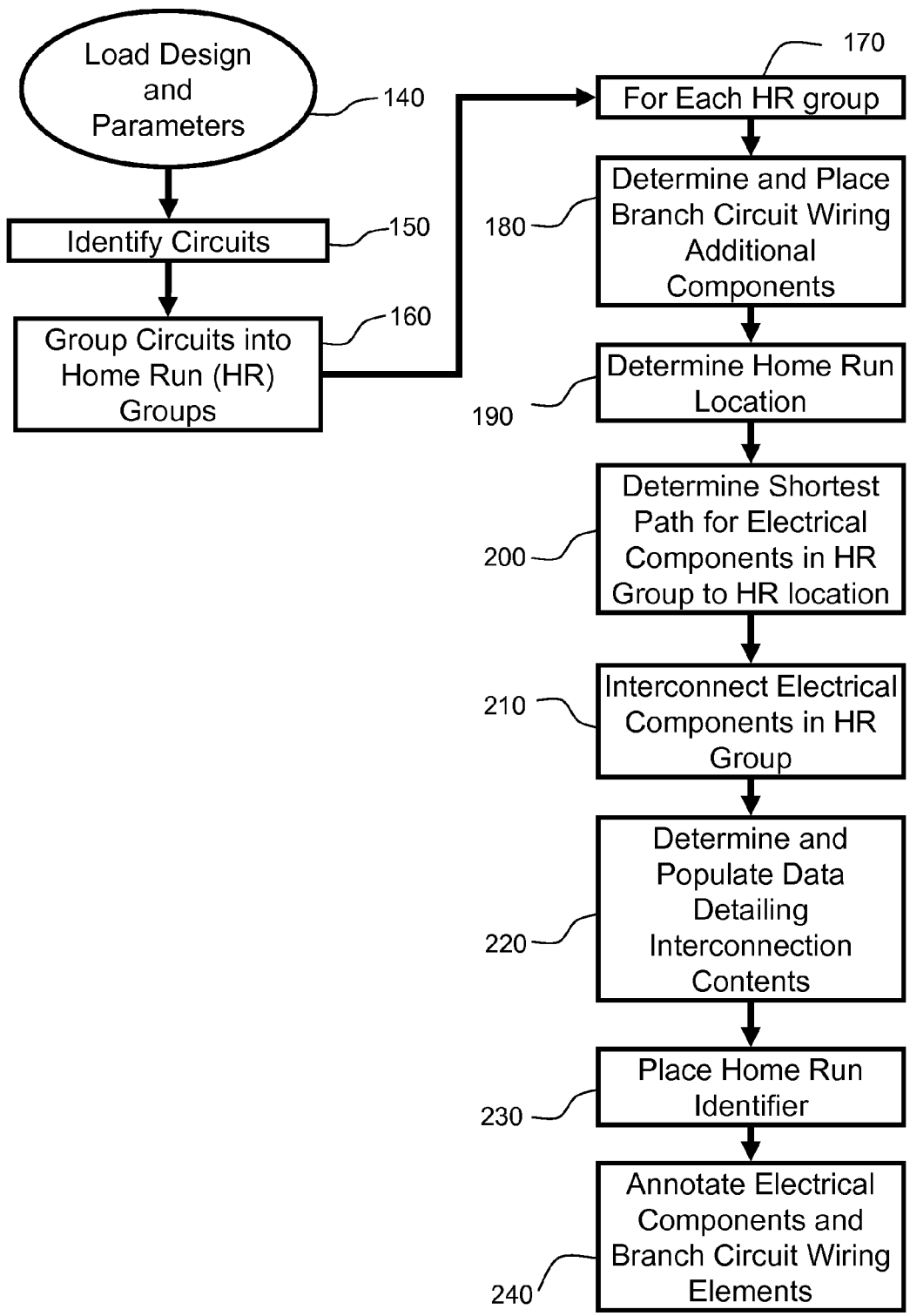
FIG. 3 is a schematic flow chart illustrating an embodiment of the branch circuit wiring of FIG. 1 of the present system.

Having regard to FIGS. 3 and 11(A-D)-21, the present system is further capable of providing a branch circuit wired design 900. A branch circuit wired design is produced by processing a circuited design. The circuited design can have been produced by prior embodiments of the system, by the user manually, or by a different system. The branch circuit wired design that results can include: branch circuit wiring interconnections drawn, detailed interconnection data generated, home run locations selected, and home run data generated. Branch circuit wiring processing can occur for system types such as lighting, receptacles, motors, and other types of electrical components. Branch circuit wiring processing determines power service and/or connectivity for each service type in its own set of conduits, wires, armored cable or other wiring methods. Where requested via user parameters or execution choices, in certain circumstances as allowed for by electrical standards and standard practice, branch circuit power service and/or connectivity for certain service types may be combined the same conduit.

A branch circuit wired design may include such visual and stored data elements such as: interconnecting lines/arcs or other such representation of the route of conduit/wire/cable between the plurality of electrical components, branch circuit wiring devices, and home run locations; wire count indicators, some purely symbolic and some text-based; home run arrows or other indications of home run location; home run details such as circuits involved, wire/cable/conduit specifications; and distances for both interconnections and home runs. Branch circuit line/arc drawing elements are lines, arcs, other shapes, or 3D entities (e.g. conduit) drawn to show that a wiring medium connects two components. Each wiring medium may have a distinctive style and appearance of linework, for example conduit drawn using straight lines and fixed angles versus metallic or non-metallic sheathed flexible cable drawn using arcs. The interconnections may also be represented by a 3D actual path routing of conduit/wire/cable in such instances where the end product is desired to be a 3D approximation of reality rather than a 2D construction documentation end product.

The system determines the wire count, wire usages, wire/cable types, wire length, conduit size, conduit type, and wire sizes for each connection. The connections are among the plurality of circuited electrical components, branch circuit wiring devices like junction boxes, the home run location, and between the home run location and the serving panel.

In some design mediums (where a design medium can be, for example, a particular vendor's CAD software or building information modeling software) some or many or all branch circuit wiring elements are not shown in the design, it is all instead held purely in data associated to the electrical design in such environment. As with other annotation and identifiers addressed in this application, such things are optional for the present system to place, it is the determination and storage of the data of what the branch circuit wiring elements are and where they are that is essential, whether the data is stored directly in the design environment and/or in a data storage (e.g. database) associated with the electrical design.

More specifically, the present system may initiate a branch circuit wiring project by way of the following steps:

a) Providing a computer for receiving a circuited design, wherein the design has at least one circuited electrical component and the serving panel for the circuits in the design. For example the 'C' panel and electrical components circuited to it from FIGS. 8A thru 8D. Also provided to the system for use during processing are branch circuit wiring relevant: electrical standards, industry standard practices, and user parameters (140).

b) Determining and identifying one or more circuits for branch circuit wiring (150) processing. The user determines whether to submit one, many, or all circuits in the project for a particular execution of automated branch circuit wiring. The system locates all electrical components that make up the identified circuits and their serving panel (also known as parent panel) for branch circuit wiring processing.

c) Grouping the circuits to generate "home run groups" (160), until all circuits are either a member of a multi-circuit home run group or have been determined as home running alone (aka single circuit home run).

A "home run group" is a collection of circuits from the same serving panel wherein the circuits share space within the electrical conduit or cable and may share the use of a common neutral and/or bond/ground. For example, a home run group may consist of circuits C2, C6, and C10, or C7, C9, and C11 (see FIG. 19 where 516 represents the home run location, 514 the home run description text, and 515 the home run arrow for the home run group of circuits C7, C9, and C11).

While multi-circuit home run groups are contemplated, it should be known and understood that a single circuit can be grouped as its own home run group if necessary, which can result if the system or user has identified the particular circuit as needing to home run alone or if the system determines there are not any circuits suitable to group with it as a multi-circuit home run.

Assignment to a particular home run group is determined using criteria including, for example, the area of travel of the circuit, its distance from its parent panel, the possibility of neutral wire sharing, and avoiding circling the parent panel. Some of these criteria will affect the present system's decisions indirectly, other criteria directly control system decisions. The number of circuits to group together is a user parameter typically decided by the user based on such factors such as the size of the conduit required for a home run group, the size and costs of conduits commercially available, whether the circuits in question are serviced by a single or three phase panel, and the amount of available space desired remaining in the conduits for new circuits in the future.

The present system attempts to reduce electrical construction costs by minimizing the amount of materials and time required to build a design. For example, the present system considers the length of each circuit and the distance of that circuit from its parent panel, and determines a shortest route for that circuit to its panel. The route for each circuit is then compared and those circuits having similar routes to the same panel can be grouped together to form a home run group. Shorter routes for the circuits minimize the amount of conduit and wiring or cable required and thus the overall costs of construction.

Another criterion for grouping circuits into a home run group is the promotion of neutral wire sharing. The system will group those circuits that can share a common neutral wire instead of running separate neutral wiring for each circuit. Circuits that are of different phases can share a common neutral wire, although the user and system have the ability to specify/determine circumstances where neutral wires are not to be shared by the present system's automated branch circuit wiring.

For example, having regard to FIGS. 9 and 10, each circuit in the branch circuit panel schedule for a three phase panel has a particular phase A, B, or C. The panel schedule shows that circuits #1 and #7 and #1 and #13 are of the same phase. Thus, circuits #1, #7, and #13 cannot share the same neutral wire and thus would not be grouped together to form an optimal home run group. Such a group would require three separate neutral wires, unnecessarily increasing costs to the overall project. The system may form such groups, however, if the other determining factors for home run grouping leave only such combinations available, i.e. the system weighs a large number of criteria against each other in order to determine circuit inclusion in home run groupings. Such criteria come from electrical standards, industry standard practice, and user controllable parameters.

Figure 19:
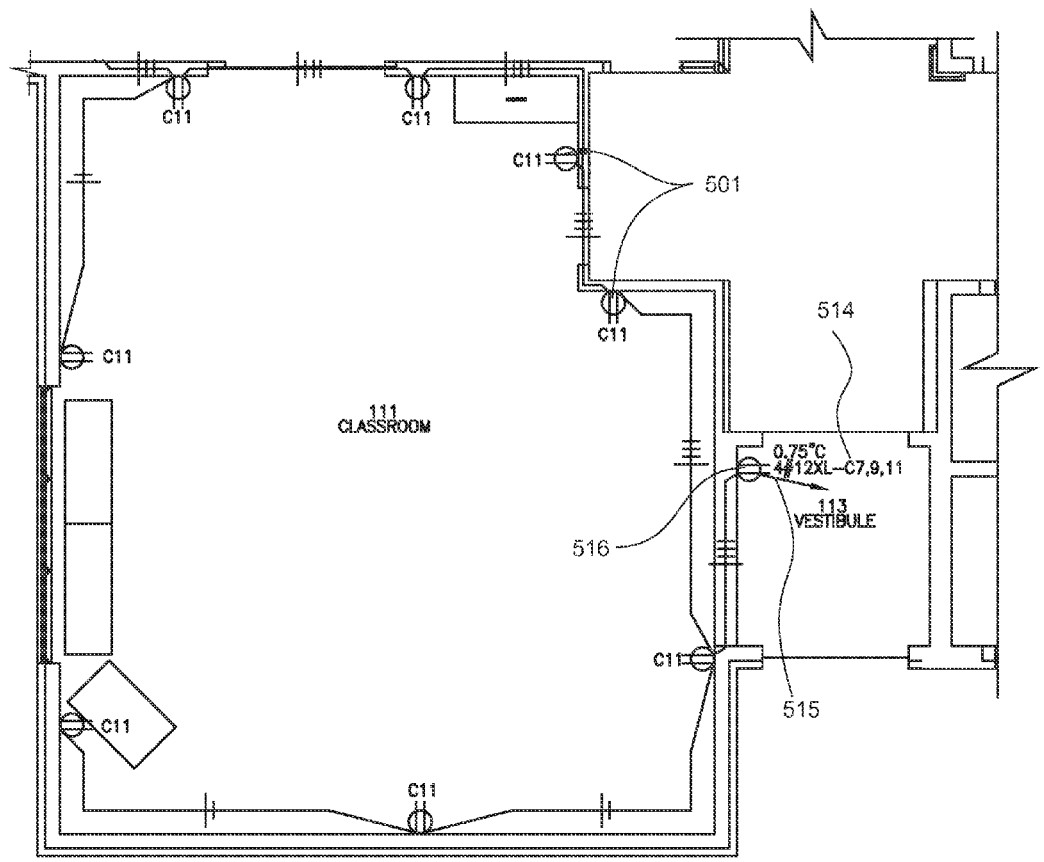
FIG. 19 is a branch circuit wired design illustrating the home run grouping for the exemplar classroom of FIG. 7 and neighboring assets/spaces illustrating an embodiment of home run grouping of circuits C7, C9 and C11, wherein C11 branch circuit wiring interconnections are shown and C7 and C9 circuits join from assets/spaces to the north.
Figure 20:
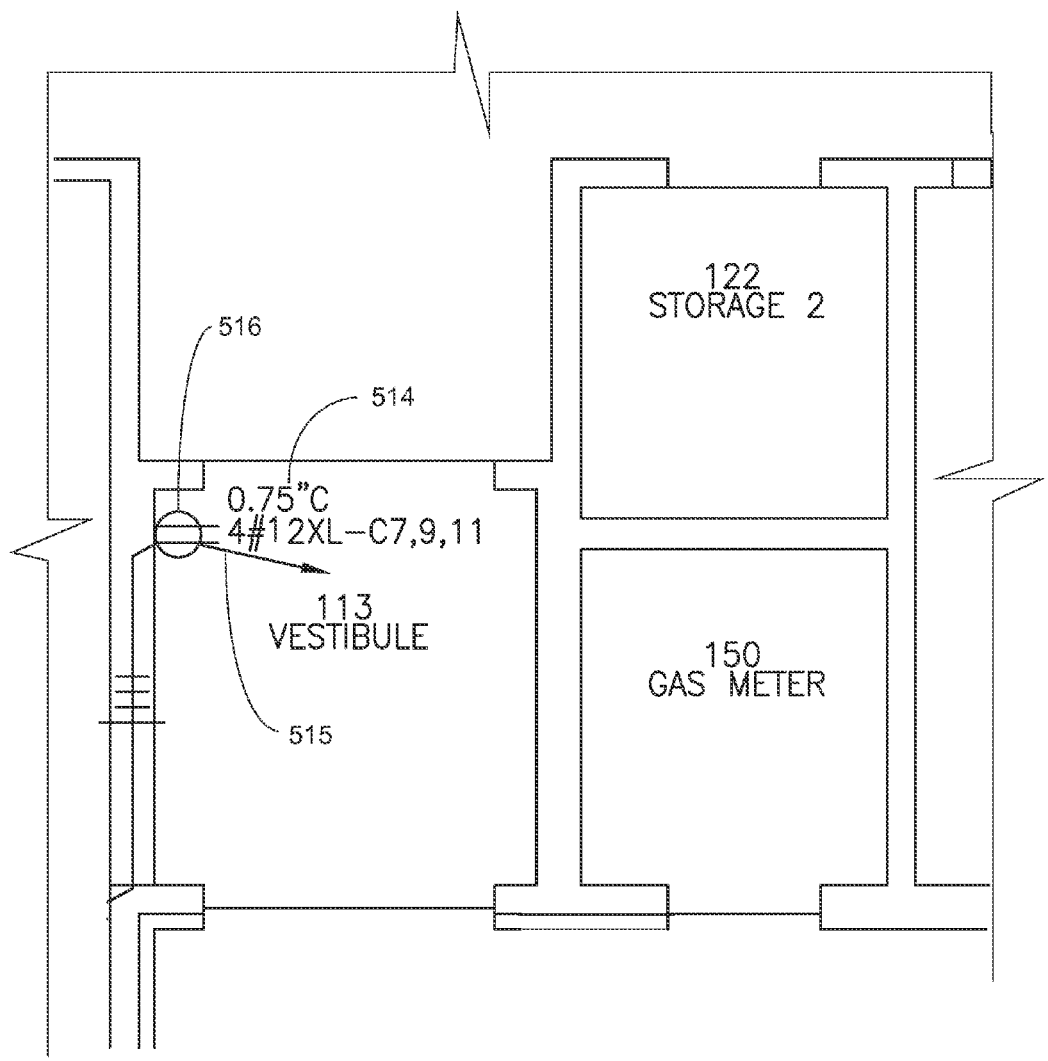
FIG. 20 is a close up of the home run location, home run arrow, and home run text annotation for circuits C7, C9 and C11, of panel C comprising 4 wires, each #12 gauge wire traveling in ¾" conduit.
Figure 21:
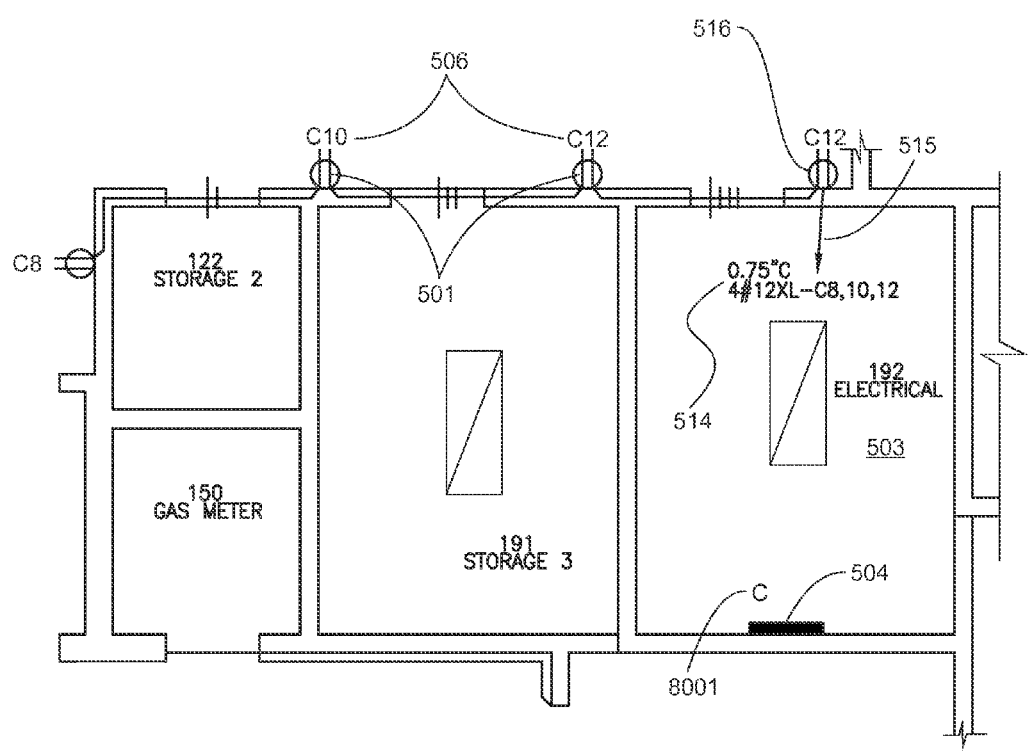
FIG. 21 is a close up of the home run location and home run indicator for depicting circuits 8, 10, and 12, also of panel C and comprising 4 wires, each #12 gauge wire traveling in ¾" conduit.

As a further example, having regard to FIG. 19, circuits C7, C9, and C11 have been grouped together as a home run group 514, which is desirable as evidenced by each of those circuits being of different phases (see schedule FIG. 9). It should be noted that the phase grouping to allow neutral sharing can be ABC 7/9/11, BCA 9/11/13, CBA 11/15/19, or any other combination where none of the phases is repeated.

For service types grouped by means other than circuits, for example by battery pack identifier for emergency light heads, the present system relies instead on those particular grouping methods for those particular components.

The present system then continues the branch wiring process by way of the following steps executed for each home run group (170):

Determine and Place Branch Circuit Wiring Additional Components (180);

Determine the "home run location" for each home run group (190);

Determine the shortest path for each electrical component in the home run group to the home run location (200), thereby minimizing construction time and materials;

Establish interconnections between the electrical components in each home run group to each other and ultimately to the home run location (210);

Determine the detailed conduit, wire, cable and other materials that make up each interconnection between the electrical components and populate such data into the design and/or a database associated to the design (220);

Determine and place home run identifiers at the home run location (230);

And finally, annotate electrical components and branch circuit wiring elements as desired in the design (240).

d) Determine and Place Branch Circuit Wiring Additional Components (180)

Based on electrical standards, industry standard practice, and user parameters, the branch circuit wiring process may need to place additional components as part of generating a branch circuit wired design. Such components might be, for example, junction boxes that do not bear load but instead service only as a location to consolidate and splice wire. This is unlike a direct-wired junction box load like a kitchen disposal unit that represents an electrical load. These 'wire consolidating' junction boxes can be used as wire gathering points for fluorescent fixtures in t-bar ceiling or as wire gathering points on the structural ceiling of a room for the receptacles mounted on the walls, for example.

When the branch circuit wiring process places additional components, such components become an inherent part of the circuits/home run groups that they have been placed as part of for further branch circuit wiring processes. Thus, for example, a junction box placed to consolidate wire at this stage can be considered as a home run location and will also be included in interconnection routing and interconnection drawing.

e) Determine the "home run location" for each home run group (190). The "home run location" is the electrical component selected from within all circuits of a home run group that is the closest in proximity to the servicing panel. The electrical component may be from the source circuited design or a component added by the system as required for branch circuit wiring, like junction boxes to splice wire within. For example, home run group 514 (annotated by home run arrow 515) is at home run location 515 (receptacle) oriented to the associated panel (504), wherein the annotation includes attached data about the calculated distance for wire to travel based on whether the home run group is connected via overhead or in-slab and to accommodate for virtualized vertical travel as well as horizontal travel.

All wiring for the home run group to service the electrical components within the circuits of the home run group will consolidate at the home run location and then travel to the servicing panel without any additional splicing of wires. While the exact path of the wiring from the home run location to the serving panel may or may not be drawn by the present system based on a user preference parameter, a "home run arrow" and/or other such branch circuit wiring elements to mark and detail the home run location may be provided by the present system if requested in a user preference parameter. It should be noted that where devices have been wired to a non-load bearing junction box for wiring consolidation purposes, such junction box may be selected as the home run location despite being further from the serving panel.

f) Determine the shortest path for each electrical component in the home run group to the home run location (200)

The present system utilizes a shortest path method to connect adjacent members of each home run group, such as along the perimeter of a wall or directly across the room or to a centrally located junction box for wall mounted devices, and such as in a row and column fashion for ceiling mounted lighting, the present system interconnects each of the one or more compatible components within each home run group and finally interconnects the last of the compatible components with the component designated as the home run location. The shortest routes and paths may be determined using any methodology, such as methods of simulated annealing for solving optimization problems of a large scale; provided that the circuit's route of travel to its home run location is the shortest route possible while promoting neutral wire sharing, where neutral wire sharing has been allowed, and other such routing requirements from electrical standards, industry standard practice, and user parameters.

The specifics of the routing created by the present system for any particular interconnection may differ based on whether the user has requested routings for construction documentation or 3D routing along actual path. For example, consider two receptacles of the same home run group five meters apart from each other on neighboring walls. For construction purposes, the style of interconnection produced by the present system may be a simple 2D arc to represent a cable connection or 2D lines drawn at particular angles and distances from walls to represent conduit. Such lines will typically be drawn in the open space of the room near the wall the receptacles are mounted in, rather than inside the walls since the legibility of the floor plan plots is paramount for construction purposes. For use in a 3D building information modeling environment, however, the style and route of interconnection produced by the system will match the actual 3D routing of the conduit/wire/cable used for the interconnection and represent the size of the material used (e.g. 0.922 inches outer diameter for a typical brand of 0.75 inch EMT conduit). Such 3D routing will typically be shown for the complete travel of the home run group's connectivity to the serving panel rather than being terminated at the home run location.

Where the present system is to both determine the interconnection path and draw such paths, the present system may determine an actual interconnection distance in many cases that differs from the raw length of the linework placed in the branch circuit wired design by the system. The reasons for this are first to accommodate for limitations of the design environment, for example a 2D CAD environment will not allow for the true 3D travel of the interconnection path to be represented. Secondly, the system may be constrained by electrical standards, industry standard practice, or user parameters in how it is allowed to represent interconnections as these constraints evolved to make floor plans readable by electrical contractors at the job site. In either case, the system will comply with limitations of the design environment and constraints imposed upon it but still calculate an accurate true distance for each interconnection. Thus, where the present system has routed interconnections in a manner optimal for construction floor plans by user requirement, the system delivers the most readable floor plan product for construction purposes while still delivering accurate bill of materials data for estimating and materials ordering purposes g) Establish interconnections between the electrical components in each home run group to each other and ultimately to the home run location (210).

Generating "branch circuit wiring connection lines" between the electrical components of each home run group, wherein said lines may be in a style (e.g. arc, straight, path style, CAD layer, etc) specified by user discretionary parameters unless overridden by building code parameters. Where required by the user, the present system will represent the interconnections with a 3D routing of conduit/wire/cable through the building model in such instances where the end product is desired to be a 3D representation of reality rather than a 2D construction documentation end product.

It is understood that the end user may specify a parameter for the present system's automated branch circuit wiring process of wiring type. For example, the end user, using a drop down dialog box, may select a wiring method to be used during the execution of automated branch circuit wiring, although certain components will override the user selection with a set type of wiring method where electrical codes or standard practice require it. Such wiring methods can include armored cable, conduit and wire, and non-metallic dry cable or more particularly specify a certain type of conduit/wire/cable available from a certain manufacturer.

As detailed in the prior step, f, the routing and style of interconnections and home run representation may differ based on user selection of 2D or 3D representation and purpose of automated branch circuit wiring output. In a 2D environment with construction documentation desired as the end product, for example, to produce a complete branch circuit wiring design having a home run identifier associated with each home run location, the present system establishes branch circuit line drawing elements according to the established interconnective relationships of the one or more compatible components. Having regard to FIGS. 11(A-D), 12 (A-D) and 13 (A-D), each branch circuit line drawing element is identified with branch circuit wiring annotation/interconnecting lines (510, 511), wherein one style of line may represent the conduit and wire interconnections (510) or one style of arc representing either non-metallic dry sheathed cable or metallic sheathed cable interconnections (511). As further detailed in 220: the lines themselves or data associated to the lines may further detail the wiring medium, wire counts, wire sizes and the use of each wire traveling along the path; also the present system may further calculate and annotate vertical and horizontal distance for each interconnection and home run.

h) Determine the detailed conduit, wire, cable and other materials that make up each interconnection between the electrical components and populate such data into the design and/or a database associated to the design (220);

With the routes for the home run group interconnections and home run locations determined, the present system determines the wiring size for each component to component interconnection within the home run group and for the home run location to the serving panel by considering parameters including wire length, wire count, bonding wire size, conduit size and length, and voltage drop. Due to the resistance of wires, thicker wires are required to transmit the same amount of power to an electrical component that is located at the end of a longer transmission wire. The present system further calculates and annotates vertical+horizontal distance for each interconnection and home run.

Wire counts are totals of such things as hot wires, neutral wires, and ground wires. Wire usages include such things as hot wires from the serving panel, switch hot wires coming from switches, shared neutral wires, unshared neutral wires, and more. Wire/cable types include such things as dry use, wet use, armored, unarmored, and more. Wire length is a 3D calculated length required to make a connection which may include such electrical construction common practices as having to go up to a ceiling space or down to in-slab conduit before traveling across a room to connect two electrical components. Conduit size is from the subset the user has decided to make available to the system for use on this project from all those available from manufacturers and distributors, for example 0.75" or 1". Conduit type is the material the conduit is comprised of like Conduit size and type are selected by the system in compliance with electrical standards like maximum conduit fill percentage, and user parameters like minimum conduit size for home runs. Wire sizes are the subset the user has decided to make available to the system for use on this project from all those available from manufacturers and distributors, for example #8 or #12.

The determining of wire size complies with electrical requirements to ensure that conductors are of sufficient size to carry the maximum current that they may need to carry over the longest distance they travel and in the environment they will be installed into. Over and above such standards, user specified parameters are also factored into wire size selection by the system. For example, the wire size is selected to meet the largest requirement amongst: the minimum wire size according to the protection size associated with each circuit, a user-specified minimum size, or so as to not exceed specified maximum voltage drop.

i) Determine and place home run identifiers at the home run location (230). Although there are a number of styles of identifying the home run location that can be used, one example is with a home run arrow and home run text annotation. The home run arrow indicates the home run location by its tail end and the direction to the serving panel by its arrowhead. The present system can also simply not add home run identifiers at the home run location if the design environment is one wherein such elements are not desired to be part of the design. In such case, the home run information will reside purely as data associated to the electrical components and branch circuit wiring elements in the design and/or in a database of information related to the design.

Home run text annotation details, for example, the wiring medium for the home run (e.g. conduit and wire or cable), the conduit size or cable specification as applicable, the number and size of wires, and the circuits involved in the home run.

In a building information model environment, the system may instead draw the 3D routing for the home run conduit/wire/cable along the proposed path of connection in a size representative of the connecting medium rather than terminating the representation at the home run location as is commonly done for 2D construction floor plans.

j) Annotate electrical components and branch circuit wiring elements as desired in the design (240).

There are a variety of options that the system can proceed with in annotating the design with branch circuit wiring related detail. For example, the branch circuit wiring lines may be annotated with wire count symbols to indicate wire quantity and general purpose (see 513 of FIGS. 11A-D, 12A-D, and 13A-D). Wire count symbols or other markings placed by the system on the interconnection lines can follow any number of styles. For example, a wire count symbol may comprise a visual representation of the quantity of hot wires (short line), neutral wires (long line), and/or grounding/bonding wire, where applicable, (diamond or block at end of symbol) in a particular interconnection between two components.

The present system can also simply not add branch circuit wiring annotation if the design environment is one wherein such elements are not desired to be part of the design. In such case, the branch circuit wiring information will reside purely as data associated to the electrical components and branch circuit wiring elements in the design and/or in a database of information related to the design.

As a result, the present system is capable of providing a complete branch circuit wiring design 900 and can produce such outputs as detailed electrical engineering drawings, a building information model, and reports like the Bill of Materials (1006 in FIG. 1), and/or branch circuit panel schedules (see FIGS. 9 and 10).

More specifically, the complete branch circuit wiring design 900 produced by the present system comprises any of the following required by the user: connection routing linework within a home run group, wire count symbols to visually indicate the number of wires in each interconnection, home run arrows from home run locations, home run annotation to visually display wiring method/sizes/counts/circuits, home run connection 3D route to serving panel, and finally hidden data and/or associated database data to detail the uses of the wires in each interconnection and the present system calculated vertical+horizontal distance for each interconnection and home run. Users can manually create their own branch circuit wiring data or manually modify any of the automatically created branch circuit wiring data using tools provided in the computer application.

It is understood that a computer system implements application software for practicing the present system, wherein the computer system comprises a computer processing means including digital input and output means for receiving and writing/transmitting digital information. Further, the client workstation provides hardware and software processing means capable of interpreting, reading and writing drawing information files, including databases and CAD/building model files.

The computer processing means can be local or remotely located from a client access terminal.

It is contemplated that the present system is complementary to and may be used in combination with known design software packages such as, for example, computer assisted drawing (CAD) and/or building information modeling (BIM) software packages, known as AutoCAD and Revit, respectively (Autodesk Inc. of San Rafael, Calif.; Microstation from Bentley Systems, Incorporated of Exton, Pa., United States). It is further understood that the principles of the present system may also be applied in other disciplines.

Automated Service Device Selection, Placement, and Interconnection

Given a circuited electrical design including circuited electrical components and their serving branch circuit panels (and other load serving service devices like motor control centers) but not necessarily any or all required service devices that function in the distribution of power, the present system is capable of selecting, placing, and interconnecting the service devices required to distribute power to the branch circuit panels, other load servicing service devices, and distribution-only type service devices that have not been connected through to the main distribution (hereafter referred to as 'unfed service devices'). The present system can work with a design that only has branch circuit panels and other load servicing service devices, i.e. needs all distribution-only type service devices, or can work with any degree of partially to completely done design of distribution-only type service devices. Service devices selections by the present system are based on the load requirements of the unfed service devices of the circuited design, electrical standards, industry standard practice, and user parameters.

The present system first determines: the electrical rooms within the project, either by the electrical rooms previously being labeled as such or user indication; a total load for each unfed service device; the load type for each of the unfed service devices (e.g. regular service, life safety emergency service, etc); and any other necessary information like the phase, voltage, and grounding requirements of each of the unfed service devices. Given this, the present system can select the necessary service devices to complete electrical service to each of the unfed service devices, determine optimal locations to place the required service devices, and finally interconnect the required service devices to each other and the previously unfed service devices as required to feed all service devices in the project. The present system is capable of handling special load calculation situations, for example suite load derating for multi-dwelling residential projects.

Once the service devices required to feed power have been selected, placed, and logically associated, the present system can determine the details of each interconnection. At the user's discretion, this can occur when service devices are in place to feed the entire project or when only a portion thereof is complete. The present system begins by determining the total load for each service device as calculated recursively from the logical relationships between the service devices and beginning with the known loads from the circuited electrical components. Given the load and applying electrical standards, industry standard practice, and user parameters the present system automatically selects the protection type, protection rating, and electrical bus rating as applicable for each service device. Given the selected protection, the present system will then select conductors, conduit, and bonding/grounding as applicable between each connected service device. Such selection will take into account all required factors such as voltage drop, ambient temperature, conductor congestion, etc. Given the conductor, conduit, and bonding/grounding selected, the present system will select a route for each interconnection. Note that the present system will use the common wire and conduit method of interconnecting service devices or other methods, bus ducts for example, as specified by user parameters.

In order to ensure that users of the present system can express their design expertise, the present system allows for users to override any of the interconnection details. In the case where an override has been specified, the present system will use that override value as the basis for other calculations that rely upon it, i.e. the user specified override completely integrates into the present system's automation in lieu of what the present system would have calculated for that value.

The specifics of the routing created by the present system for any particular interconnection may differ based on the design environment. For example, the user may be working in a '2D construction documentation only' environment versus a 3D building information modeling environment. Consider the interconnection between a branch circuit panel and the central distribution panel it connects to two floors away. For construction plot purposes, the style of interconnection produced by the present system may be a simple undrawn logical relationship documented purely as a relationship between the devices. In such case, the present system will still calculate a distance for the interconnection by virtualizing a 3D path between the service devices. In a 3D building information modeling environment, however, the style and route of interconnection produced by the system will match the actual 3D routing of the conduit/wire/cable used for the interconnection and represent the size of the material used (e.g. 0.922 inches outer diameter for a typical brand of 0.75 inch EMT conduit). Such 3D routing in a building information modeling environment will typically be shown for the complete travel of the connection between the service devices. In summary, the design environment and user preferences determine whether the interconnections between service devices are drawn or represented purely logically. Regardless of this, the present system always calculates an accurate distance for each interconnection as the distance that the conductors must travel is a vital part of determining conductor size, fault levels, and other such needs of a complete circuited design.

Given the interconnection details and the fault current value supplied by the electric utility to the project, the present system will determine the fault level at each service device and thus the minimum fault rating of protection for each service device and any branch circuits circuited to the service device. In cases where the electric utility does not specify a fault current for the project, the present system provides the user with a variety of methods of providing sufficient information for the present system to make a reasonably accurate determination of the utility fault current, for example by using the specifications of the utility supply transformer.

Given a partial or complete service device design included in the circuited design, the present system can completely automatically generate a variety of reports, schedules, and diagrams. For example, panel schedules, single line diagram, and a fault levels schedule.

All service device related data generated by the present system above can be contained in the design itself, i.e. as data on the service devices, in a database associated to the design, or both. In some design environments, the present system will not annotate the design as such annotation is not held within the design environment.

Automation of electrical circuiting, automated service device selection-placement-interconnection, automated branch circuit wiring, or combinations of the three can result in significant reductions in design time, significant reductions in design cost, optimization of electrical circuit grouping, optimization of home run grouping and branch circuit wiring routing, and minimization of material use with the resulting savings associated therewith. Further, the present system can prepare electrical engineering drawings and schedules including branch circuit wiring and materials counts of branch circuit wiring where, in many instances, branch circuit wiring would be excluded due the very material time to determine and draw branch circuit wiring, overwhelming options, and labor cost for completing branch circuit wiring, to say nothing of the vastly increased opportunity for error where people are making the myriad decisions required to determine and draw branch circuit wiring.

EXAMPLE

The process of the present system was applied during the design and construction of a one level school using the Canadian Electrical Code from among the various electrical codes supported by the present system. With reference FIGS. 5, and 6, the end user loaded an engineering drawing 500 having at least one electrical component and the appropriate set of parameters for a school in Canada was applied to the project.

In preparation for automated circuiting, the project is divided into service areas either by the user based on how they desire circuiting to service the electrical components; by the present system automatically through application of service area-pertinent: electrical standards, industry standard practice, and user parameters; or through a mix thereof. Each service area can further be divided into one or many subareas, by rooms for example. Service areas are also designated with a type so that automated circuiting knows whether to separate different component types onto different panels (regardless of voltage compatibility) or to attempt to service different component types from the same panel if they are voltage compatible.

Figure 6D:
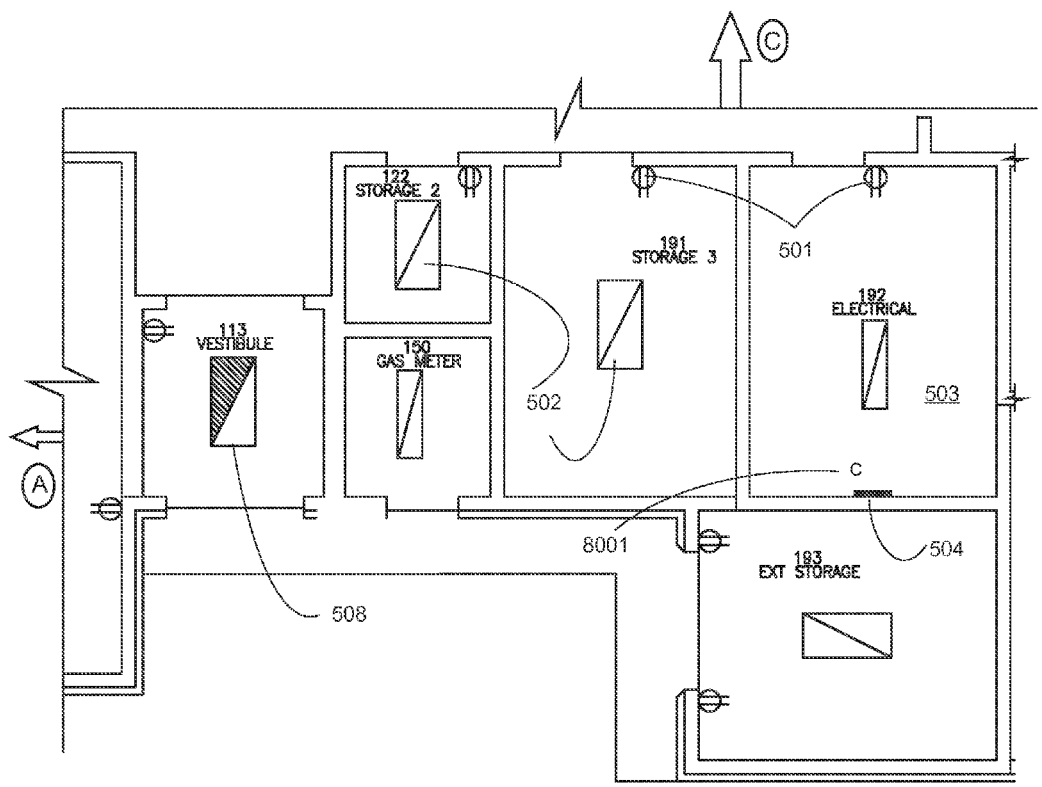
FIG. 6D is quadrant D of FIG. 6.
Figure 17:
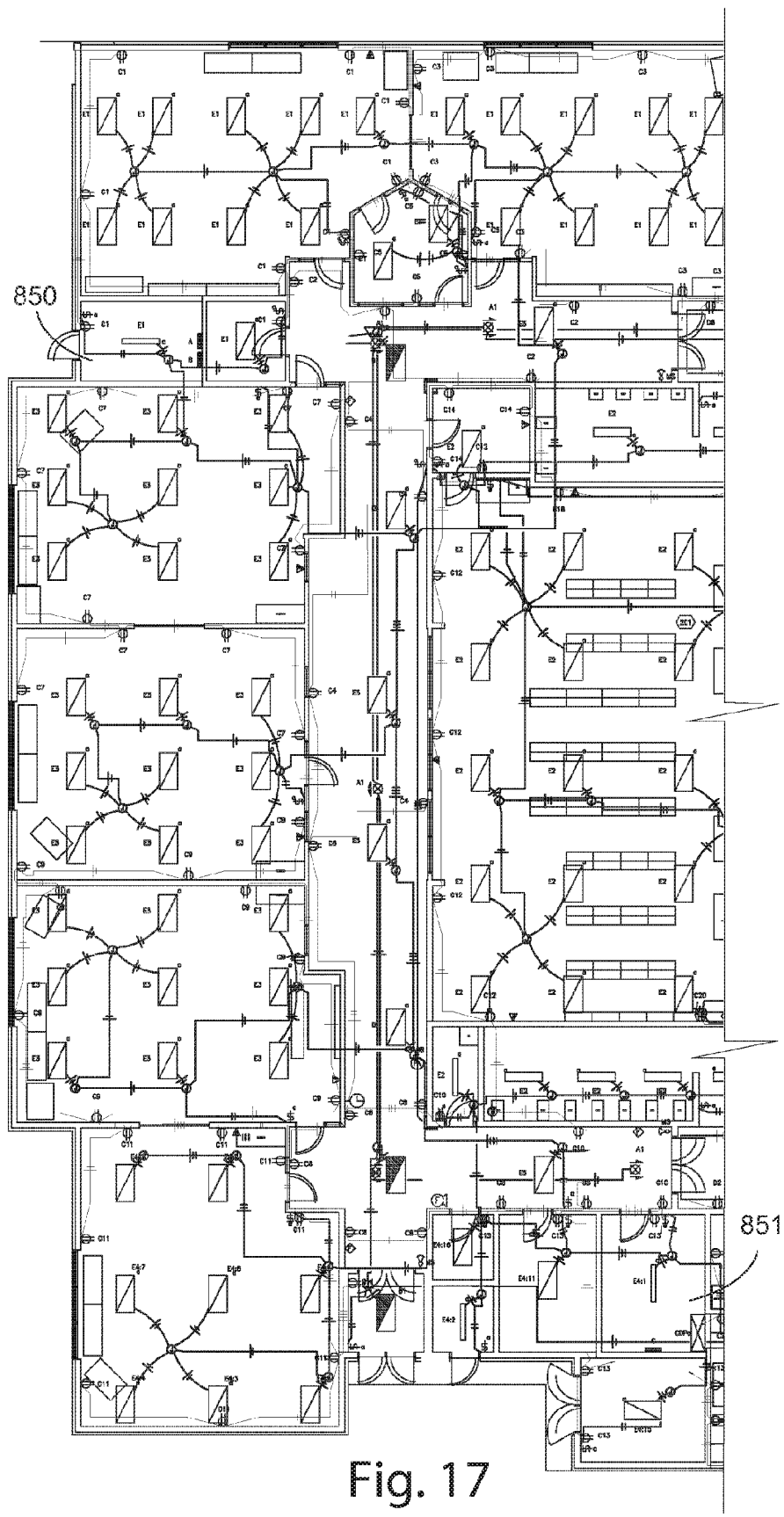
FIG. 17 is a high level overview that includes the area of FIG. 4 and additional area of the project, wherein an embodiment of the application has been applied for auto-circuiting and branch circuit wiring interconnections for the entire selected area (no home runs are shown)
Figure 18:
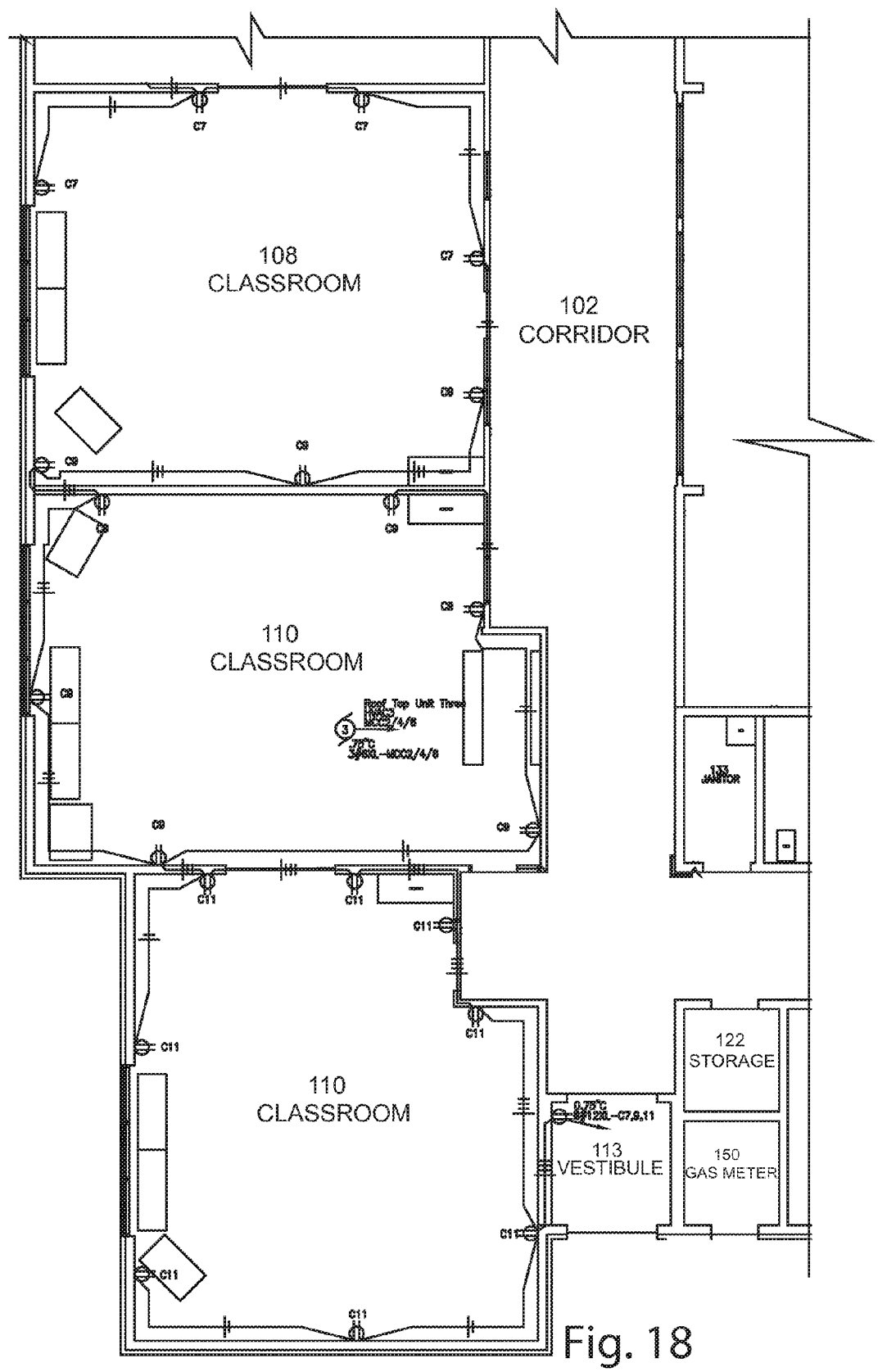
FIG. 18 is the branch circuit wired design of a portion of the area shown in FIG. 4 selected to show receptacle and motor electrical components, branch circuit wiring interconnections, and branch circuit wiring annotation of the home run grouping of receptacle circuits C7, C9 and C11 and the motor HVAC3 which is home running from its location as the single electrical component in its home run group.

In our example, the user opted to manually select service areas. They first selected the entire building footprint as a lighting service area since the 277V lighting won't be materially affected by voltage drop in this small project due to the higher voltage. This regular lighting-related service area is assigned to a panel room outside the area of our figures. In addition, several light fixtures are emergency powered (508 in FIG. 6D for example)—their service area can be left as with all the other lighting (they will still circuit to an emergency power panel in the shared panel room), or, as in our case, the user assigned a meta type service area for emergency powered electrical components in the entire building footprint to a panel room in the NW of the partial floor plan (see small room 850 in NW of FIG. 17). Finally, the user in this example assigned all rooms from FIG. 17 as a power service area to the 192 Electrical Room as a panel room designated area (851 in SE FIGS. 17 and 503 in FIG. 6D). 'Power' service areas include receptacles and like electrical components such as heaters, direct load junction boxes, and small motors. All of the lighting, emergency, and power service area assignments made in this example utilize the room boundaries as the subareas of each of the service areas.

After setting up for automated circuiting, the user executed the automated circuiting process. The first step of such process is loading, from the database, the circuiting-pertinent: electrical standards, industry standard practice, and user parameters. One of the most important of these is the size of protection to use for 'power' circuits, 20 A in this case which is the current NEC standard for such circuits. Next the service areas selected by the user for execution are sorted into an execution order and the first to be done has any subareas sorted into an execution order—this repeats for each service area. Automated circuiting proceeds through the process detailed in this patent, placing branch circuit panels and circuiting electrical components within the service areas to those panels. Branch circuit panels A and B were placed in the emergency service area's panel room (850 in FIG. 17) to service 120V emergency lighting (panel A) and 277V emergency lighting (panel B). Branch circuit panel C (8001/504 in FIG. 6D) was placed in 192 [0200] [0203] Electrical Room (851 in SE FIGS. 17 and 503 in FIG. 6D) to service receptacles on the west side of this building. Branch circuit panel D is placed in a different location outside the area pictured in our figures to service receptacle-like electrical components in other areas. Note that it is likely that an electrical designer would have further split the receptacle-like electrical component service area to have the branch circuit panel for the Northern half of the receptacle-like electrical components serviced from a closer branch circuit panel. As it is, those electrical components will likely be affected by voltage drop for their 'C' panel service and thus have their wire sizes upsized somewhat during the automated branch circuit wiring process to deal with such voltage drop.

In detail regarding the assignment of circuit C11 (506) to electrical components in 111 Classroom (FIGS. 7 and 8A), the system started circuiting receptacle-like service type electrical components for the 'power' service area having a designated panel room of 192 Electrical Room (851, 503) in the subareas furthest from the panel room. By the time that the circuiting process had traveled via 'shortest path no crossovers' to Classroom 111 and its two Northern neighbors (Classroom 110 in FIG. 8B and its immediate Northern neighbor) circuits C1 thru C6 were already assigned). Since panel C is a three-phase 120/208V panel, automated circuiting attempts to assign in ABC phase groups, so C7/9/11 are the next group to be used. The exact order of the electrical components using the circuits of the phase group are determined by a number of factors including, for example, the relative location of the electrical components (closer is better) and the current state of load on the phases of the parent panel (balanced load is better). Circuit C7 was used to service the immediate Northern neighbor of Classroom 110 but could not service at least half of Classroom 110 (other neighboring rooms were already circuited) with any remaining capacity and was thus deemed finished regardless of whether its 1920 max wattage (before user maximum usable requirement) is used up. This wattage is calculated as:

$$20 A*120V=2400 W*80\% \text{ building code limit}=1920 W*\text{user maximum usable \% which is typically } 100\% \text{ to } 80\%.$$

Circuit C9 was used to service Classroom 110 but could not service at least half of Classroom 111 (other neighboring rooms were already circuited) with any remaining capacity and was thus deemed finished. Circuit C11 was used to service Classroom 111 and had sufficient remaining capacity to service at least half (in this case, all) the receptacle-like components in neighboring 113 Vestibule thus the receptacle in that room was also assigned to circuit C11. At this point, however, C11 has either achieved maximum usable wattage or has insufficient wattage capacity remaining to service any of the further neighboring rooms so is deemed finished. For each of these circuit assignments the path of circuit assignment was done by following the room perimeter since these electrical components are wall mounted. This method of optimally organizing circuit assignment is more evident in larger spaces which must be serviced by more than one circuit.

With references to FIGS. 7 and 8, with automated circuiting now completed, the receptacles 501 and the lighting components 502 in each asset was circuited and assigned to a specific circuit. As shown in FIG. 7, receptacles 501 in classroom 111 were assigned to circuit C11 while the lighting components in classroom 111 were assigned to circuit E4.

FIGS. 9 and 10 show Panel C and Panel E respectively, each showing the various specifications of circuits C11 and E4, although these particular examples of panel schedules were generated for a one floor school using the National Electrical Code (NEC) standards rather than the Canadian Electrical Code (CEC) as cited in other parts of these examples.

Upon completing automated circuiting, the process was ready to proceed with branch circuit wiring: grouping circuits together into home run groups, interconnecting all the devices within each home run group, placing home run arrows and home run annotation for the home run groups to their respective home run locations, calculating and annotating vertical+horizontal distance for each interconnection and home run, and determining and populating data to detail wire types+sizes+quantities for each interconnection and the home runs.

In the first step of automated branch circuit wiring, the end user loaded an engineering drawing (e.g. a portion of that as represented by FIGS. 7, 8A-D) including at least one circuited electrical component and it's serving panel. The appropriate set of branch circuit wiring-pertinent electrical standards, industry standard practices, and user parameters for a school in Canada were applied to the project and loaded.

Next, the user identified which circuits they desired automated branch circuit wiring to be applied to. This could have been one, many, or all. In this case, 'all' was selected. The automated branch circuit wiring process located all electrical components in the identified circuits and their serving panels and applied the loaded control data and expert system logic to group each circuit into a multi circuit home run group composed of one or many circuits. Receptacle circuits C7/9/11 were grouped as a home run because: the circuits are from the same side of the same panel, the user had indicated they desired a maximum of three circuits per home run group, the distance between these circuits was below the tolerance set whereas the distance to most other C panel circuits from the same side exceeded the tolerance, the group makes a preferred phase mix (i.e. one circuit each for A, B, and C phases), as a group the circuits do not exceed a radius test that prevents home run groups from circling too much around the panel (wastes conduit, wire, and labor if this happens), and other factors relevant to selecting home run groups.

Figure 14:
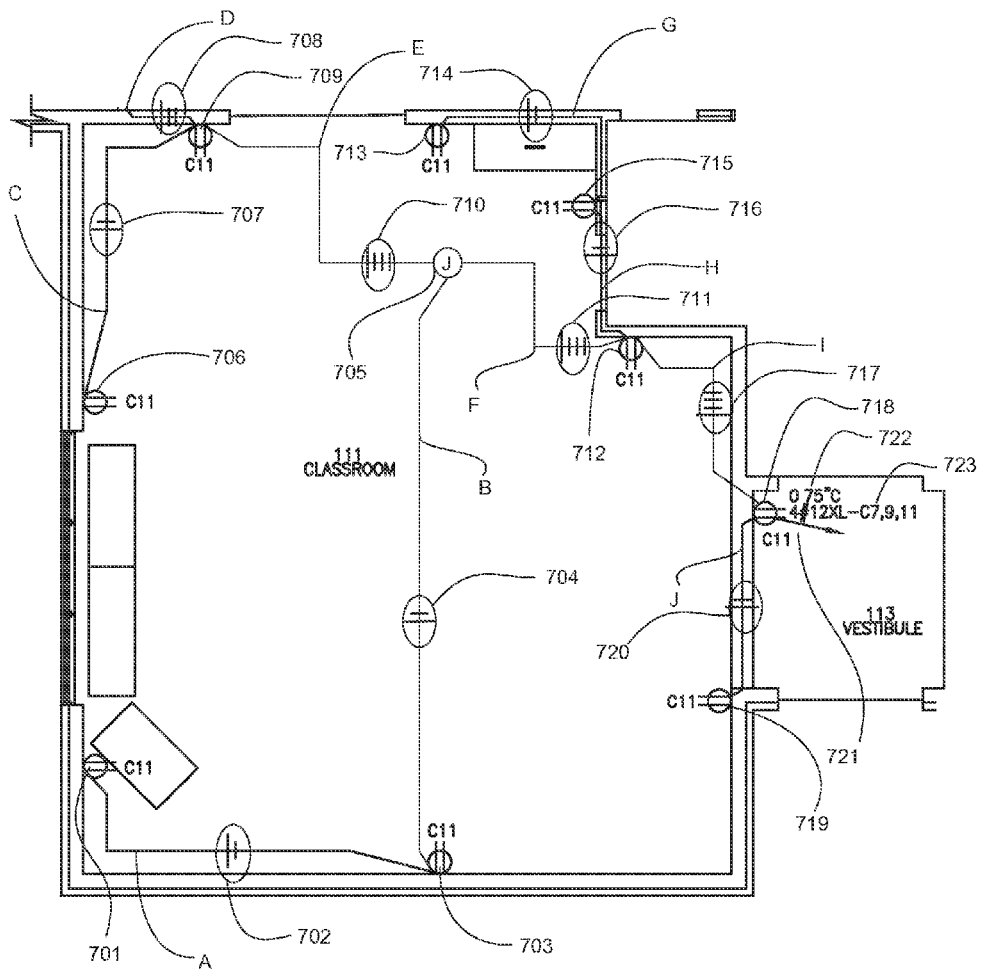
FIG. 14 illustrates the branch circuit wired design for the receptacles only in the exemplar classroom of FIG. 7, a conduit and wire type of branch circuit wiring interconnections being represented, and circuits C7 and C9 from neighboring asset/spaces joining the home run group with C11.
Figure 15:
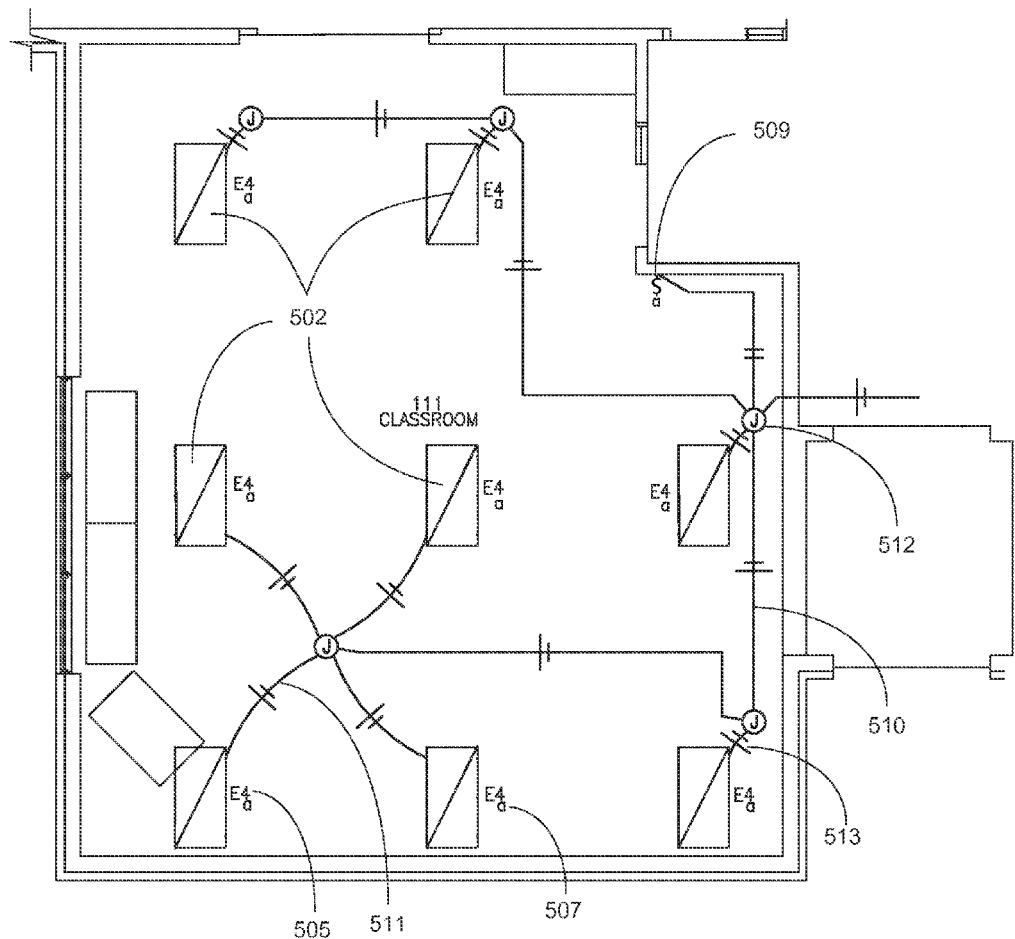
FIG. 15 partially illustrates the branch circuit wiring interconnections for the exemplar classroom of FIG. 7 (lighting only), a mix of conduit and wire and armored cable type of wiring being represented (no home run locations are shown)

Once C7/9/11 were selected as a home run group, automated branch circuit wiring placed additional electrical components as required. With particular reference to FIG. 14, circuit C11 is shown to be servicing the wall mounted receptacles of classroom 111. This particular instance of classroom 111 has been modified to demonstrate the inclusion of an overhead junction box in addition to in-wall conduit and wire as per the other examples of classroom 111. Electrical components like this 'wire-splice location only' junction box (i.e. does not represent any electrical load) are placed as needed by automated branch circuit wiring to meet applicable requirements of the electrical standards, industry standard practice, and user parameters.

After any additional required electrical components were placed, automated branch circuit wiring determined the home run location. Referring to FIG. 14, receptacle 718 was selected as the home run location since it was the closest electrical component of the home run group to the serving panel that was also eligible by electrical component type to be a home run location. Note that the process could have been directed by the user, for example, to instead use only (or at least prefer) junction boxes as home run locations rather than any electrical components in which case circuits 7/9/11 may have used junction box 705 as a home run location instead of receptacle 718.

We will now detail the travel and wiring decisions of the process in this instance of classroom 111. Although final determination and population of data about the conduit, wires, and cable traveling each interconnection is typically made once the interconnections are all finalized, herein we will describe such information as we go for the sake of clarity. Branch circuit line A connects receptacle 701 at the southwest corner of the classroom to receptacle 703 on the south wall. Although the line is shown outside the wall, designers and contractors know the wire is in the wall as it follows the path of the wall. In this case the system is drawing branch circuit wiring linework in compliance with industry standard practice format for construction drawings. In a building information model environment, the system may instead route branch circuit wiring linework along the actual path of travel.

The process determines where to draw branch circuit wire interconnecting lines based on what electrical components are being connected, the distance the connection is being made, the branch circuit wiring medium specified by the user, and the other user and code parameters that affect branch circuit wire routing. The interconnections are best made with consideration for the total wiring distance and construction time for each home run group. Thus, for example, it is less wiring and construction time for receptacle 713 to connect in-wall to receptacle 715 rather than going up to the junction box 705, which is mounted on the structural ceiling.

In this example, conduit and wire have been used for the interconnects which can be seen from the straight lines that travel parallel or perpendicular to the room walls. Cable connections would be shown as arcs instead. The wire count symbol at 702 shows the reader that the wiring between receptacle 701 and receptacle 703 along line A comprises a single hot wire and a single neutral wire. Branch circuit interconnect B that goes up the wall from receptacle 703 and travels along the ceiling to overhead junction box 705 is a continuation of the same single hot wire and a single neutral wire as shown by wire count 704, since the same circuit is being serviced so no new wires are required.

Overhead junction box 705 does not add any load; it is merely a wire splicing location. The present system placed it at this location as a reasonable point for consolidating wiring from a couple groups of electrical components (i.e. receptacles 706+709+wire from neighboring room circuits as one group and receptacles 701+703 as another group).

There are another couple of connections to junction box 705. Branch circuit interconnect C shows the in wall path of one hot wire and one neutral wire, as per wire count 707, between receptacle 706 and 709. Receptacle 709 also has wires connecting to it from the classroom to the north as shown by in wall branch circuit interconnect D and wire count 708, which tells us two hot wires and a neutral wire come to or through receptacle 709. Wires shown coming to any particular electrical component via the branch circuit wiring interconnecting lines do not necessarily connect to the electrical component, they may just be passing through that location. An electrical designer or contractor knows from the circuit labels (C11) as to whether a particular hot/neutral wire connects or merely passes through en route to somewhere else. In this case, we can see from home run 723 that there are three circuits in this home run group so we know that the two hot wires coming on branch circuit wiring interconnect D are for circuits C9 and C7.

Branch circuit wire interconnect E goes up the wall and then along the ceiling from receptacle 709 to overhead junction box 705. From wire count 710 we can see that three hot wires and a single shared neutral wire travel through this conduit. These same three hot wires and single neutral travel along the ceiling and then down the wall to receptacle 712 as shown by branch circuit wiring interconnect F and wire count 711. Receptacle 712 is also where splicing of C11 hot and neutral occurs to service receptacles 714 and 715 through branch circuit wire interconnects G and H, as shown by wire counts 714 and 716.

From receptacle 712, the three hot wires and shared neutral wire as shown by wire count 717 travel in wall along the path shown by branch circuit wire interconnect I to receptacle 718. Receptacle 718 is also where the final member of circuit C11 joins to its home run group, i.e. receptacle 719 is connected with a single hot wire and neutral wire, as shown by wire count 720, along branch circuit wiring interconnect J.

Figure 22B:
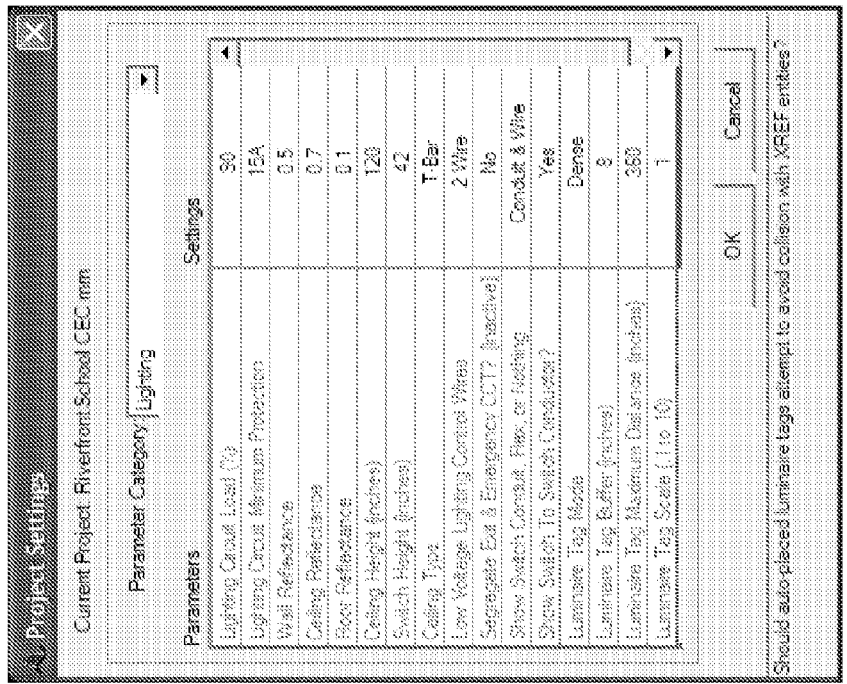
FIG. 22B is example of a computer application dialog for illustrating sample parameters for components such as lighting.
Figure 22A:
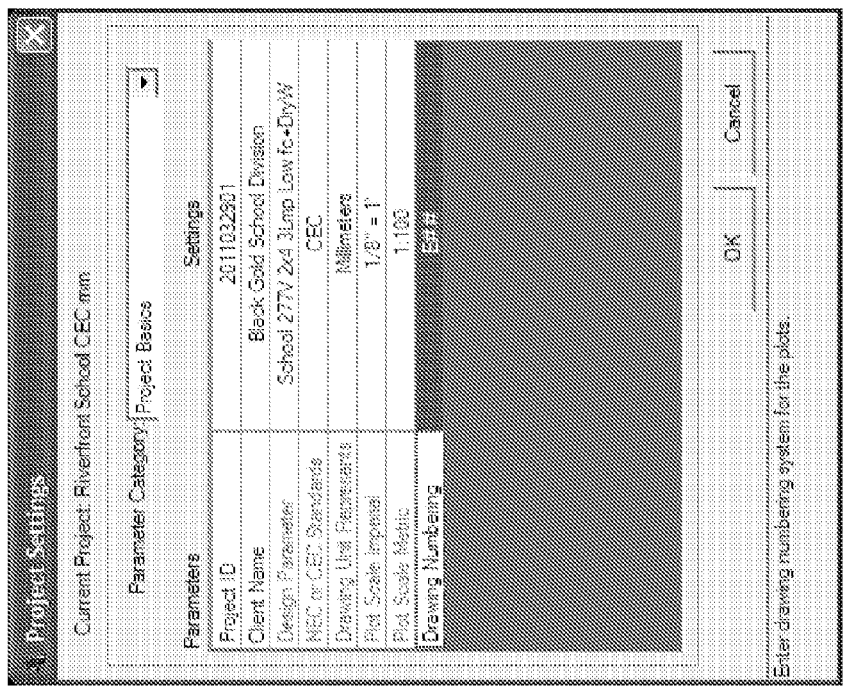
FIG. 22A is an example of a computer application dialog for illustrating sample parameters for a client project.
Figure 22F:
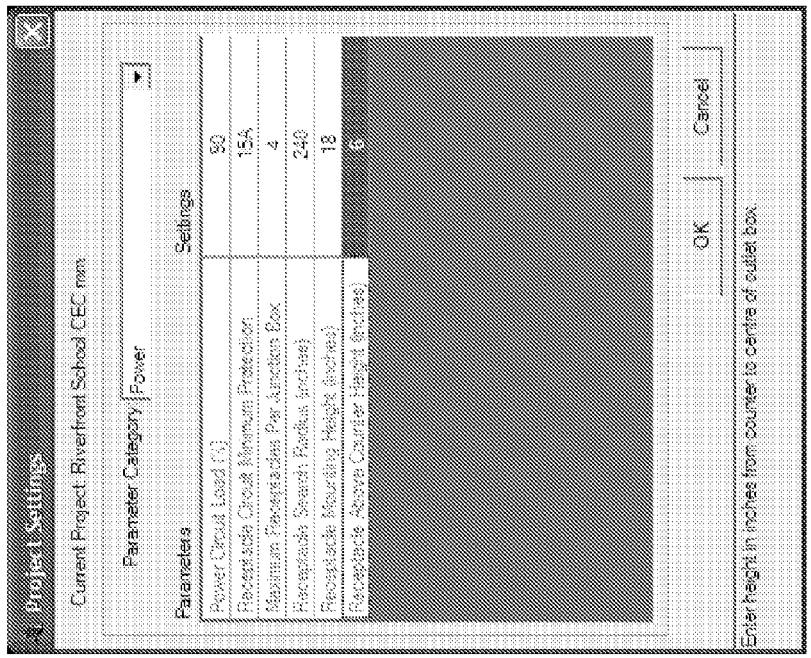
FIG. 22F is an example of a computer application dialog illustrating sample parameters for components such as receptacles, referred to as the power system.
Figure 22E:
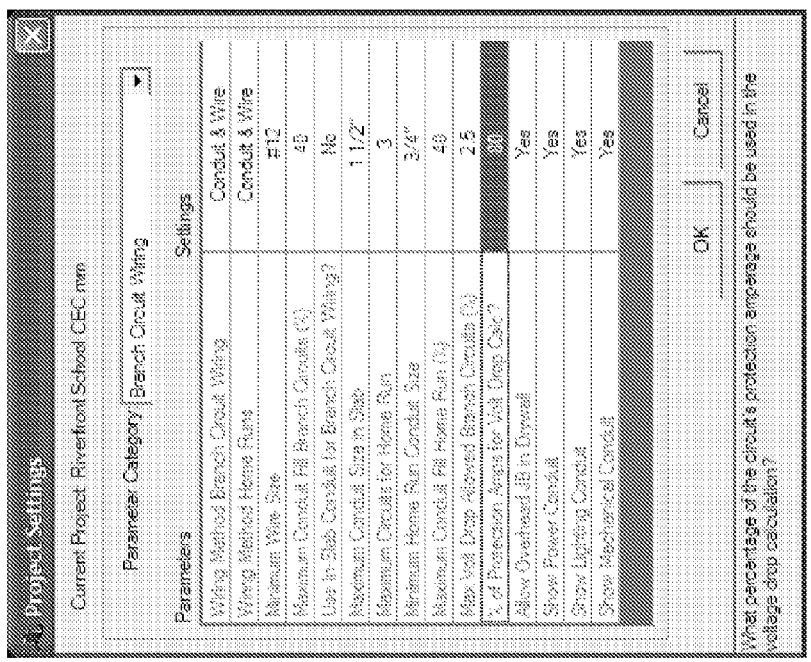
FIG. 22E is an example of a computer application dialog for illustrating sample parameters for branch circuit wiring.

The final steps of automated branch circuit wiring are for automated branch circuit wiring to:
  a) Determine the specifications and populate data about the conduit, wires, and cable traveling each interconnection. In each case, the resultant specifications can be written by the present system to: the electrical components and branch circuit wiring elements (e.g. interconnecting lines and home run arrow/text) themselves, this is typical in a CAD environment; to a database associated to the electrical components and branch circuit wiring elements (typical in a building information model environment); or to a combination thereof.

a.1) Determine the number of wires required for each interconnection, which occurs as described above for the hot wires for receptacle circuits C7/9/11. There are no wire types other than the neutral to be determined for receptacle circuits C7/9/11 (unlike for line voltage switch lighting which would involve switch to switch and switch to light conductors) the present system continues to the next step.

a.2) Determine neutral wires required based on whether neutral sharing is allowed and whether a neutral wire is required for each circuit in consideration. Since the circuits are all different phases and none of the circuits was set up as requiring separate neutrals nor meets any electrical standard or other decision factor that would make a separate neutral required, circuits C7/9/11 are specified by the present system as sharing a neutral wire (see FIG. 8 center column wherein 7=A, 9=B, and 11=C).

a.3) Determine bonding/grounding requirements and meeting such. Whether or not a bonding conductor is required is determined by the present system by applying pertinent electrical standards, industry standard practices, and user parameters. In the case of circuits C7/9/11, the interconnections are running in metallic conduit, which serves in most situations as a conducting path to bond/ground to and there is no requirement in this particular case for a separate bonding wire—so the present system determines that no bond/ground wires are required for the interconnections and home run associated with circuits C7/9/11.

a.4) Size the wires/cable and select the type thereof. The wire size is selected as a function of a number of factors, including: electrical standard minimum wire size versus the protection assigned to the circuit on the serving panel, the effects of voltage drop based on the distance of the home run group members from the serving panel, user parameters for minimum conductor sizes, the number of conductors in each conduit run, the ambient temperature of the installation, and more. In this case, the wire size of #12 is selected due to all considered factors and applied to all interconnections where the wires for C7/9/11 travel. See the third parameter in FIG. 22E for an example of how a user parameter for minimum wire size for branch circuit wires may be maintained. Wire type is selected from all made available to the present system in the control database based on pertinent electrical standards, industry standard practice, and user parameters. In the case of wire for circuits C7/9/11, the typical copper XL type of wire is selected by the present system.

a.5) Select the conduit material and size the conduit, if the home run or any interconnections are running in conduit+wire instead of being fed from cables. In the case of receptacle circuits C7/9/11, electricity is provided via conduit+wires, so the present system does need to select a conduit size for each individual interconnection and for the home run. For these circuits, the number and size of wires are not large so the present system selects the user parameter minimum conduit size of 0.75" since none of the other conduit sizing factors the present system must consider required a larger conduit size. Maximum conduit fill is an example of one such conduit-sizing factor. Conduit type is selected from all made available to the present system in the control database based on pertinent electrical standards, industry standard practice, and user parameters. In the case of conduit for circuits C7/9/11, the user preference of EMT type conduit is selected by the present system since there are not any electrical standard or industry standard practices that give reason to override the user preference expressed in the user parameters.

b) Place home run identifiers. There are different styles that the present system can follow in identifying home run locations and annotating the specifications of the home run. In the case of our example, automated branch circuit wiring places a home run arrow 721 and home run text block 722+723 to show the home run location 718, the conduit size 722 (0.75"C), the wire count home running to the serving panel 723 (4#12XL), and the circuits involved in the home run 723 (C7, C9, and C11).

c) Place annotation. There are different styles that the present system can follow in annotating the electrical components and branch circuit wiring elements (e.g. interconnecting lines). In the case of our example circuits C7/9/11, the intended output of the design is for construction plans so automated branch circuit wiring annotates each branch circuit wiring interconnection line with a wire count symbol of a style where a longer line is used to indicate the presence of a neutral wire and a shorter line is used to indicate the presence of a hot wire.

With particular reference to FIGS. 12A to 12D and 15, circuit E4 services the lighting components in classroom 111, while circuit E3 services the lighting in classroom 110 north of classroom 111. Lighting circuits E2 and E5 service the lighting in the portion of the building east of classroom 110 and lighting circuit E4 also services that portion of the building east of classroom 111. Home run locations, arrows, and annotation are not shown as these circuits gather with others from the same side of the panel (i.e. E2, E4, and E6 or E1, E3, and E5) and home run from elsewhere in the complete building electrical systems design (not pictured in figures provided with this patent application).

Continuing to refer to FIGS. 12A to 12D and 15, fluorescent fixtures commonly consolidate wiring to shared ceiling mounted junction boxes 512 using cable 511 shown as arced lines. This is an example of a engineering practice coded into the present system that overrides the general specification that a user may have made for using 'Conduit and Wire' on an execution of automated branch circuit wiring. The present system accommodates for such conflicts between user parameter selections, electrical standards, and industry standard practices by executing the highest priority directive, wherein electrical standards hold the highest priority.

Figure 16:
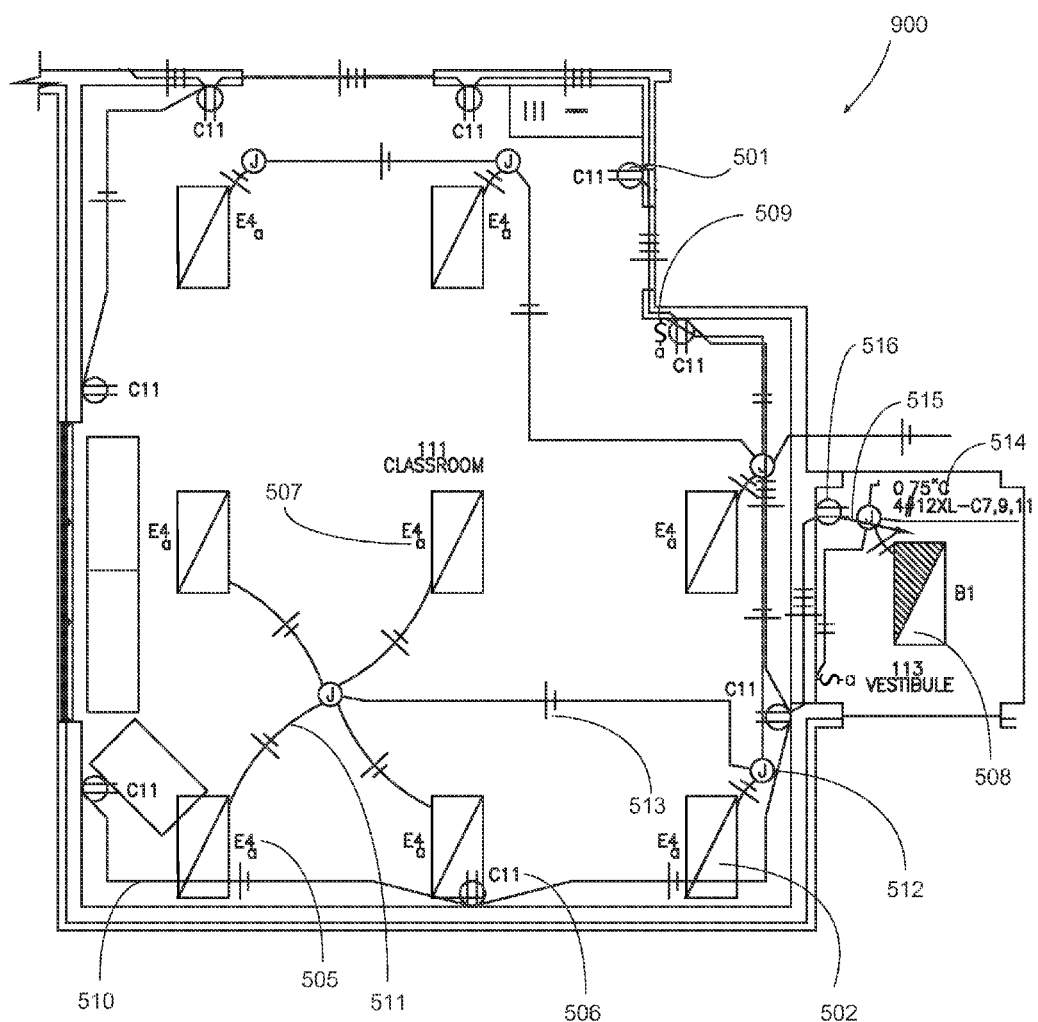
FIG. 16 illustrates the branch circuit wiring interconnections for the exemplar classroom of FIGS. 14 and 15 with both the receptacles and lighting depicted.

As best shown in FIG. 16, after branch circuit wiring has been performed on all the services, including for example receptacles, lighting and mechanical, a complete building electrical systems design, in this case a CAD drawing 900, is produced which illustrates the home run grouping and branch circuit wiring for the various circuits. This drawing 900 can help field installers calculate the amount and types of conduit, wiring, and cable needed as well as providing sufficient information to allow for a 'labor to install' estimate, thus allowing an estimator to generate an accurate estimate of costs for the complete building electrical systems design.

With reference to FIGS. 25A thru 25C, detailed bills of materials can be completely automatically generated for more accurate project cost estimates without the user having to consolidate this data manually from the completed design, which would take immense person hours to do. The Bill of Materials in these figures is an example of what the present system can generate for a typical small one-floor school designed in compliance with the Canadian Electrical Code. The materials included are for the branch circuit wiring, the service device feeders, the electrical components, the service devices, and for the quantities of each rating of protection installed on each service device (with fault levels assigned).

Automated Service Device Selection, Placement, and Interconnection

In one example method, the present system can select, place, and interconnect distribution devices necessary to fed power to unfed service devices in the project. The present system can subsequently calculate protection and feeder specifications by compiling the load beginning from the branch circuit panels, through the various distribution devices and to the main distribution panel. Using the total load, the protection for each component, and feeder specifications (such as conductor type/size, conduit use and bonding/grounding conductors employed between each component or service device), schedules using the specifications for the protection and feeders can be produced such as panel schedules, single line diagram, and bill of materials.

Figure 26A:
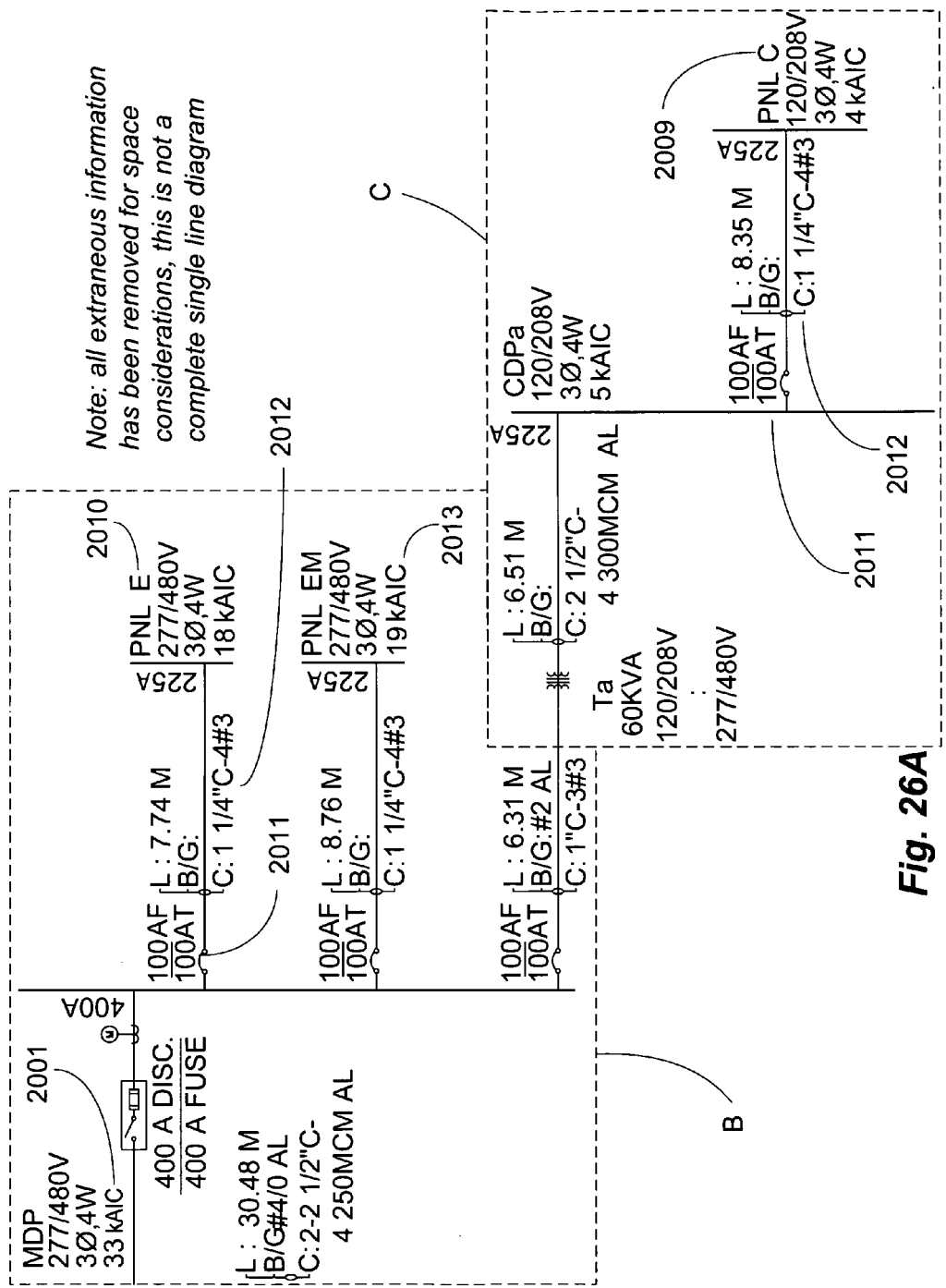
FIGS. 26A thru 26C illustrate one style of diagram that the present system can automatically generate to show the main service, distribution devices, large motors, and branch circuit panels and their relationships and interconnection specifications schematically. This particular schematic representation is called a single line diagram.
Figure 26B:
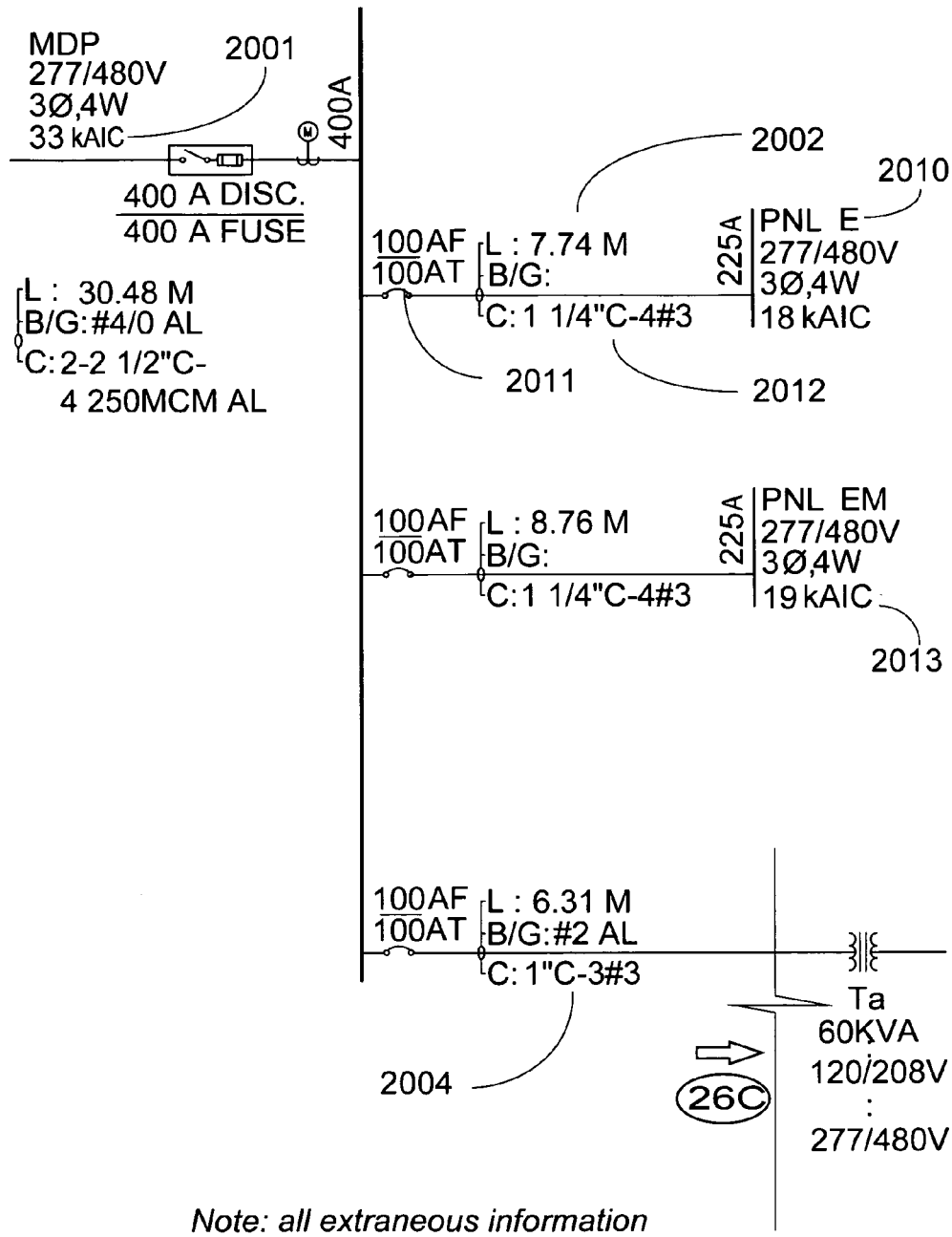
Figure 26C:
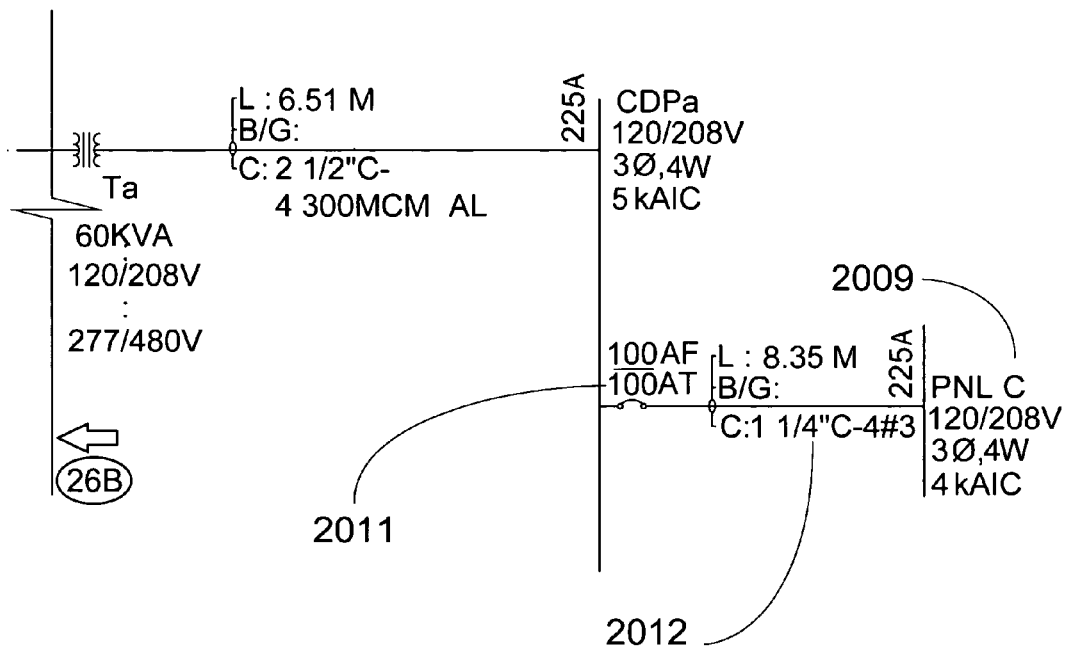

In our prior examples in FIGS. 26A-C, there are only the branch circuit panels resulting from the automated circuiting process and no other service devices. A particular category of service device, commonly called distribution devices, are needed to feed power to these branch circuit panels. The present system searches the project for unfed service devices and finds branch circuit panel C (120/208V) and E (277/480V) along with another number of unfed branch circuit panels. Prior to executing the service device automation process, the user had indicated which room or rooms in the project are to serve as eligible locations for distribution devices (typically electrical rooms). The user also indicated in the parameters that lower voltage service devices are to be consolidated to a central distribution panel in the main electrical room. Since the user has indicated that the main service for this project is to be 277/480V, the present system determines that a transformer is required for panel C, and given the central distribution consolidation user requirement, such transformer will go between the central distribution panel and the main distribution panel. Since the project is small, i.e. distance from the branch circuit panels to the electrical room housing the main distribution will not trigger material voltage drop and also there are not many branch circuit panels needing service, the present system opts to connect the voltage compatible branch circuit panels to the main distribution panel rather than including any intermediaries like central distribution panels. The present system first places a 277/480V main distribution panel (named 'MDP' by the present system) in the main electrical room. Panel E and all other voltage compatible loads are interconnected to MDP directly, while a suitably rated central distribution panel (named 'CDPa' by the present system) is placed to feed power to 120/208V panels in the project. A transformer (named 'Ta' by the present system) is added near CDPa and then CDPa is interconnected to transformer Ta. The present system then interconnects transformer Ta to MDP. Finally, panel C and all other 120/208V branch circuit panels in the project are interconnected to CDPa. The present system has completed the selection, placement, and interconnection of all required distribution devices to feed power to all service devices in the project.

With the total load and various interconnection service devices known, the present system can determine the protection requirements for each service device in the project.

For example, referring to our receptacles panel C (2009) from prior examples in FIGS. 26A-C and lighting panel E (2010) in FIG. 26A, B, the protection size for both were selected by the present system based on the user parameter for minimum panel protection of 100A. See the second parameter in FIG. 22D for an example of how this user parameter may be maintained. This is due to the consolidated load with safety factors and adjustments added in, as seen for panel C in FIG. 9 and panel E in FIG. 10 not exceeding the load which would require higher than 100 A protection to be assigned. The present system applies distribution device type specific logic along with project specific loads and user parameters to also select protection type, size, and bus size as applicable for the remaining service devices in the project.

The present system then determines the route for each service device interconnection in the project. In this particular project, the design environment is 2D AutoCAD and the project deliverables are construction plots. The present system thus virtualizes a 3D path for each interconnection in order to assign a distance to each. The route is not drawn in this case, as is common with projects completed in 2D AutoCAD for construction plots. If the design environment was 3D, a building information model environment for example, the present system would have drawn the 3D route that the connecting medium followed for each interconnection.

Referring to our example panel E, the user had indicated that it is serviced overhead rather than in-slab. The present system thus applies routing logic to determine that the interconnection between E and MDP will go from E, up to the ceiling, travel through the ceiling space to the electrical room that MDP is located in and then come down from the ceiling to connect to MDP. Thus the route and distance for the interconnection between E and MDP are determined by the present system.

With the protection rating and interconnection distance known, the conduit and wires for both panel C and panel E are selected by the present system as the same values to service 100 A protection from the Canadian Electrical Code (1¼" EMT conduit, with four #3 copper wires for the feeder, see 2012) as they are both based on the same protection value (100A trip value, see 2011) and neither needed wires and thus nor conduit to be upsized due to any of the pertinent electrical standards, industry standard practice, and user parameters that take part in such selection by the present system, such as voltage drop, conductor congestion, or ambient temperature.

With reference to FIGS. 26A and portions enlarged as 26B, C, the above example would result in a similar single line diagram.

Fault Level Determination

Figure 22H:
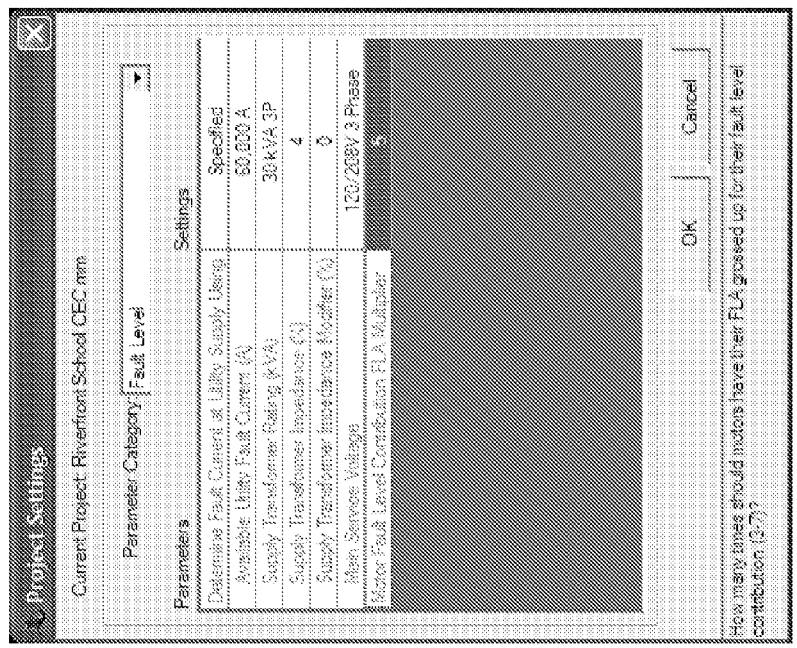
FIG. 22H is an example of a computer application dialog illustrating sample fault level parameters.
Figure 22G:
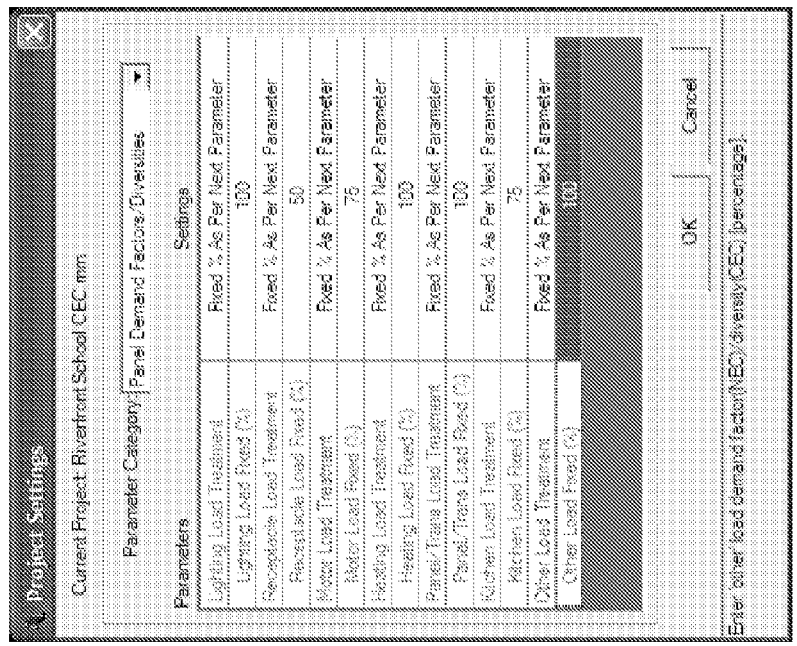
FIG. 22G is an example of a computer application dialog illustrating sample parameters for specifying panel diversities and demand factors.
Figure 22I:
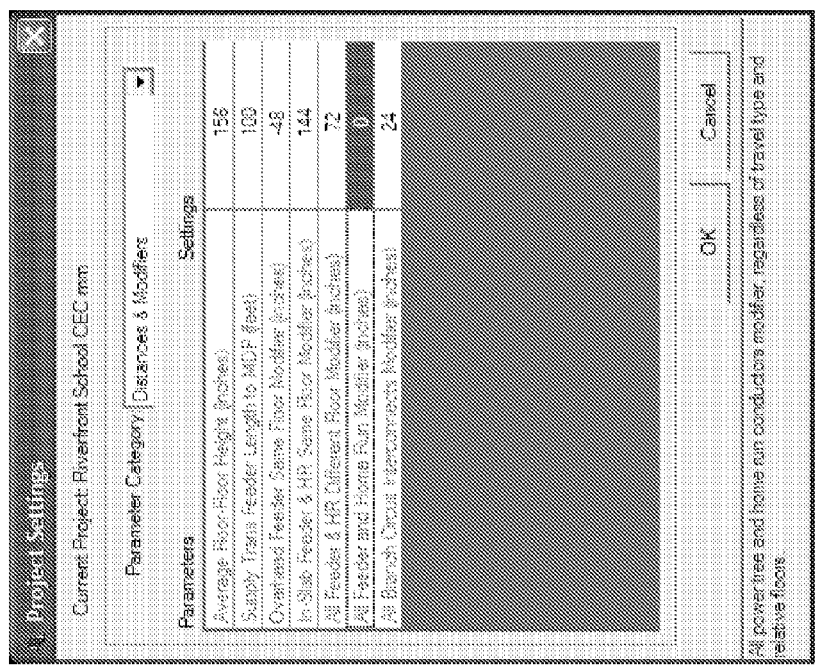
FIG. 22I is an example of a computer application dialog illustrating sample parameters for specifying user discretionary modifiers to be used during automated branch circuit wiring and to be used as distances in a project.

With reference to FIG. 22H, 26A and sections of 26A enlarged as 26B, C and specifically numbered elements 2001, 2002, 2004, and 2013, fault levels at each service device (e.g. located at 2001 for the MDP and 2013 for Panel EM and similar) can be calculated using feeder composition 2004, feeder length 2002 (calculated distance between each service device), calculated motor fault contribution and utility supply fault level as specified for example in FIG. 22H (or estimated utility supply fault level). The present system will calculate distance between service devices 2002, determine where motors occur in the project and how they will contribute to fault levels to service devices connected between the motors and the utility supply, load user specified utility supply fault levels information (see FIG. 22H), calculate estimated utility supply fault level if the user was unable to supply a value, and use feeder composition 2004, feeder length 2002, calculated motor fault contribution, and utility supply fault level to calculate fault level (e.g. located at 2001 for the MDP and 2013 for Panel EM and similar) at each service device in the project. The present system will populate attribute data, an associated database, or both for service devices to reflect fault levels and facilitate completely automated generation of schedules, diagrams, and reports related to fault levels including, for example, the Single Line Diagram pictured in FIG. 26A-C.

For example, refer to the user selection in the first parameter shown in FIG. 22H of 'Specified' which advises the present system to use the next parameter value of '60,000 A' as the utility fault current rather than the present system calculating a more approximated value from other information available when the utility is unable to advise the fault current value for the project.

Such value is used as the base value for the fault level calculations, which mainly go from utility supply down through the project's main distribution and then spread downward through the service devices of the project. Prior to performing these calculations that run from utility source down to the branch circuit panels that represent the end of the service devices, however, the present system first calculates any contributions from within the project, such as large motors that contribute to the fault current. These contributing calculations are stored on the system devices from the contributing point upward through the service device interconnections so that when the present system calculates fault levels from the utility supply down through the service devices such additional contributions are added.

In the example show in FIGS. 26A-C, to calculate fault levels at each point in the service devices, the present system uses the needed specifications, such as conductor specifications, which are results of the service device calculations from prior execution of the present system, user manual determination of service device specifications, or a mix thereof. Such results include contributions from inside the project, as calculated in the earlier portions of the fault levels calculations. The results of the fault levels calculation are stored by the present system as data on the system devices, in an associated database, or both. Such results are reported by the present system in automatically generated reports, diagrams, and schedules; as a fault study report or as part of the single line diagram, for example. In the example single line diagram (FIGS. 26A-C), the fault levels are reported along with all the other specifications of each system device as a kAIC value. The main distribution panel in this project has a calculated fault level value of 33 kAIC (2001), whereas panel EM has a calculated fault level value of 19 kAIC (2013).

We claim:

1. An automated process for the production of a circuited design in the context of building design, wherein the process comprises providing an electrical components design having a plurality of electrical components therein to a computer capable of receiving and processing same whereby the computer performs the automation:

Identifying and determining the location of the electrical components within the electrical components design;

Grouping the electrical components;

Selecting the electrical components to be circuited and the order in which the selected electrical components are to be circuited;

Adding the electrical components to at least one circuit; and

Producing a circuited design.

2. The process of claim 1, wherein the electrical components may be grouped by type, location or both.

3. The process of claim 1, wherein the selection and the order of the electrical components to be circuited may be by type, location or both.

4. The process of claim 1, wherein the electrical components may be added to the at least one circuit based upon the compatibility of the electrical components, the type of electrical components and the location of the electrical components.

5. The process of claim 1, wherein the adding of the electrical components to at least one circuit further comprises gathering of the at least one circuits to a place of service.

6. The process of claim 5, wherein the place of service may be a new or pre-existing panel.

7. The process of claim 1, wherein the adding of the electrical components to the at least one circuit is based upon one or more parameters.

8. The process of claim 7, wherein the one or more parameters may comprise one or more of: the maximum allowable circuit load, the voltage requirements of the plurality of electrical components, and the load requirements of the plurality of the electrical components.

9. The process of claim 1, wherein the adding of the electrical components to the at least one circuit further comprises phase grouping circuits to adjacent slots on a panel to balance phase loads and promote neutral wire sharing.

10. The process of claim 5, wherein the gathering of the at least one circuits to the place of service comprises determining the shortest route of travel to the place of service.

11. The process of claim 10, wherein the shortest route is determined without crossovers.

12. The process of claim 1, wherein the process automatically generates diagrams based on the circuited design.

13. The process of claim 1, wherein the process further provides automated identification information and annotation.

14. The process of claim 1, wherein the process further comprises:

Determining a total load for each of a plurality of service devices; and

Determining a conductor path and distance thereof between each of the plurality of service devices.

15. The process of claim 14, wherein the process further comprises:

Determining the service devices required, placing the service devices, and associating connected service devices.

16. The process of claim 14, wherein the process further generates diagrams for the plurality of service devices.

17. The process of claim 14, wherein the process further comprises:

Calculating fault levels at each of the plurality of service devices and generating various reports, schedules and diagrams representative thereof.

18. The process of claim 14, wherein the determination and selection is based upon industry standard practice and user preferences.

19. An automated process for the production of a branch circuit wired design in the context of building design, wherein the process comprises providing an electrical components design having a plurality of electrical components therein to a computer capable of receiving and processing same whereby the computer performs the automation:

Determining and identifying one or more circuited electrical components and at least one serving panel;

Grouping the one or more circuited electrical components into at least one home run groups in compliance with electrical requirements, industry standard practice, and user specified parameters;

Determining at least one home run location for each of the at least one home run groups or determining the home run group should have its connection to the panel completely represented;

Generating branch circuit wiring connections between the one or more circuited electrical components; and Producing a branch circuit wired design.

20. The process of claim 19, wherein the process further comprises:

Determining the shortest route to connect each of the one or more circuited electrical components in the at least one home run group to the home run location for that home run group.

21. The process of claim 19, wherein the process further comprises:

Identifying the at least one home run group and home run locations in the branch circuit wired design.

22. The process of claim 19, wherein the process further comprises:

Determining, wire usage, wire type, and conduit type for each connection between the one or more circuited electrical components.

23. The process of claim 22, wherein the determination of wire size complies with, industry standard practices, and user specified parameters.

24. The process of claim 19, wherein the process further comprises generating diagrams for the one or more circuited electrical components, their interconnection specifications, the home run specifications, and other branch circuit wiring data.

* * * * *